US011768362B2

(12) United States Patent
Suzuki et al.

(10) Patent No.: US 11,768,362 B2
(45) Date of Patent: Sep. 26, 2023

(54) LASER RADIATION SYSTEM AND METHOD FOR MANUFACTURING ELECTRONIC DEVICE

(71) Applicant: Gigaphoton Inc., Tochigi (JP)

(72) Inventors: Akiyoshi Suzuki, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 588 days.

(21) Appl. No.: 16/853,611

(22) Filed: Apr. 20, 2020

(65) Prior Publication Data

US 2020/0249452 A1 Aug. 6, 2020

Related U.S. Application Data

(63) Continuation of application No. PCT/JP2017/044040, filed on Dec. 7, 2017.

(51) Int. Cl.
*G02B 19/00* (2006.01)
*G01J 1/42* (2006.01)
(Continued)

(52) U.S. Cl.
CPC ........ *G02B 19/0019* (2013.01); *G01J 1/4257* (2013.01); *G02B 5/001* (2013.01);
(Continued)

(58) Field of Classification Search
CPC ............ G01J 1/4257; G01J 2001/4261; G02B 19/0019; G02B 19/0047; G02B 26/0816;
(Continued)

(56) References Cited

U.S. PATENT DOCUMENTS 5,246,868 A * 9/1993 Busch ................. G01N 21/72
436/171
5,506,676 A * 4/1996 Hendler ............... G01R 31/308
250/559.46
(Continued)

FOREIGN PATENT DOCUMENTS

CN 102892547 A 1/2013
CN 106624354 A 5/2017
(Continued)

OTHER PUBLICATIONS

An Office Action mailed by China National Intellectual Property Administration dated Dec. 16, 2021, which corresponds to Chinese Patent Application No. 201780096036.6 and is related to U.S. Appl. No. 16/853,611; with English language translation.
(Continued)

*Primary Examiner* — Joseph P Martinez
*Assistant Examiner* — Vipin Patel
(74) *Attorney, Agent, or Firm* — Studebaker & Brackett PC

(57) ABSTRACT

A laser radiation system according to a viewpoint of the present disclosure includes a first optical system configured to convert a first laser flux into a second laser flux, a multimirror device including mirrors, configured to be capable of controlling the angle of the attitude of each of the mirrors, and configured to divide the second laser flux into laser fluxes and reflect the laser fluxes in directions to produce the divided laser fluxes, a Fourier transform optical system configured to focus the divided laser fluxes, and a control section configured to control the angle of the attitude of each of the mirrors in such a way that the Fourier transform optical system superimposes the laser fluxes, which are divided by the mirrors separate from each other by
(Continued)

at least a spatial coherence length of the second laser flux, on one another.

17 Claims, 34 Drawing Sheets

(51) Int. Cl.
G02B 5/00 (2006.01)
G02B 26/08 (2006.01)
G02B 27/09 (2006.01)
G02B 27/30 (2006.01)
G03F 7/20 (2006.01)
H01L 21/027 (2006.01)
H01S 3/097 (2006.01)

(52) U.S. Cl.
CPC ..... *G02B 19/0047* (2013.01); *G02B 26/0816* (2013.01); *G02B 27/0927* (2013.01); *G02B 27/0955* (2013.01); *G02B 27/30* (2013.01); *G03F 7/2006* (2013.01); *G03F 7/2008* (2013.01); *H01L 21/0275* (2013.01); *G01J 2001/4261* (2013.01); *H01S 3/097* (2013.01)

(58) Field of Classification Search
CPC ............ G02B 27/0927; G02B 27/0933; G02B 27/0955; G02B 27/30; G02B 27/646; G02B 5/001; G03F 7/2006; G03F 7/2008; G03F 7/70041; G03F 7/70091; G03F 7/70291; G03F 7/70508; H01L 21/0275; H01S 3/005; H01S 3/0071; H01S 3/097; H01S 3/225
See application file for complete search history.

(56) References Cited

U.S. PATENT DOCUMENTS

| 2001/0045419 | A1 | 11/2001 | Dunsky et al. |
| 2002/0008091 | A1 | 1/2002 | Brandinger et al. |
| 2004/0114152 | A1* | 6/2004 | Hill ................. G03F 7/70775 356/498 |
| 2007/0070302 | A1* | 3/2007 | Govorkov .......... G02B 26/0808 348/E9.026 |
| 2010/0078580 | A1* | 4/2010 | Endo .................... H05G 2/008 359/228 |
| 2013/0120740 | A1 | 5/2013 | Schonleber |
| 2016/0076944 | A1 | 3/2016 | Moriya et al. |
| 2017/0149198 | A1 | 5/2017 | Wakabayashi et al. |
| 2018/0019141 | A1 | 1/2018 | Ohkubo et al. |

FOREIGN PATENT DOCUMENTS

| JP | S63-084788 A | 4/1988 |
| JP | S63-101815 A | 5/1988 |
| JP | 2005-205464 A | 8/2005 |
| JP | 2006-231366 A | 9/2006 |
| JP | 2009-018335 A | 1/2009 |
| JP | 2011-222841 A | 11/2011 |
| WO | 2014/208754 A1 | 12/2014 |
| WO | 2016/051518 A1 | 4/2016 |
| WO | 2016/147308 A1 | 9/2016 |

OTHER PUBLICATIONS

International Search Report issued in PCT/JP2017/044040, dated Feb. 6, 2018.
International Preliminary Report on Patentability and Written Opinion issued in PCT/JP2017/044040, dated Jun. 9, 2020.

* cited by examiner

| C(1,1) | C(1,2) | C(1,3) | C(1,4) |
|---|---|---|---|
| C(2,1) | C(2,2) | C(2,3) | C(2,4) |
| C(3,1) | C(3,2) | C(3,3) | C(3,4) |
| C(4,1) | C(4,2) | C(4,3) | C(4,4) |
| C(5,1) | C(5,2) | C(5,3) | C(5,4) |
| C(6,1) | C(6,2) | C(6,3) | C(6,4) |
| C(7,1) | C(7,2) | C(7,3) | C(7,4) |
| C(8,1) | C(8,2) | C(8,3) | C(8,4) |
| C(9,1) | C(9,2) | C(9,3) | C(9,4) |
| C(10,1) | C(10,2) | C(10,3) | C(10,4) |
| C(11,1) | C(11,2) | C(11,3) | C(11,4) |
| C(12,1) | C(12,2) | C(12,3) | C(12,4) |
| C(13,1) | C(13,2) | C(13,3) | C(13,4) |
| C(14,1) | C(14,2) | C(14,3) | C(14,4) |
| C(15,1) | C(15,2) | C(15,3) | C(15,4) |
| C(16,1) | C(16,2) | C(16,3) | C(16,4) |

FIG. 12

LASER RADIATION SYSTEM AND METHOD FOR MANUFACTURING ELECTRONIC DEVICE

CROSS-REFERENCE TO RELATED APPLICATIONS

The present application is a continuation application of International Application No. PCT/JP2017/044040, filed on Dec. 7, 2017, the entire contents of which are hereby incorporated by reference.

BACKGROUND

1. Technical Field

The present disclosure relates to a laser radiation system and a method for manufacturing an electronic device.

2. Related Art

A semiconductor exposure apparatus is required to improve the resolution thereof as a semiconductor integrated circuit is increasingly miniaturized and highly integrated. The semiconductor exposure apparatus is hereinafter referred simply to as an "exposure apparatus." To this end, reduction in the wavelength of the light outputted from a light source for exposure is underway. A gas laser apparatus is used as the light source for exposure in place of a mercury lamp in related art. At present, a KrF excimer laser apparatus, which outputs ultraviolet light having a wavelength of 248 nm, and an ArF excimer laser apparatus, which outputs ultraviolet light having a wavelength of 193 nm, are used as the gas laser apparatus for exposure.

As a current exposure technology, liquid-immersion exposure, in which the gap between the projection lens of the exposure apparatus and a wafer is filled with a liquid, has been put into use. In the liquid-immersion exposure, since the refractive index of the gap between the projection lens and the wafer changes, the apparent wavelength of the light from the light source for exposure is shortened. In the liquid-immersion exposure with an ArF excimer laser apparatus as the light source for exposure, the wafer is irradiated with ultraviolet light having an equivalent wavelength of 134 nm. The technology described above is called ArF liquid-immersion exposure. The ArF liquid-immersion exposure is also called ArF liquid-immersion lithography.

Since KrF and ArF excimer laser apparatuses each have a wide spectral linewidth ranging from about 350 to 400 pm in spontaneous oscillation, the chromatic aberrations occur in association with the laser flux (ultraviolet light) projected with the size thereof reduced onto the wafer via the projection lens of the exposure apparatus, resulting in a decrease in the resolution. To avoid the decrease in the resolution, the spectral linewidth of the laser flux outputted from the gas laser apparatus needs to be narrow enough to make the chromatic aberrations negligible. The spectral linewidth is also called spectral width. A line narrowing module including a line narrowing element is therefore provided in the laser resonator of the gas laser apparatus, and the line narrowing module narrows the spectral width. The line narrowing element may, for example, be an etalon or a grating. A laser apparatus having a narrowed spectral width described above is called a narrowed-width laser apparatus.

Further, the excimer laser flux, which has a pulse width of about several tens of nanoseconds and has a short wavelength of 248.4 nm or 193.4 nm, is used in some cases to directly process a polymer material, a glass material, and other materials. The excimer laser flux having photon energy higher than the binding energy of a polymer material can unbind the molecules that form the polymer material. Unheated processing can therefore be performed, and it is known that an excellent processed shape is achieved by the unheated processing.

Further, it is difficult to process a glass material, a ceramic material, or any other similar material with a visible or infrared laser flux, but an excimer laser flux can process such a material because the material absorbs the excimer laser flux by a large amount.

CITATION LIST

Patent Literature

[PTL 1] JP-A-2011-222841
[PTL 2] JP-A-63-101815
[PTL 3] JP-A-2005-205464

SUMMARY

A laser radiation system according to a viewpoint of the present disclosure includes a first optical system configured to convert a first laser flux into a second laser flux, a multimirror device including a plurality of mirrors, configured to be capable of controlling an angle of an attitude of each of the plurality of mirrors, and configured to divide the second laser flux into a plurality of laser fluxes and reflect the plurality of laser fluxes in a plurality of directions to produce the plurality of divided laser fluxes, a Fourier transform optical system configured to focus the plurality of divided laser fluxes, and a control section configured to control the angle of the attitude of each of the plurality of mirrors in such a way that the Fourier transform optical system superimposes the plurality of laser fluxes, which are divided by the mirrors separate from each other by at least a spatial coherence length of the second laser flux, on one another.

A method for manufacturing an electronic device according to another viewpoint of the present disclosure includes producing a laser flux by using a laser radiation system and processing a processing receiving material by irradiating the processing receiving material with the laser flux produced by the laser radiation system, the laser radiation system including a laser apparatus configured to output a first laser flux, a first optical system configured to convert the first laser flux into a second laser flux, a multimirror device including a plurality of mirrors, configured to be capable of controlling an angle of an attitude of each of the plurality of mirrors, and configured to divide the second laser flux into a plurality of laser fluxes and reflect the plurality of laser fluxes in a plurality of directions to produce the plurality of divided laser fluxes, a Fourier transform optical system configured to focus the plurality of divided laser fluxes, and a control section configured to control the angle of the attitude of each of the plurality of mirrors in such a way that the Fourier transform optical system superimposes the plurality of laser fluxes, which are divided by the mirrors separate from each other by at least a spatial coherence length of the second laser flux, on one another.

A laser radiation system according to another viewpoint of the present disclosure includes a first optical system configured to convert a first laser flux into a second laser flux, a multimirror device including a plurality of mirrors, configured to be capable of controlling an angle of an attitude of each of the plurality of mirrors, and configured to divide the second laser flux into a plurality of laser fluxes and reflect the plurality of laser fluxes in a plurality of directions to produce the plurality of divided laser fluxes, a Fourier transform optical system configured to focus the plurality of divided laser fluxes, a wavefront sensor configured to measure a traveling direction and an optical intensity of a laser flux in each position in a beam cross section of the second laser flux, and a control section is configured to control the angle of the attitude of each of the plurality of mirrors based on the traveling direction and the optical intensity of the laser flux in each position in the beam cross section measured by the wavefront sensor.

BRIEF DESCRIPTION OF THE DRAWINGS

Embodiments of the present disclosure will be described below only by way of example with reference to the accompanying drawings.

FIG. 12 shows an example of the coherence cells at the MMD and the arrangement of the mirrors disposed therein.

DETAILED DESCRIPTION

Figure 1:
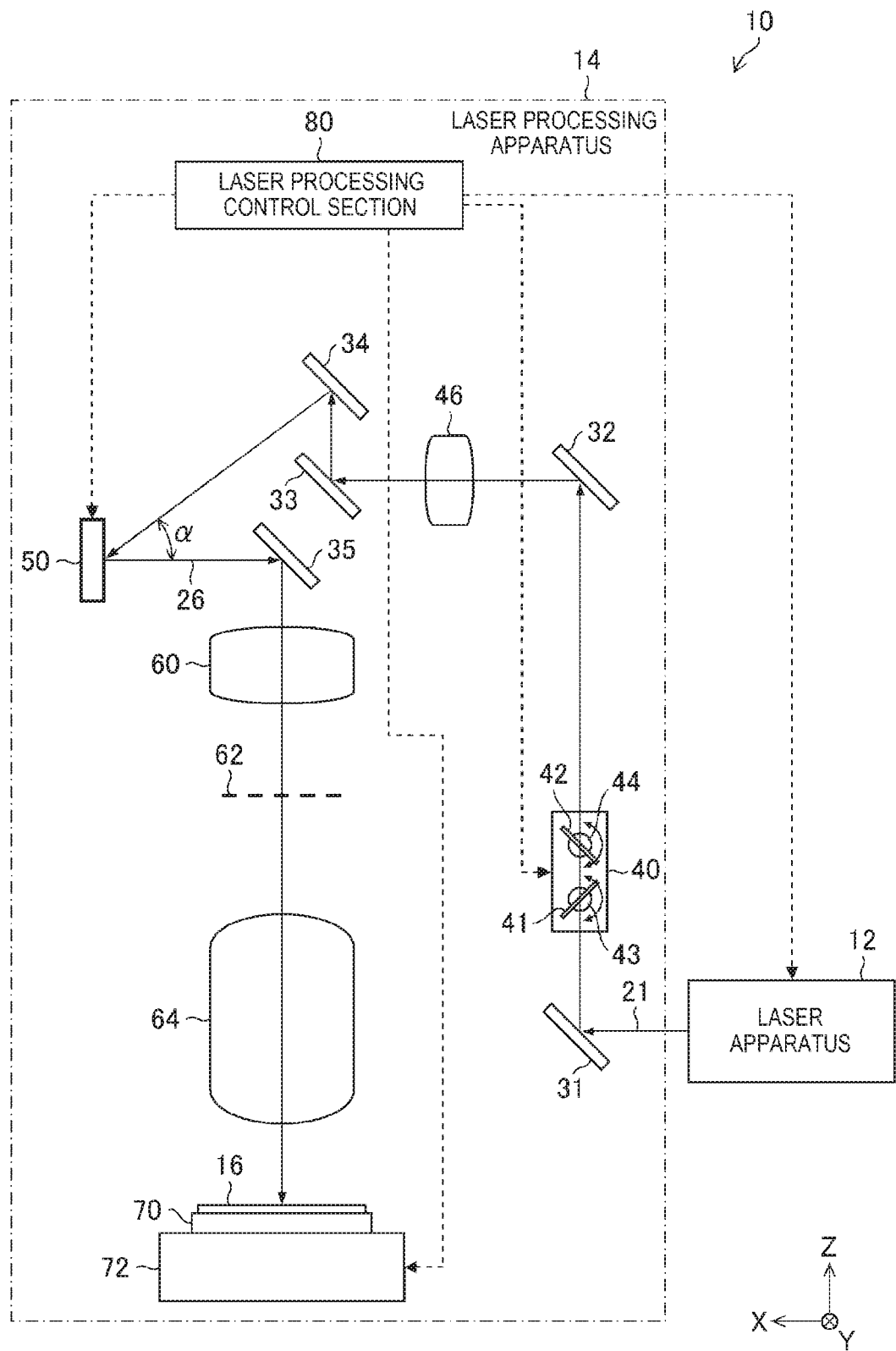
FIG. 1 schematically shows the configuration of an exemplary laser processing system.

<Contents>
1. Overall description of laser processing system
1.1 Configuration
1.2 Operation
2. Problems
3. First Embodiment
3.1 Configuration
3.2 Operation
3.3 Pattern formation using MMD and Fourier transform optical system
3.4 Interference of light reflected off MMD
3.5 Description of spatial coherence length of laser beam and coherence cells
3.6 Relationship between coherence cells and plurality of mirrors of MMD
3.7 Reflection of laser fluxes off mirrors of MMD
3.8 Example of procedure of control of laser processing system according to first embodiment
3.8.1. Main routine
3.8.2 Subroutine in step S13
3.8.3 Subroutine in step S14
3.8.4 Subroutine in step S15
3.8.5 Variation 1
3.8.6 Variation 2
3.8.7 Variation 3
3.8.8 Variation 4
3.9 Effects and advantages
3.10 Example 1 of other forms
3.11 Example 2 of other forms
3.12 Others
4. Second Embodiment
4.1 Configuration
4.2 Case where beam characteristic measurer is beam profiler
4.3 Operation
4.3.1 Main routine
4.3.2 Subroutine in step S14A
4.3.3 Subroutine in step S14B
4.3.4 Subroutine in step S15A
4.4 Effects and advantages
4.5 Case where beam characteristic measurer is wavefront sensor
4.5.1 Configuration
4.5.2 Operation
4.5.3 Main routine
4.5.4 Subroutine in step S14C
4.5.5 Subroutine in step S14D
4.5.6 Effects and advantages
5. Third Embodiment
5.1 Configuration
5.2 Operation
5.3 Effects and advantages
5.4 Example 3 of other forms
5.5 Example 4 of other forms
5.6 Example 5 of other forms
6. Description of how to achieve low coherency by adjustment of angle of incidence of laser beam incident on MMD
7. Fourth Embodiment
7.1 Configuration
7.2 Operation
7.3 Effects and advantages
7.4 Timing at which beam characteristics are measured
8. Variations of beam shaping optical system
8.1 Configuration Example 1 of beam shaping optical system
8.2 Configuration Example 2 of beam shaping optical system
9. Example of beam collimator optical system
9.1 Configuration
9.2 Operation
9.3 Examples of other configurations
10. Variation of projection optical system
10.1 Configuration
10.2 Operation
10.3 Relationship between shape of openings of mask and beam diameter at focused spots formed by Fourier transform optical system
10.3.1 Case where openings of mask have circular shape
10.3.2 Case where openings of mask have quadrangular shape
10.3.3 Advantages provided by disposing mask in focal plane of Fourier transform optical system
10.3.4 Other forms
10.4 Effects and advantages
10.5 Example 6 of other forms
11. Case where portions of laser beam are superimposed on each other in focal plane of Fourier transform optical system
12. Example of preferable range number of processing points in multi-point processing
13. Examples of processing using laser processing system Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Overall Description of Laser Processing System 1.1 Configuration

FIG. 1 schematically shows the configuration of an exemplary laser processing system. A laser processing system 10 includes a laser apparatus 12 and a laser processing apparatus 14. The laser apparatus 12 is a laser apparatus configured to output a laser flux used to process a processing receiving material 16. For example, the laser apparatus 12 can be an ultraviolet laser apparatus configured to output a pulsed laser flux that is third harmonic light (355 nm) or fourth harmonic light (266 nm) from a YAG laser, which outputs a high-spatial-coherency laser flux.

The laser processing apparatus 14 includes high-reflectance mirrors 31 to 35, an attenuator 40, a uniform illumination optical system 46, a multimirror device (MMD) 50, a transfer optical system 60, a projection optical system 64, a table 70, on which the processing receiving material 16 is placed, and an XYZ stage 72.

The high-reflectance mirror 31 is so disposed as to cause a pulsed laser flux 21 outputted from the laser apparatus 12 to be incident on the high-reflectance mirror 32. The high-reflectance mirror 32 is so disposed as to cause the pulsed laser flux 21 to be incident on the high-reflectance mirror 33.

The attenuator 40 is disposed in the optical path between the high-reflectance mirror 31 and the high-reflectance mirror 32. The attenuator 40 includes two partially reflective mirrors 41 and 42 and rotary stages 43 and 44, which change the angles of incidence of the pulsed laser flux 21 incident on the partially reflective mirrors 41 and 42.

The high-reflectance mirror 33 is so disposed as to cause the angle of incidence of the pulsed laser flux 21 incident on the MMD 50 via the high-reflectance mirror 34 to be equal to an angle $\alpha$.

The uniform illumination optical system 46 is disposed in the optical path between the high-reflectance mirror 32 and the high-reflectance mirror 33. The uniform illumination optical system 46 is, for example, an optical system configured to convert a beam having a Gaussian optical intensity distribution into a beam having a top-hat-shaped optical intensity distribution. The uniform illumination optical system 46 may, for example, be the combination of two axicon lenses.

The high-reflectance mirror 35 is so disposed as to cause a pulsed laser flux 26 reflected off the MMD 50 at an angle of reflection of zero to pass along the center axis of the transfer optical system 60.

Although no detailed structure of the MMD 50 is shown, the MMD 50 may be a micromirror device having a structure in which a large number of mirrors are arranged in a matrix. The angle of the attitude of each of the mirrors of the MMD 50 can be individually controlled.

The projection optical system 64 is so disposed that a first transferred image plane 62 where an image of the MMD 50 is formed by the transfer optical system 60 coincides with the object plane of the projection optical system 64.

The projection optical system 64 is so disposed as to form an image of the first transferred image plane 62 on the surface of the processing receiving material 16.

The processing receiving material 16 is fixed onto the table 70 on the XYZ stage 72.

The laser processing apparatus 14 further includes a laser processing control section 80. The laser processing control section 80 controls the operation of the laser apparatus 12, the attenuator 40, the MMD 50, and the XYZ stage 72.

1.2 Operation

The operation of the exemplary laser processing system 10 will be described with reference to FIG. 1. The laser processing control section 80 is configured to read, from an external apparatus, data on a processing pattern in accordance with which the processing receiving material 16 is processed.

Figure 2:
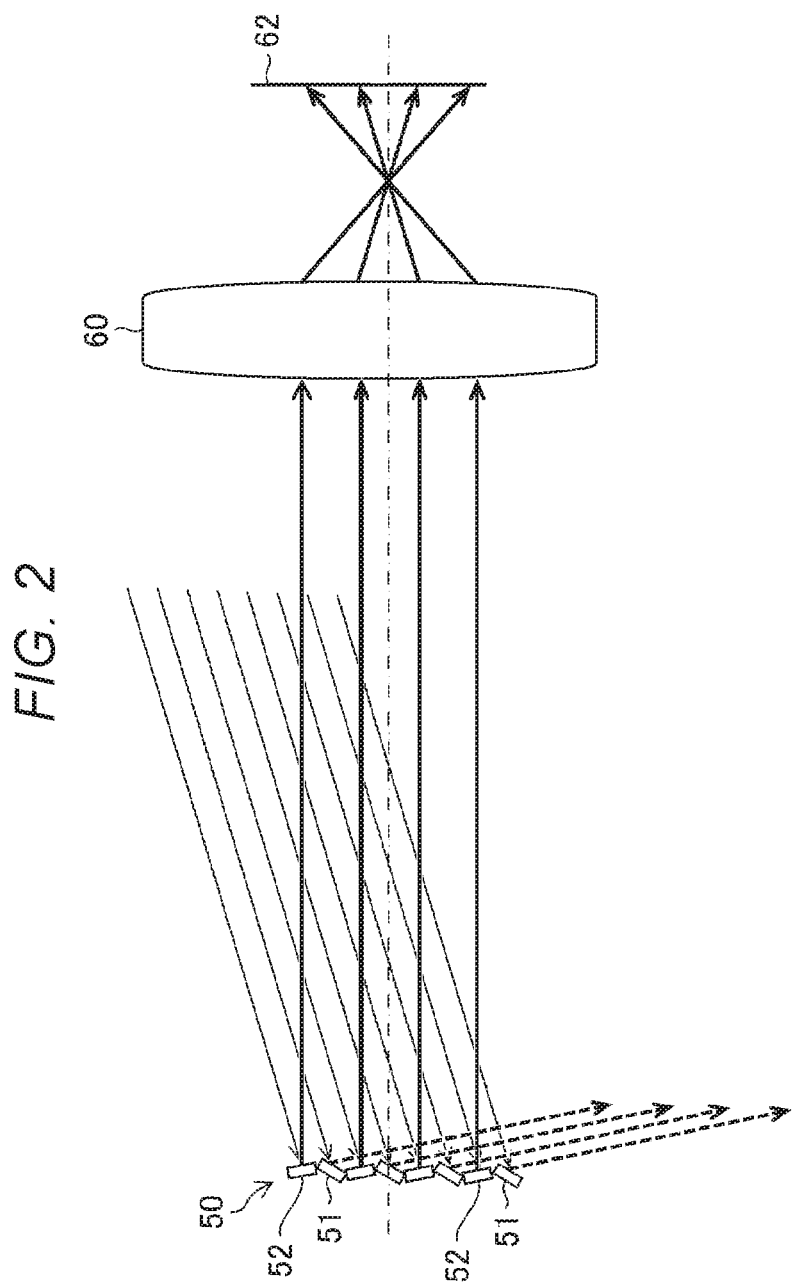
FIG. 2 is a descriptive diagram diagrammatically showing the operation of mirrors of a multimirror device (MMD).

The laser processing control section 80 controls each of the mirrors of the MMD 50 to operate in an ON or OFF state based on the data on the processing pattern. FIG. 2 is a descriptive diagram diagrammatically showing the operation of the mirrors of the MMD 50. Controlling a mirror of the MMD 50 to operate in the "ON" state will be described below. That is, the control operation means that controlling the angle of the attitude of each "ON" mirror 51 in such a way that light reflected off the mirrors 51 enters the transfer optical system 60. Controlling a mirror of the MMD 50 to operate in the "OFF" state will also be described below. That is, the control operation means that controlling the angle of the attitude of each "OFF" mirror 52 in such a way that light reflected off the mirrors 52 does not enter the transfer optical system 60. The mirrors 51 controlled to operate in the ON state are each called an ON mirror, and the mirrors 52 controlled to operate in the OFF state are each called an OFF mirror in some cases.

The laser processing control section 80 is configured to control the transmittance of light passing through the attenuator 40 in such a way that the fluence at the processing receiving material 16 falls within a predetermined range.

The laser processing control section 80 is configured to control the XYZ stage 72 in such a way that the surface of the processing receiving material 16 coincides with the image formation plane of the projection optical system 64.

The laser processing control section 80 is configured to transmit a light emission trigger to the laser apparatus 12 to cause the laser apparatus 12 to output the pulsed laser flux 21.

The pulsed laser flux 21 is reflected off the high-reflectance mirror 31 at high reflectance and attenuated when passing through the attenuator 40. The pulsed laser flux 21 attenuated by the attenuator 40 is reflected off the high-reflectance mirror 32 at high reflectance and converted into a laser beam having a top-hat-shaped optical intensity distribution when passing through the uniform illumination optical system 46.

The laser beam having the top-hat-shaped optical intensity distribution is incident on the MMD 50 via the high-reflectance mirrors 33 and 34.

The transfer optical system 60 is configured to cause the pulsed laser flux 26 reflected off the ON-state mirrors of the MMD 50 to form images of the ON-state mirrors of MMD 50 in the first transferred image plane 62.

The projection optical system 64 is configured to cause the images of the ON-state mirrors of the MMD 50 formed in the first transferred image plane 62 to form the images again on the surface of the processing receiving material 16.

The processing receiving material 16 is thus processed in the pattern formed by the "ON" mirrors of the MMD 50.

2. Problems

In the configuration shown in FIG. 2, the transfer optical system 60 is configured to form images of the surfaces of elements of the MMD 50 in the object plane of the projection optical system 64 to form an image of the processing pattern formed of the ON-mirrors and the OFF-mirrors of the MMD 50.

Since the ON/OFF image is formed on the surface of the processing receiving material 16, the portion corresponding to the ON-portions of the MMD 50 is processed, whereas the portion corresponding to the OFF-portions of the MMD 50 is not processed. As described above, in the image-formation-type configuration in which images of the surfaces of elements of the MMD 50 are formed, an image of the processing pattern is formed in an ON/OFF binary manner, and the light from the OFF-mirrors is not used in the processing, resulting in poor light use efficiency.

3. First Embodiment 3.1 Configuration

Figure 3:
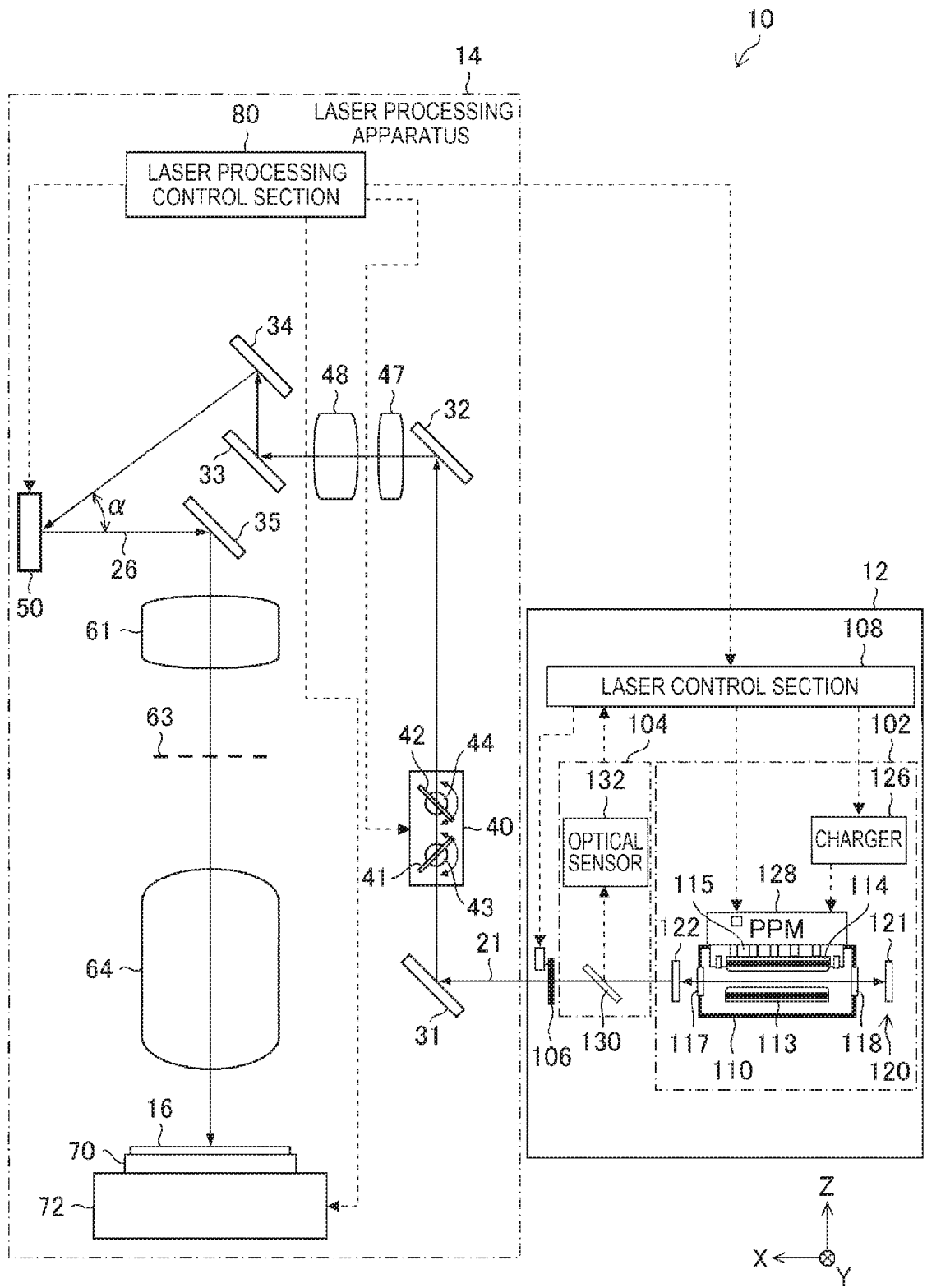
FIG. 3 schematically shows the configuration of a laser processing system according to a first embodiment.

FIG. 3 schematically shows the configuration of a laser processing system according to a first embodiment. Differences from the configuration shown in FIG. 1 will be described below. The laser apparatus 12 used in the laser processing system 10 according to the first embodiment is a laser apparatus configured to output an ultraviolet pulsed laser flux 21, and the laser apparatus 12 is, for example, a discharge-excitation-type laser apparatus including a laser medium of $F_2$, ArF, KrF, XeCl, or XeF.

The laser apparatus 12 includes a master oscillator 102, a monitor module 104, a shutter 106, and a laser control section 108. The master oscillator 102 includes a laser chamber 110, an optical resonator 120, a charger 126, and a pulse power module (PPM) 128.

The laser chamber 110 is configured to encapsulate an excimer laser gas. The laser chamber 110 includes a pair of electrodes 113 and 114, an insulating member 115, and windows 117 and 118.

The optical resonator 120 includes a rear mirror 121 and an output coupler (OC) 122. The rear mirror 121 and the output coupler 122 is each formed of a planar substrate coated with a high-reflectance film and a partial reflective film.

The laser chamber 110 is disposed in the optical path of the optical resonator 120.

The monitor module 104 includes a beam splitter 130 and an optical sensor 132.

The shutter 106 is disposed in the optical path of the pulsed laser flux 21 outputted from the monitor module 104.

In the laser processing apparatus 14 shown in FIG. 3, a beam shaping optical system 47 and a beam collimator optical system 48 are disposed in the optical path between the high-reflectance mirror 32 and the high-reflectance mirror 33. That is, the laser processing apparatus 14 includes the beam shaping optical system 47 and the beam collimator optical system 48 in place of the uniform illumination optical system 46 described with reference to FIG. 1.

The beam shaping optical system 47 is a beam expander configured to convert the beam cross-sectional shape of the beam of the pulsed laser flux 21 outputted from the laser apparatus 12, which is an oblong beam cross-sectional shape, into a square beam cross-sectional shape.

The beam collimator optical system 48 is a conjugate optical system and is configured to transfer and focus the laser beam shaped by the beam shaping optical system 47 onto the MMD 50.

The MMD 50 includes a plurality of mirrors, and the angle of the attitude of each of the mirrors can be controlled in multiple steps or changed to an arbitrary angle.

In the laser processing apparatus 14 shown in FIG. 3, a Fourier transform optical system 61 is disposed in place of the transfer optical system 60 described with reference to FIG. 1. The Fourier transform optical system 61 is an optical system configured to focus a laser beam and may be formed of a single lens or a plurality of lenses.

The Fourier transform optical system 61 is so disposed that the focal plane thereof coincides with the object plane of the projection optical system 64. The projection optical system 64 may preferably be a bi-telecentric optical system configured to perform reduction projection at a magnification of 1 or lower.

3.2 Operation

The laser processing control section 80 is configured to control the XYZ stage 72 in such a way that a first radiation region coincides with the image formation plane of the projection optical system 64 when the processing receiving material 16 is placed on the table 70.

The laser processing control section 80 is configured to calculate the angle of the attitude of each of the mirrors of the MMD 50 based on data on a plurality of processing points and control the angle of the attitude of each of the mirrors of the MMD 50 based on the result of the calculation.

The laser processing control section 80 is configured to receive the data on the plurality of positions where the processing receiving material 16 is processed and calculate the traveling directions of the plurality of divided laser fluxes reflected off the mirrors of the MMD 50. The "data on the plurality of positions where the processing receiving material 16 is processed" is data representing the positions of the plurality of processing points. The data on the plurality of processing points in the present embodiment is assumed to be data on processing points of different positions where laser beams incident on the processing points do not overlap with each other. When the laser beams incident on the processing points overlap with each other, the laser beams interfere with each other, resulting in deterioration of the optical intensity distributions of the laser beams in some cases.

The laser processing control section 80 is configured to set a plurality of coherence cells having a size corresponding to a spatial coherence length and control the angle of the attitude of each of the mirrors in such a way that the laser fluxes reflected off the coherence cells are superimposed on one another in the focal plane of the Fourier transform optical system 61 into a focused spot.

The laser processing control section 80 is configured to thereafter set radiation conditions. The laser processing control section 80 carries out the following processes a to c.

(Process a) The laser processing control section 80 is configured to read data on a target fluence Ft on the processed surface, a repetitive frequency f, and the number S of radiated pulses.

(Process b) The laser processing control section 80 is configured to calculate the transmittance T of light passing through the attenuator 40 based on target pulse energy Et of the pulsed laser flux 21, the number Np of focused spots, and the area Sp of each of the focused spots on the surface of the processing receiving material 16 in such a way that the target fluence Ft is achieved on the processed surface. The laser processing control section 80 controls the attenuator 40 in such a way that the transmittance of light passing through the attenuator 40 is the transmittance T.

The target pulse energy Et is rated pulse energy of the pulse laser flux outputted from the laser apparatus 12. The "rated pulse energy" is rated pulse energy of the pulse laser flux stably outputted from the laser apparatus 12. The laser processing control section 80 is configured to store the rated pulse energy of the pulse laser flux outputted from the laser apparatus 12 in advance as the target pulse energy Et.

(Process c) The laser processing control section 80 is configured to transmit the data on the target pulse energy Et, the repetitive frequency f, and the number S of radiated pulses to the laser control section 108.

The laser processing control section 80 is configured to thereafter transmit a laser oscillation instruction signal to the laser control section 108.

The pulsed laser flux 21 outputted from the laser apparatus 12 is reflected off the high-reflectance mirror 31 at high reflectance and attenuated when passing through the attenuator 40. The pulsed laser flux 21 attenuated by the attenuator 40 is reflected off the high-reflectance mirror 32 at high reflectance, and the resultant beam having the oblong shape is converted by the beam shaping optical system 47 into a substantially square beam. The term "substantially square" means that the beam has substantially the same shape as that of an effective region of the MMD 50. The effective region of the MMD 50 refers to the region where the large number of mirrors are arranged in a matrix and which effectively functions as a reflection surface. The effective region is expressed as an "entire mirror" or "entire MMD elements" in some cases.

The laser beam so shaped by the beam shaping optical system 47 into a substantially square shape is transferred and focused by the beam collimator optical system 48 onto the entirety of the plurality of mirrors arranged in the MMD 50 via the high-reflectance mirrors 33 and 34.

The laser beams reflected off the mirrors of the MMD 50 and so divided as to travel in angularly different paths (plurality of different traveling directions) pass through the Fourier transform optical system 61 via the high-reflectance mirror 35. A plurality of focused spots are thus formed in a focal plane 63 of the Fourier transform optical system 61. At the focused spots, into which the divided laser beams, which each have low coherency, are superimposed on one another, generation of interference fringes is suppressed. The focal plane 63 of the Fourier transform optical system 61 can be a pattern plane containing the pattern formed by the MMD 50.

A first image formed in the focal plane 63 of the Fourier transform optical system 61 is formed again as a second image by the projection optical system 64 on the surface of the processing receiving material 16. As a result, the processing points read in advance as the data on the positions where the processing receiving material 16 is processed are irradiated with the laser beams under the predetermined radiation conditions.

The laser processing system 10 and the laser processing apparatus 14 shown in FIG. 3 are each an example of a "laser radiation system." Since a processing receiving material is processed when irradiated with a laser flux, it may be so understood that the term "processing" can be replaced with the term "irradiation." The pulsed laser flux 21 outputted by the laser apparatus 12 is an example of a "first laser flux." The beam shaping optical system 47 and the beam collimator optical system 48 are an example of a "first optical system." The laser processing control section 80 is an example of a "control section." The laser flux having exited out of the beam collimator optical system 48 is an example of a "second laser flux."

In the present disclosure, the laser processing control section 80, the laser control section 108, and other control sections can be achieved by the combination of hardware and software of one or more computers. The software is a synonym of a program. A programmable controller falls within the concept of a computer. Part or entirety of processing functions necessary for the control performed by the laser processing control section 80, the laser control section 108, and other control sections may be achieved by using an integrated circuit represented by a field programmable gate array (FPGA) and an application specific integrated circuit (ASIC).

The functions of the plurality of control sections can be achieved by a single control section. Further, in the present disclosure, the laser processing control section 80, the laser control section 108, and other control sections may be connected to each other via a communication network, such as a local area network and the Internet. In a distributed computing environment, a program unit may be saved in both local and remote memory storage devices.

3.3 Pattern Formation Using MMD and Fourier Transform Optical System

Figure 4:
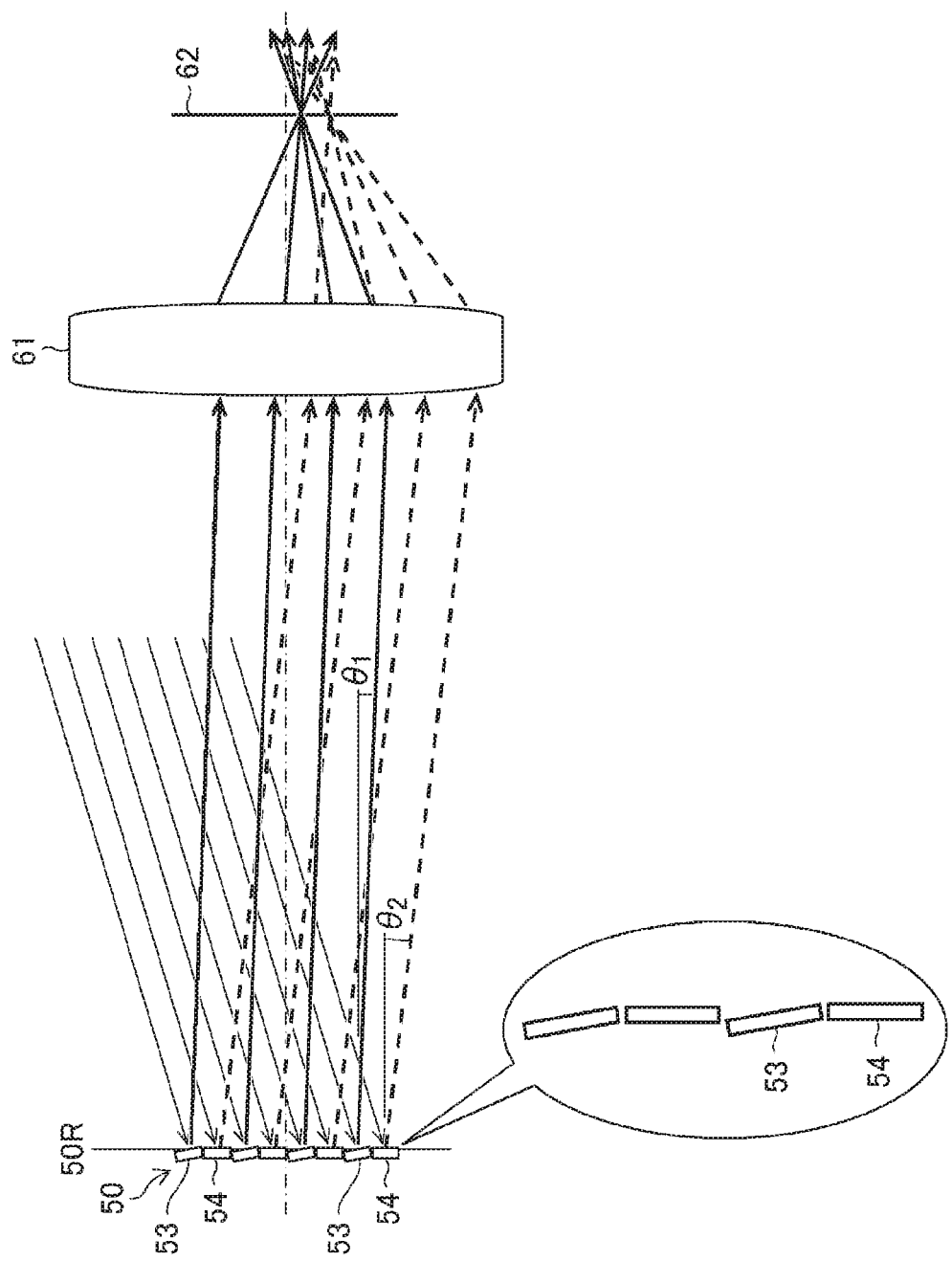
FIG. 4 is a descriptive diagram showing the principle in accordance with which a pattern is formed by using an MMD and a Fourier transform optical system.

FIG. 4 is a descriptive diagram showing the principle in accordance with which the pattern is formed by using the MMD and the Fourier transform optical system. Paralleled light incident on the MMD 50 is divided into a plurality of paralleled reflected light groups that travel in different directions in accordance with the angles of the attitude of the mirrors, as shown in FIG. 4. To simplify the description, FIG. 4 shows a case where the angle of the attitude of each of the mirrors is so controlled to be one of two angles that light reflected off the MMD 50 is divided into two different parallelized light groups that travel in different directions (at different angles). That is, parallelized light incident on the MMD 50 is divided into a first parallelized light group having an angle $\theta_1$ with respect to a reference direction and a second parallelized light group having an angle $\theta_2$ with respect to the reference direction. The reference direction is the direction in which the laser flux is incident on a reflection surface 50R, which serves as a macro-surface, in the MMD 50 at an angle of incidence of 0° and specularly reflected off the reflection surface 50R. The specular reflection direction in this case is a synonym of the direction of a normal to the reflection surface.

The "reflection surface that serves as a macro-surface" is a reference reflection surface on the assumption that the effective region of the MMD 50 is taken as a single flat reflection surface, and the direction of the plan view of the effective region is the direction of a normal to the effective region. The "reflection surface that serves as a macro-surface" is called a "reference reflection surface."

In FIG. 4, thick solid-line arrows each represent a group of parallelized laser fluxes reflected in a first direction having the angle of $\theta_1$, and broken-line arrows each represent a group of parallelized laser fluxes reflected in a second direction having the angle of $\theta_2$. The first direction is shown as the specular reflection direction with respect to the reference reflection surface. In FIG. 4, the angle of the attitude of each mirror 53 is so controlled that the laser flux is reflected in the first direction. In FIG. 4, the angle of the attitude of each mirror 54 is so controlled that the laser flux is reflected in the second direction.

The two groups of parallelized light reflected off the MMD 50 gather and form images in two positions, $F\theta_1$ and $F\theta_2$, in the focal plane of the Fourier transform optical system 61 having a focal length F.

The MMD 50 is formed of a large number of mirrors, for example, at least 10,000 mirrors. Therefore, when parallelized light is reflected off the MMD 50 and divided into n parallelized light groups traveling in a plurality of directions, n focused spots are formed by the Fourier transform optical system 61 in the focal plane thereof.

The system according to the present example provides the following benefits.

(a) Selecting the number of angles θ allows formation of an arbitrary large number of spots.

(b) The plurality of mirrors that form the MMD 50 may each correspond to a focused spot, whereby the light use efficiency is improved.

(c) Appropriate selection of mirrors allows the optical intensities of a plurality of spots to be equal to one another.

3.4 Interference of Light Reflected Off MMD

Figure 5:
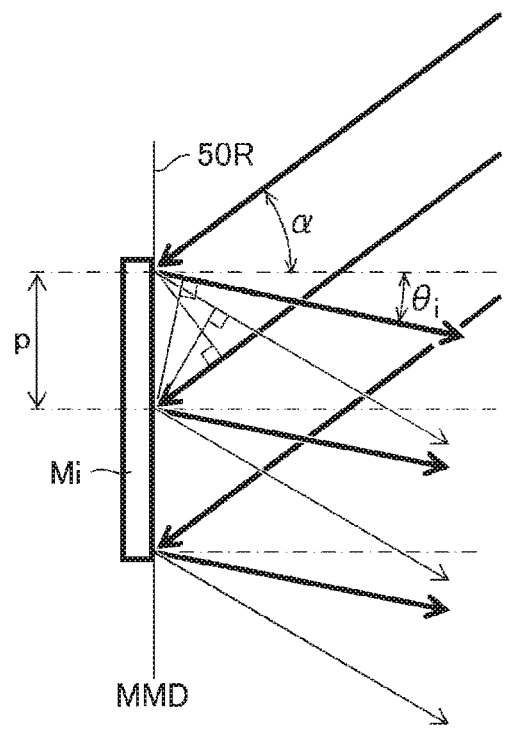
FIG. 5 shows light incident on a mirror of the MMD and the light reflected off the mirror.

FIG. 5 shows light incident on a mirror of the MMD and the light reflected off the mirror. When coherent parallelized light is incident on MMD 50, the wavefronts of light rays specularly reflected off the reflection surface that serves as a macro-surface (reference reflection surface 50R) in the MMD 50 are preserved.

On the other hand, when coherent parallelized light is incident at the angle of incidence α, and the angle of the attitude of a mirror $M_i$ is so controlled that the light is reflected off at an angle of reflection $\theta_i$, light rays that do not travel in the specular reflection direction with respect to the reference reflection surface 50R of the MMD 50 have an optical path difference.

$$\text{Optical path difference} = \Delta L = m\lambda = p(\sin \alpha - \sin \theta_i) \quad (1)$$

where m represents the degree, λ represents the wavelength, p represents the interval between the mirrors of the MMD 50, α represents the angle of incidence, and $\theta_i$ represents the angle at which the light is reflected off the mirror $M_i$ of the MMD 50. The angle $\theta_i$ is an angle with respect to a normal to the reference reflection surface 50R of the MMD 50.

When the optical path difference ΔL is, for example, an integer multiple of the wavelength, and a mirror $M_{i+1}$, which is located in the vicinity of the mirror $M_i$, reflects the light at the same angle $\theta_i$, Expression (1) shows that the light reflected off the mirror $M_i$ and the light reflected off the mirror $M_{i+1}$ interfere with each other in a constructive manner, resulting in an increase in the optical intensity of the reflected light.

When the optical path difference ΔL is not an integer multiple of the wavelength, however, the light reflected off the mirror $M_i$ and the light reflected off the mirror $M_{i+1}$ interfere with each other in a destructive manner, resulting in a decrease in the optical intensity of the reflected light. When the optical path difference ΔL is the wavelength multiplied by (integer+0.5), in particular, the light reflected off the mirror $M_i$ and the light reflected off the mirror $M_{i+1}$ interfere with each other in a destructive manner in such a way that the reflected light has an intensity of zero.

The above discussion presents a new problem described below.

[Problem 1] Even when the mirrors of the MMD 50 are changed in an angularly continuous manner, the laser fluxes reflected off adjacent mirrors in the same direction interfere with each other in a constructive or destructive manner in accordance with the interference situation, so that desired controlled intense reflected light cannot be produced.

[Problem 2] As a result, the processing receiving material 16 cannot be processed in an arbitrary position.

To address the problem described above, a laser beam having low spatial coherency, such as a laser beam outputted from an excimer laser apparatus 12, is caused to be incident on the MMD 50 in the present embodiment.

Further, the angle of the attitude of each of the mirrors of the MMD 50 is so controlled that laser beams in positions where the laser beams hardly interfere with each other are reflected at the same angle.

As a result, the reflected laser fluxes superimposed by the Fourier transform optical system 61 on each other in an arbitrary position provide an optical intensity that is a simple sum of the optical intensities of the light fluxes, and the original intensities are maintained. The processing receiving material 16 can thus be processed in an arbitrary position on the surface thereof.

3.5 Description of Spatial Coherence Length of Laser Beam and Coherence Cells

Figure 6:
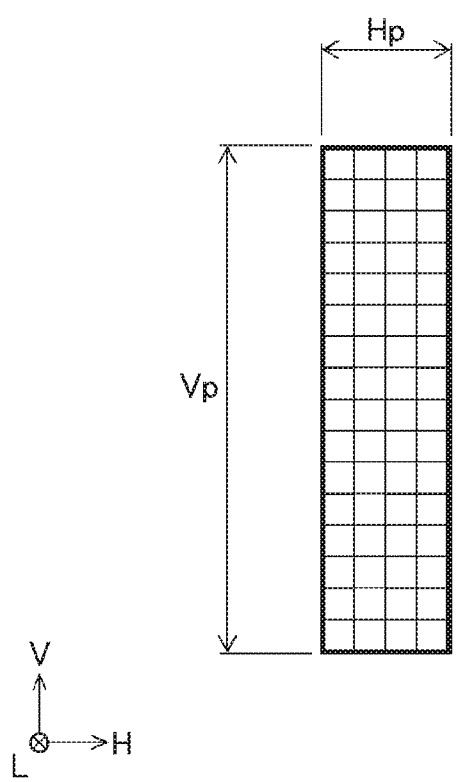
FIG. 6 shows coherence cells of a laser beam that is outputted from an excimer laser apparatus and enters a beam shaping optical system.

To control the angle of the attitude of each of the mirrors of the MMD 50, a concept of the "coherence cells" is introduced in the present embodiment. FIG. 6 shows the coherence cells of the laser beam that is outputted from the excimer laser apparatus and enters the beam shaping optical system. The direction of the major axis of a cross section of the laser beam is called a direction H, and the direction of the minor axis of the cross section perpendicular to the direction H is called a direction V. The traveling direction of the laser beam is called a direction L.

Let Lsh be the spatial coherence length of the laser beam in the direction H and Lsv be the spatial coherence length of the laser beam in the direction V, and the coherence cells are each defined as a rectangle having a cell length in the direction H being greater than or equal to Lsh, and a cell length in the direction V being greater than or equal to Lsv. It is assumed in the following description that each coherence cell has a size Lsh×Lsv for simplification of the description.

For example, it is assumed that the laser beam has a length Hp in the direction H being 4 mm and a length Vp in the direction V being 16 mm, and that the spatial coherence lengths in the directions H and V are Lsh=1 mm and Lsv=1 mm, respectively. In this case, the coherence cells each have a size of 1 mm×1 mm, and the number of coherence cells present in a cross section of the laser beam is 4×16=64, as shown in FIG. 6.

The spatial coherence lengths are defined as follows.

The spatial coherence length can be measured by causing the laser flux to pass through a double pinhole plate in Young's interferometer (see FIG. 7) and measuring the distance D between the two pin holes in the double pinhole plate and the contrast C of the resultant interference fringes.

Figure 7:
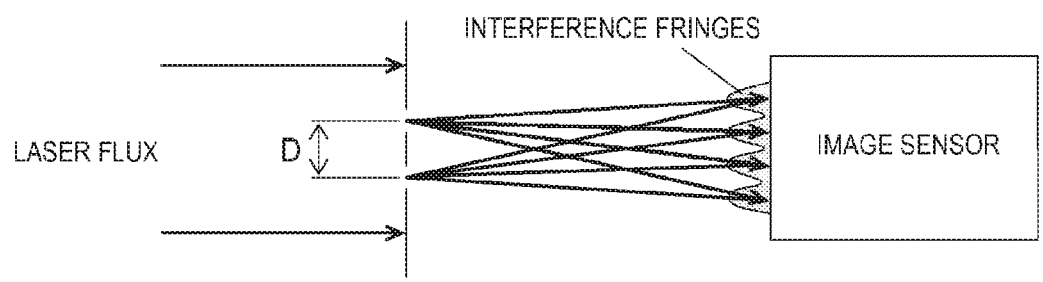
FIG. 7 shows an overview of a method for measuring a spatial coherence length.

FIG. 7 shows an overview of a method for measuring the spatial coherence length. Causing the laser flux to pass through the double pinhole plate in Young's interferometer and capturing an image of the resultant interference fringes with an image sensor allows the optical intensity distribution of the interference fringes to be provided. The distance between the two pinholes in the double pinhole plate is a synonym of the "gap between the double pinholes."

Figure 8:
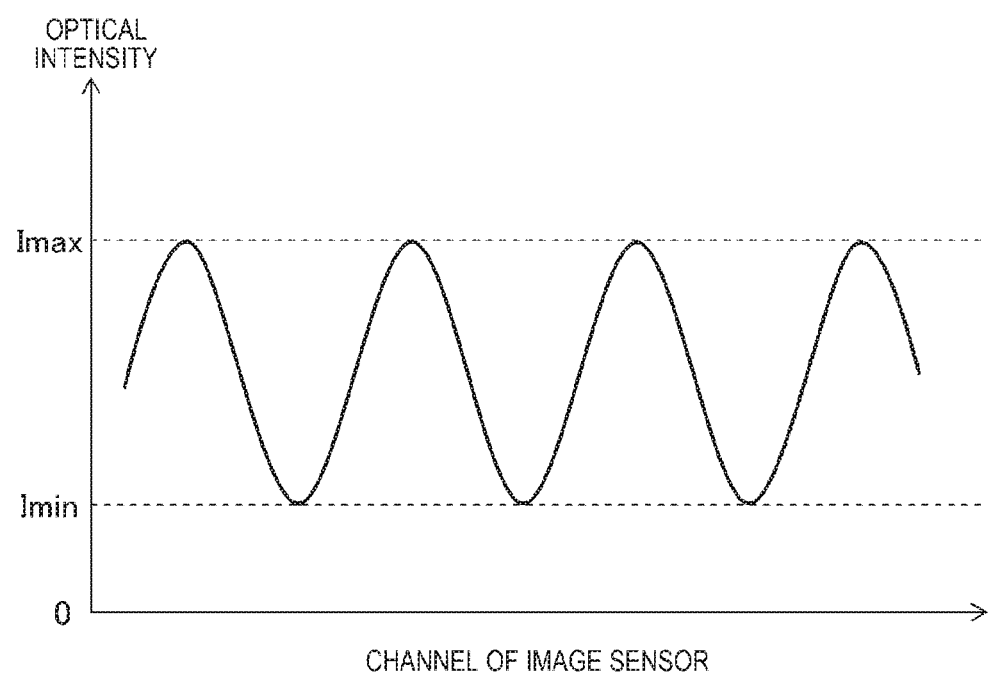
FIG. 8 shows a graph illustrating an example of the optical intensity distribution of interference fringes measured with an image sensor.

FIG. 8 shows a graph illustrating an example of the optical intensity distribution of the interference fringes measured with the image sensor. The horizontal axis represents the channel of the image sensor, that is, the positions of the pixels, and the vertical axis represents the optical intensity. The contrast C of the interference fringes is calculated by the following Expression (2).

$$C=(I\max-I\min)/(I\max+I\min) \quad (2)$$

Imax in Expression (2) represents the maximum of the optical intensity. Imin in Expression (2) represents the minimum of the optical intensity.

Figure 9:
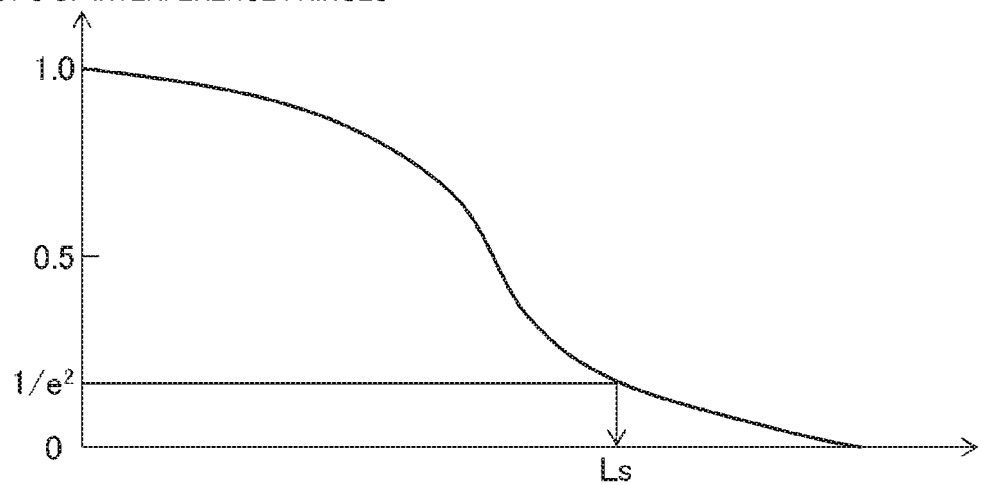
FIG. 9 shows a graph illustrating the relationship between the gap between double pinholes and the contrast of the interference fringes.

FIG. 9 shows a graph illustrating the relationship between the double pinholes and the contrast of the interference fringes. The horizontal axis represents the gap between the double pinholes, and the vertical axis represents the contrast of the interference fringes. The spatial coherence length is assumed to be the distance Ls between the double pinholes that causes the contrast C of the interference fringes to, for example, be $1/e^2$ (see FIG. 9). The letter "e" represents the base of natural logarithm (Napier's constant).

The spatial coherence length Lsh in the direction H is the coherence length measured when the double pinholes are arranged in the direction of the minor axis of the laser beam.

The spatial coherence length Lsv in the direction V is the coherence length measured when the double pinholes are arranged in the direction of the major axis of the laser beam.

For example, assume a case where the entire elements of the MMD 50 have a size of 16 mm×16 mm, the number of mirrors is 1024×1024, and the size of one mirror is about 16 µm×16 µm.

Figure 10:
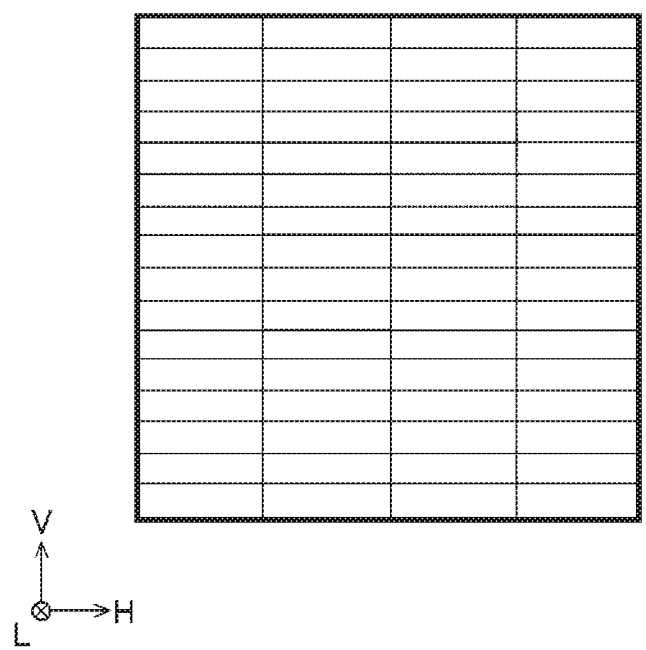
FIG. 10 shows the coherence cells of the laser beam incident on the MMD via a beam shaping optical system and a beam collimator optical system.

FIG. 10 shows the laser beam and the coherence cells that exit out of the beam shaping optical system 47 and are incident on the MMD 50 via the beam collimator optical system 48.

The laser beam enlarged by the beam shaping optical system 47 by a factor of four in the direction H is incident on the MMD 50. The enlarged laser beam therefore has a beam size of 16 mm×16 mm.

The beam expansion by the factor of four causes the spatial coherence length in the direction H to be 4×1 mm=4 mm Each of the coherence cells therefore has a size of 4 mm×1 mm, and the number of coherence cells of the laser beam enlarged by the factor of four in the direction H is maintained (4×16=64).

The number of mirrors of the MMD 50 in one coherence cell is 256×64=16,384.

The coherence cells each have the size of Lsh×Lsv in the present example, but the size of each of the coherence cells is not limited to Lsh×Lsv. The coherence cells may each have a size larger than Lsh×Lsv.

For example, coherence cells may be so set by using numbers a and b that satisfy a≥1 and b≥1 that the length in the direction H is Lsh multiplied by a or "a×Lsh" and the length in the direction V is Lsv multiplied by b or "b×Lsv".

The directions H and V are an example of two axial directions perpendicular to each other. The direction H is an example of a "first axial direction," and a side of a quadrangle having the length of "Lsh" or "a×Lsh" is an example of a "first side." The direction V is an example of a "second axial direction," and a side of a quadrangle having the length of "Lsv" or "b×Lsv" is an example of a "second side."

3.6 Relationship Between Coherence Cells and Plurality of Mirrors of MMD

Figure 11:
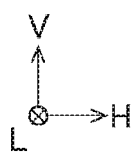
FIG. 11 shows an example of the coherence cells of the laser beam at the MMD and the arrangement of the coherence cells.

FIG. 11 shows an example of the coherence cells of the laser beam at the MMD and the arrangement of the coherence cells. In the example, the coherence cells are arranged in a matrix formed of 16 rows in the direction V and 4 columns in the direction H, and the arrangement of the coherence cells is expressed by "C(row, columns)."

Figure 12:
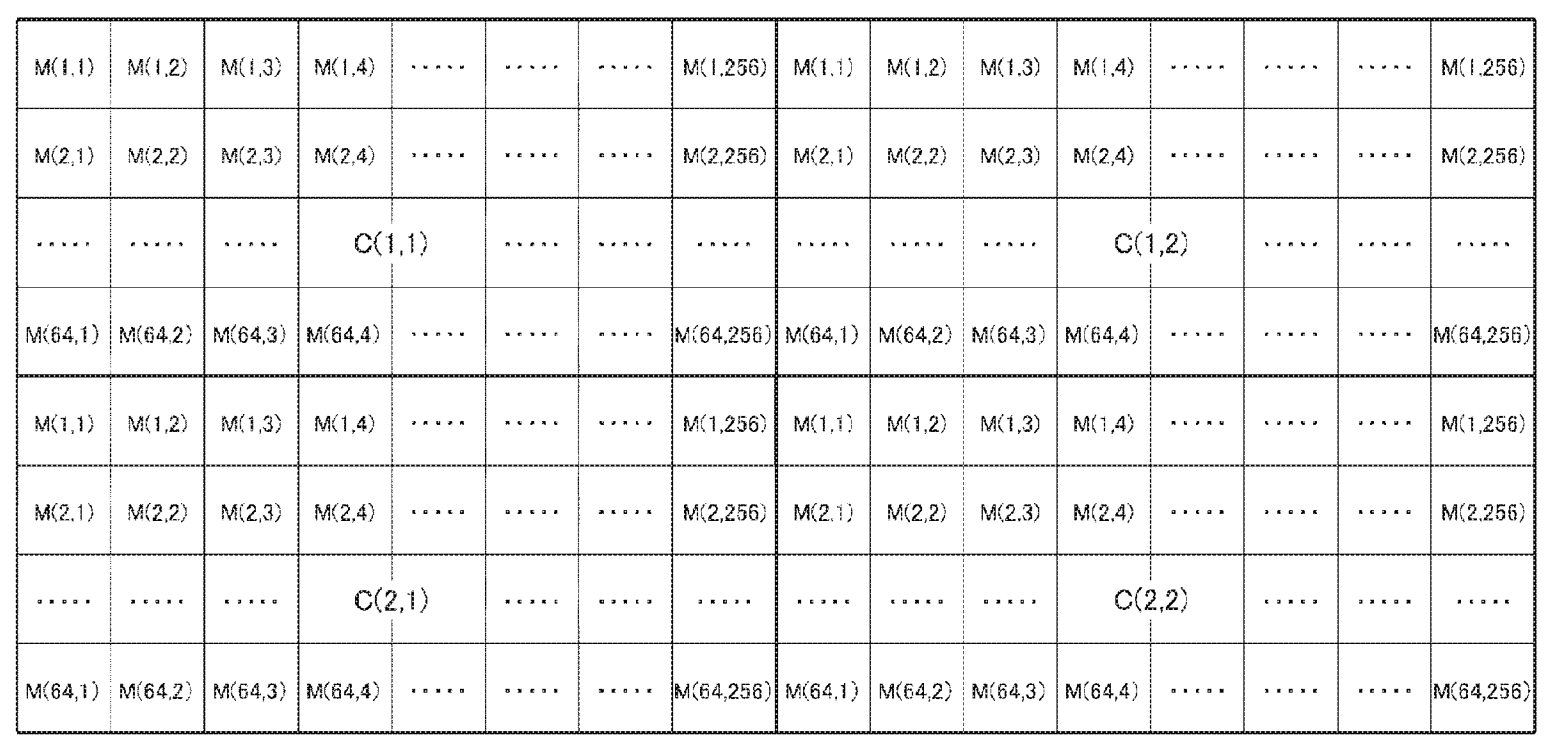

FIG. 12 shows an example of the coherence cells at the MMD and the arrangement of the mirrors disposed therein. In the example, the mirrors in the coherence cells C(1, 1), C(1, 2), C(2, 1), and C(2, 2) are arranged in a matrix formed of 64 rows in the direction V and 256 columns in the direction H and are each expressed by M(row, column).

FIG. 12 does not show all the mirrors, and 64×256 mirrors M(1, 1) to M(64, 256) are arranged in each of the coherence cells C(1, 1) to C(16, 4).

The arrangement of the plurality of mirrors of the MMD 50 is segmented into a plurality of mirror arrangement regions in correspondence with the coherence cells, and the mirror arrangement regions each containing the plurality of mirrors M(1, 1) to M(64, 256) are specified on a coherence cell basis as shown in FIG. 12.

The laser fluxes reflected off the mirrors M(k, J) in the same position in the coherence cells each have low coherency. The laser processing control section 80 in the present embodiment is configured to select one of the mirrors in each of the plurality of coherence cells and control the angle of the attitude of the plurality of mirrors in such a way that the selected mirrors reflect the laser fluxes in the same direction. One mirror is so selected from each of the plurality of coherence cells in such a way that the selected mirrors reflect the laser fluxes in the same direction, and the thus selected mirrors may be mirrors in the same position in the coherence cells.

3.7 Reflection of Laser Fluxes Off Mirrors of MMD

Figure 13:
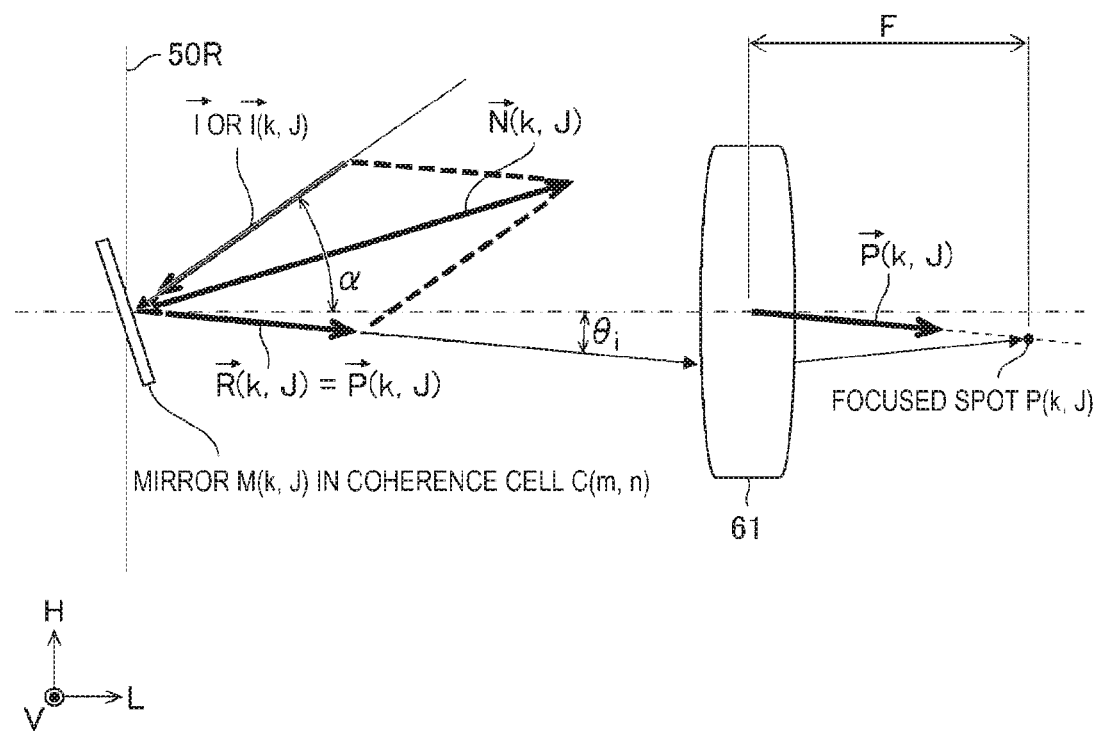
FIG. 13 is a diagrammatic view on the assumption that a laser flux reflected off a mirror of the MMD is focused by the Fourier transform optical system on a focused spot.

FIG. 13 is a diagrammatic view on the assumption that the laser flux reflected off a mirror of the MMD is focused by the Fourier transform optical system into a focused spot. FIG. 13 is a diagrammatic view on the assumption that incident light I, which is the laser flux, reflected off a mirror M(k, J) of the MMD 50 in a coherence cell C(m, n) is focused into a focused spot P(k, J) in the focal plane of the Fourier transform optical system 61 where the magnification of the projection optical system 64 is one.

Data representing the position of the focused spot P(k, J) allows determination of a unit vector P(k, J) of the laser flux that enters the Fourier transform optical system 61. A unit vector of the laser flux means a unit vector representing the traveling direction of the laser flux.

A unit vector R(k, J) of the laser flux reflected off the mirror M(k, J) is equal to the unit vector P(k, J). In the present specification, to describe a vector used to express, for example, a mathematical expression, the vector is expressed by using square parentheses [ ] for convenience of the description. For example, a vector X is expressed as [X]. That is, [R(k, J)]=[P(k, J)]. In the drawings, a vector is expressed with an arrow "→" added to the top of a letter symbol.

Assuming that the unit vector of the laser flux incident on the mirror M(k, J) is a vector I, and that the vector I is a vector oriented in a fixed direction irrespective of the position (k, J), a vector N(k, J) of a normal to the mirror M(k, J) is expressed based on the law of reflection by the following Expression (3):

$$N(k,J)=[P(k,J)]-[I] \quad (3)$$

Instead, when the angle of the laser flux incident on the mirror M(k, J) varies in accordance with the position (k, J), and the angle is measurable, the vector N(k, J) of a normal to the mirror M(k, J) is expressed by the following Expression (4):

$$N(k,J)=[P(k,J)]-[I(k,J)] \quad (4)$$

where I(k, J) is the unit vector of the laser flux incident on the mirror M(k, J).

3.8 Example of Procedure of Control of Laser Processing System According to First Embodiment

3.8.1. Main Routine

Figure 14:
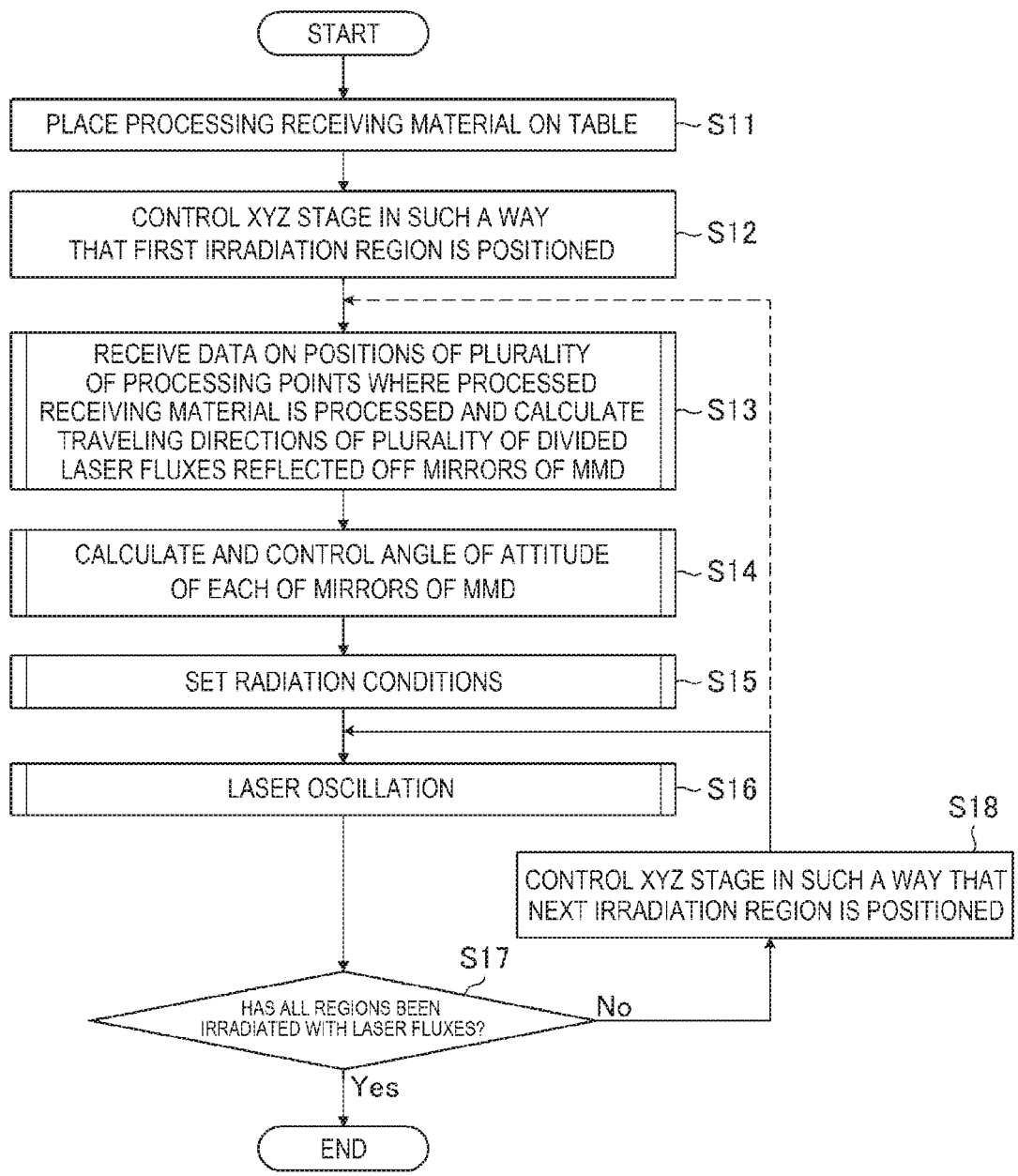
FIG. 14 is a flowchart of a main routine including the process of controlling the angle of the attitude of each of the mirrors of the MMD.

FIG. 14 is a flowchart of a main routine showing an example of control of the laser processing system according to the first embodiment. In step S11 including the process of controlling the angle of the attitude of each of the mirrors of the MMD 50, the processing receiving material 16 is placed on the table 70. The processing receiving material 16 may be placed on the table 70 manually by an operator or may be placed on the table 70 via a robot or any other automatic transport apparatus that is not shown. After the placement, the position of the processing receiving material 16 is determined on the table 70 by an alignment optical system that is not shown, allowing alignment of the processing receiving material 16 with the processing position.

In step S12, the laser processing control section 80 controls the XYZ stage 72 in such a way that the first irradiation region is positioned. For example, the laser processing control section 80 controls the axis Z in such a way that the processed surface of the processing receiving material 16 coincides with the image formation plane of the projection optical system 64 and controls the stage in the directions X and Y in such a way that an initial processing region is positioned.

In step S13, the laser processing control section 80 receives the data on the positions of a plurality of processing points where the processing receiving material 16 is processed and calculates the traveling directions of the plurality of divided laser fluxes reflected off the mirrors of the MMD 50.

In step S14, the laser processing control section 80 calculates the angle of the attitude of each of the mirrors of the MMD 50 and controls the angle of the attitude of the mirror.

That is, the processes in steps S13 and S14 allow calculation of the angle of the attitude of each of the mirrors of the MMD 50 based on the data on the positions of the plurality of processing points and control of the angle of the attitude of each of the mirrors of the MMD 50 based on the result of the calculation. A subroutine in step S13 will be described later with reference to FIG. 15. A subroutine in step S14 will be described later with reference to FIG. 16.

In step S15 in FIG. 14, the laser processing control section 80 sets laser flux radiation conditions. The radiation conditions include, for example, the target fluence Ft, the repetitive frequency f, and the number S of radiated pulses.

In step S16, the laser processing control section 80 transmits an oscillation instruction to the laser apparatus 12 to cause the laser apparatus 12 to perform laser oscillation under the conditions including the repetitive frequency f, the number S of radiated pulses, and the target pulse energy Et. That is, in step S16, the laser apparatus 12 outputs the pulsed laser flux 21, and the processing receiving material 16 is irradiated with the pulsed laser flux 26. The processing receiving material 16 is processed by the laser radiated thereto. A subroutine in step S16 will be described later with reference to FIG. 17.

In step S17 in FIG. 14, the laser processing control section 80 evaluates whether or not all processing target regions of the processing receiving material 16 has been irradiated with the laser fluxes.

When the result of the evaluation in step S17 shows No, that is, when the processing receiving material 16 still has a non-processed region, the laser processing control section 80 proceeds to step S18.

In step S18, the laser processing control section 80 controls the XYZ stage 72 in such a way that the next irradiation region is positioned.

After step S18, the laser processing control section 80 returns to step S16 and irradiates the processing receiving material 16 with the laser flux.

When the result of the evaluation in step S17 shows Yes, that is, when the entire processing receiving material 16 has been processed, the processes in the flowchart of FIG. 14 are terminated.

<Variation 1>

The example shown in FIG. 14 has been described with reference to the case where the irradiation regions of the processing receiving material 16 are processed in the same processing pattern, but not necessarily, and the processing pattern may vary on an irradiation region basis. In the case where the processing pattern varies on an irradiation region basis, the loop from step S18 back to step S16 may be replaced with transition from step S18 to step S13 in the flowchart shown in FIG. 14, as indicated by the broken line in FIG. 14.

3.8.2 Subroutine in Step S13

Figure 15:
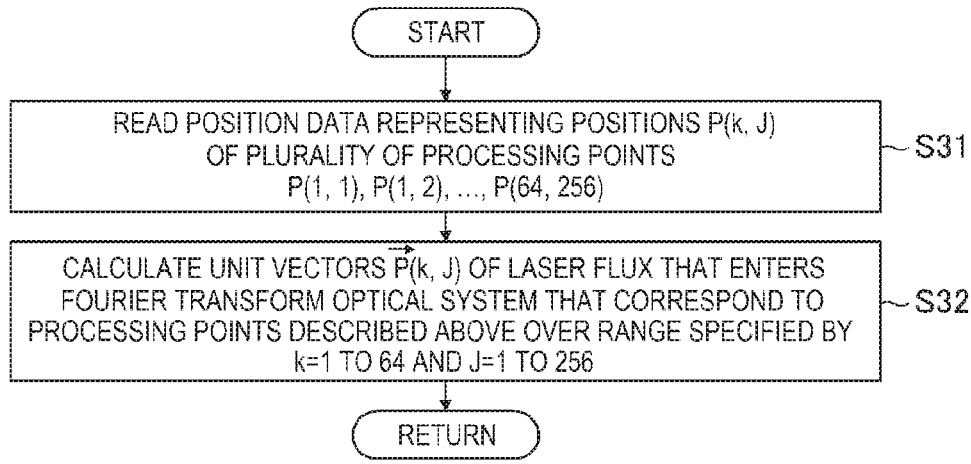
FIG. 15 is a flowchart showing the processing content in step S13 in FIG. 14.

FIG. 15 is a flowchart showing the processing content in step S13 in FIG. 14. In step S31 in FIG. 15, the laser processing control section 80 reads position data that specify the positions P(k, J) of the plurality of processing points. In the present example, for example, the processing receiving material 16 can be processed at 64×256 processing points. In this case, position data on the positions from P(1, 1) to P(64, 256) are read.

In step S32, the laser processing control section 80 calculates the unit vectors P(k, J) of the laser flux that enters the Fourier transform optical system 61 that correspond to the processing points described above over the range specified by k=1 to 64 and J=1 to 256.

After step S32, the laser processing control section 80 returns to the main routine in FIG. 14.

3.8.3 Subroutine in Step S14

Figure 16:
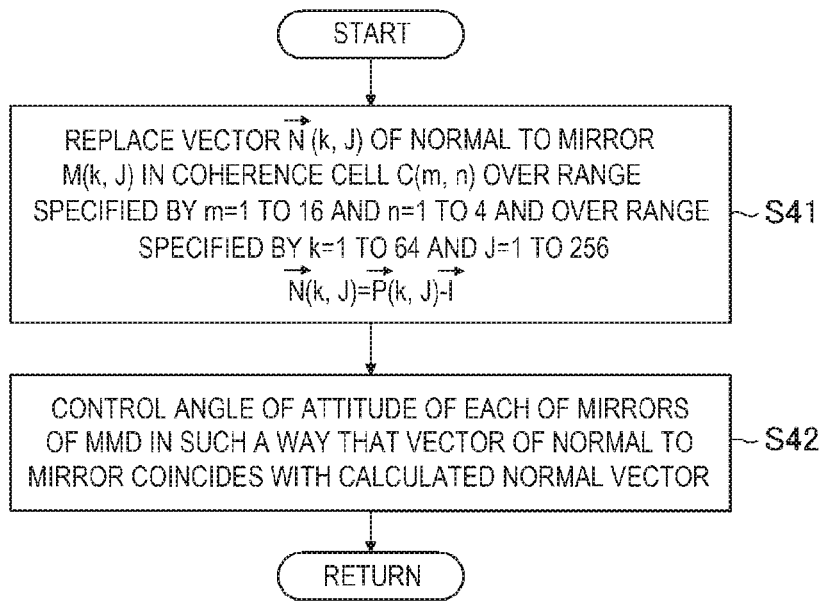
FIG. 16 is a flowchart showing the processing content in step S14 in FIG. 14.

FIG. 16 is a flowchart showing the processing content in step S14 in FIG. 14. In step S41 in FIG. 16, the laser processing control section 80 replaces the vector N(k, J) of a normal to the mirror M(k, J) in the coherence cell C(m, n) over the range specified by m=1 to 16 and n=1 to 4 in accordance with Expression (3). The laser processing control section 80 replaces the vector N(k, J) of a normal to the mirror M(k, J) with [P(k, J)]−[I] over the range specified by k=1 to 64 and J=1 to 256.

In step S42, the laser processing control section 80 controls the angle of the attitude of each of the mirrors of the MMD 50 in such a way that the vector of the normal to the mirror coincides with the corresponding calculated normal vector.

After step S42, the laser processing control section 80 returns to the main routine in FIG. 14.

3.8.4 Subroutine in Step S15

Figure 17:
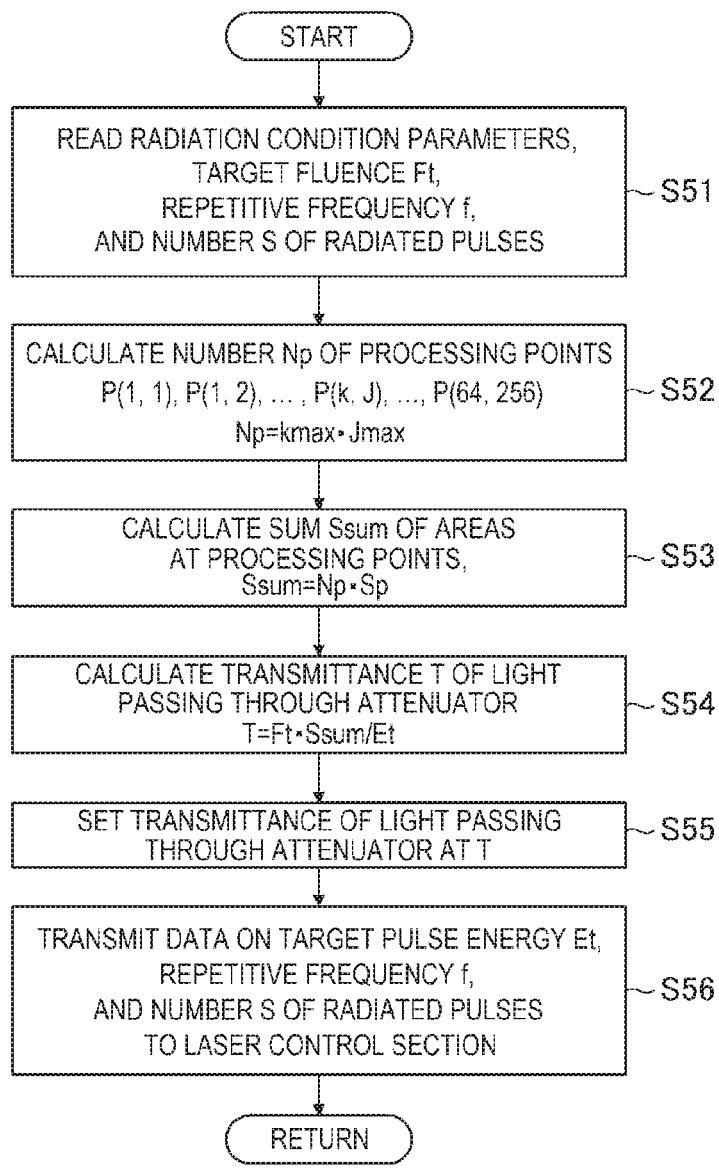
FIG. 17 is a flowchart showing the processing content in step S15 in FIG. 14.

FIG. 17 is a flowchart showing the processing content in step S15 in FIG. 14. In step S51 in FIG. 17, the laser processing control section 80 reads laser flux radiation condition parameters for processing the processing receiving material 16. The radiation condition parameters include the target fluence Ft, the repetitive frequency f, and the number S of radiated pulses.

In step S52, the laser processing control section 80 calculates the number Np of processing points. For example, in a case where the number of mirrors in each of the coherence cells is equal to the number of processing points, Np=kmax·Jmax is satisfied. In the present example, Np=64×256=16,384. The reference character kmax represents the maximum of k. The reference character Jmax represents the maximum of J.

The positions of the Np=64×256=16,384 points are expressed as P(1, 1), P(1, 2), . . . , P(k, J), . . . , P(64, 256).

In step S53, the laser processing control section 80 calculates the sum Ssum of the areas at the processing points. Let Sp be the size of each of the focused spots formed by the Fourier transform optical system 61, and the sum Ssum of the areas at the processing points, that is, the entire processing area is the product of the number Np of processing points and Sp.

$$Ssum = Np \cdot Sp$$

In step S54, the laser processing control section 80 calculates the transmittance T of the light flux passing through the attenuator 40. The target fluence is expressed by the following Expression (5).

$$Ft = T \cdot Et/Ssum \quad (5)$$

Et in Expression (5) represents the pulse energy of the pulsed laser flux 21 outputted from the laser apparatus 12.

The transmittance T of the light beam passing through the attenuator 40 can therefore be calculated by the following Expression (6):

$$T = Ft \cdot Ssum/Et \quad (6)$$

In step S55, the laser processing control section 80 sets the transmittance T of the light beam passing through the attenuator 40 in accordance with the result of the calculation in step S54.

In step S56, the laser processing control section 80 transmits data on the target pulse energy Et, the repetitive frequency f, and the number S of radiated pulses to the laser control section 108.

In the state in step S56, the data is only transmitted to the laser control section 108, but the laser apparatus 12 does not output the pulsed laser flux 21. In step S16 in FIG. 14, the laser apparatus 12 outputs the pulsed laser flux 21 only when the laser control section 80 receives the oscillation instruction from the laser processing control section.

After step S56 in FIG. 17, the laser processing control section 80 returns to the main routine in FIG. 14.

3.8.5 Variation 1

The flowchart shown in FIG. 17 has been described on the assumption that the laser processing control section 80 stores in advance the rated pulse energy of the laser flux from the laser apparatus 12 as the target pulse energy Et and the target pulse energy Et is a fixed value, but not necessarily. The target pulse energy Et may be changed up to the rated pulse energy of the laser flux from the laser apparatus 12 to adjust the fluence on the processed surface to the target fluence Ft.

3.8.6 Variation 2

In the example shown in FIG. 17, the calculation of the transmittance has been performed on the assumption that the transmittance of the laser flux along the optical path from the attenuator 40 of the laser processing apparatus 14 to the processing receiving material 16 is 100%, but not necessarily, and transmittance Tp along the optical path described above may be taken into consideration in the expression for calculating the transmittance T, as shown in the following Expression (7) as long as the transmittance Tp is measured in advance:

$$T = Ft \cdot Ssum/(Tp \cdot Et) \quad (7)$$

3.8.7 Variation 3

The example described with reference to FIGS. 14 to 17 has been presented with reference to the case where the magnification M of the projection optical system 64 is one, and the fluence on the surface of the processing receiving material 16 is multiplied by $(1/M)^2$ when the magnification of the projection optical system is M. In this case, the total area Ssum of the processed surface is expressed by the following Expression (8):

$$Ssum = Np \cdot Sp \cdot M^2 \quad (8)$$

3.8.8 Variation 4

The example described with reference to FIGS. 14 to 17 has been presented with reference to the case where the number Np of processing points coincides with the number of mirrors in each of the coherence cells. In a case where the number of processing points is greater, the number of mirrors in each of the coherence cells may be set at a larger number.

For example, in FIG. 11, two adjacent coherence cells (such as C(1, 1) and C(2, 1)) are combined with each other into one coherence cell to redefine the coherence cells. In this case, the number of processing points can be doubled, but the fluence is halved.

3.9 Effects and Advantages

The first embodiment provides the following effects and advantages.

(1) Controlling the angle of the attitude of each of the mirrors of the MMD 50 allows the positions of the focused spots to be arbitrarily set and irradiation of the processing receiving material 16 with the laser fluxes.

(2) Out of the plurality of divided laser fluxes reflected off the MMD 50, a plurality of divided laser fluxes each having low coherency are superimposed on one another into a focused spot, whereby occurrence of speckles at each focused spot can be suppressed.

(3) Superimposing a plurality of divided laser fluxes reflected off the MMD 50 on one another allows a uniform intensity distribution at each focused spot.

(4) Since the laser fluxes reflected off almost all the mirrors of the MMD 50 are focused to form optical images at a plurality of spots, and the thus produced images are used to process the processing receiving material 16, the light use efficiency approaches 100%.

3.10 Example 1 of Other Forms

In the first embodiment, the first image formed in the focal plane of the Fourier transform optical system 61 is transferred to the second image by the projection optical system 64 to irradiate the processing receiving material 16 with the laser flux, but not necessarily. For example, a configuration in which the projection optical system 64 in the first embodiment is omitted may be employed, and the surface of the processing receiving material 16 may be placed in the focal plane of the Fourier transform optical system 61, followed by irradiation of the processing receiving material 16 with the laser flux.

3.11 Example 2 of Other Forms

In the first embodiment, the first image formed in the focal plane of the Fourier transform optical system 61 is transferred to the second image by the projection optical system 64 to irradiate the processing receiving material 16 with the laser flux, but not necessarily. For example, a mask having light passing holes each having a size smaller than the focused spots but close to the size of the focused spots may be disposed in the position of the first image. In this case, since the projection optical system 64 forms an image of the mask on the surface of the processing receiving material 16, holes each having a diameter smaller than the diameter of the focused spots formed by the Fourier transform optical system 61 (diameter ranging from 3 to 20 µm, for example) can be formed in the processing receiving material 16. Further, using the mask improves the processed shape in the depth direction (tapered portion has steeper angle).

3.12 Others

The data on a plurality of processing points in the present embodiment represent processing points in different positions where the laser beams directed to the processing points do not overlap with each other. When the laser beams directed to the processing points overlap with each other, the laser beams interfere with each other, resulting deterioration of the optical intensity distribution of the resultant laser beam.

4. Second Embodiment

4.1 Configuration

Figure 18:
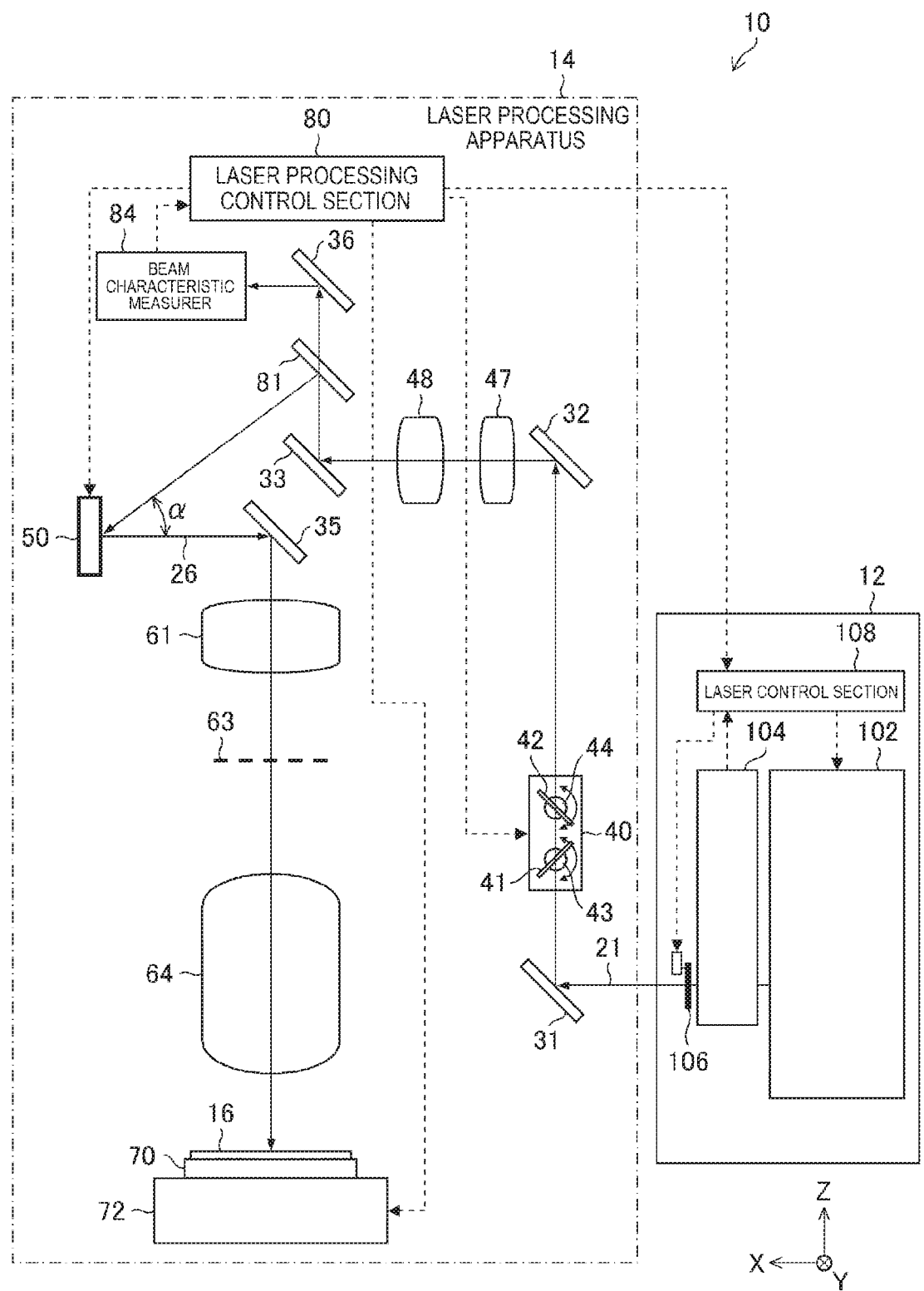
FIG. 18 schematically shows the configuration of a laser processing system according to a second embodiment.

FIG. 18 schematically shows the configuration of a laser processing system according to a second embodiment. Differences from the first embodiment shown in FIG. 3 will be described below. In FIG. 18, the laser apparatus 12 is drawn in a simplified manner, and a configuration similar to that of the laser apparatus 12 shown in FIG. 3 can be employed. The laser processing system 10 according to the second embodiment shown in FIG. 18 includes a beam splitter 81 in place of the high-reflectance mirror 34 in the first embodiment shown in FIG. 3 and further includes a high-reflectance mirror 36 and a beam characteristic measurer 84. The beam splitter 81 is configured to reflect part of the laser flux reflected off the high-reflectance mirror 33 toward the MMD 50. The high-reflectance mirror 36 is configured to reflect the laser flux having passed through the beam splitter 81 and cause the reflected light flux to enter the beam characteristic measurer 84.

4.2 Case where Beam Characteristic Measurer is Beam Profiler

Figure 19:
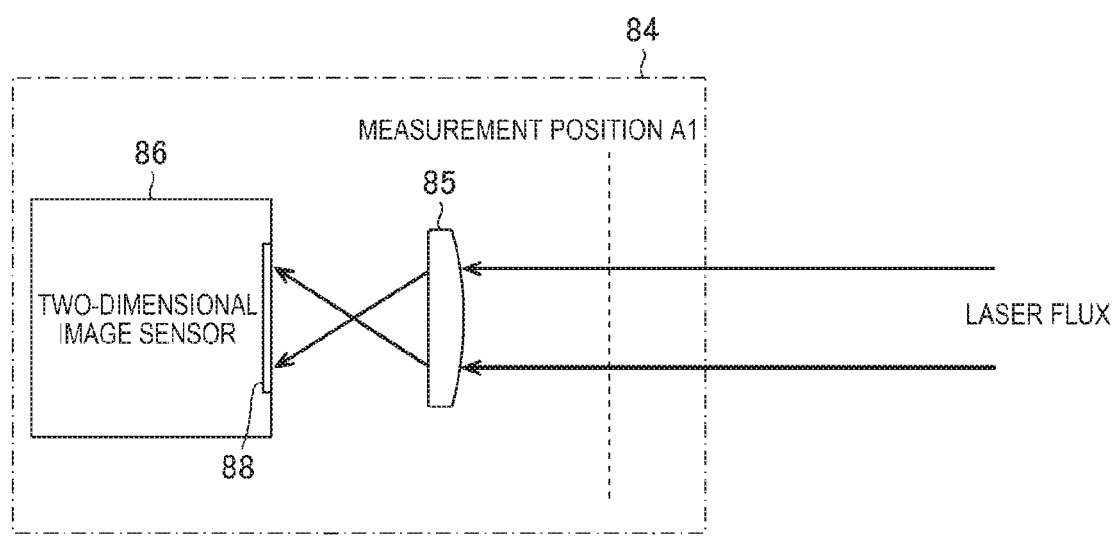
FIG. 19 schematically shows the configuration of a beam profiler that is an example of a beam characteristic measurer.

FIG. 19 schematically shows the configuration of a beam profiler used as the beam characteristic measurer. The beam characteristic measurer 84 may be a beam profiler configured to measure the optical intensity distribution of the laser beam incident on the MMD 50. The beam profiler includes a transfer lens 85 and a two-dimensional image sensor 86. The two-dimensional image sensor 86 may be a CCD sensitive to the laser beam.

The beam profiler is so disposed that the laser beam in a measurement position A1 is focused on the elements of the two-dimensional image sensor 86 via the transfer lens 85.

The measurement position A1 is so determined that the optical path length between the beam splitter 81 and the MMD 50 coincides with the optical path length from the beam splitter 81 to the measurement position A1 via the high-reflectance mirror 36 in FIG. 18.

4.3 Operation

The beam characteristic measurer 84 is configured to be capable of measuring the optical intensity distribution of the laser beam incident on the MMD 50. The result of the measurement performed by the beam characteristic measurer 84 is transmitted to the laser processing control section 80. The laser processing control section 80 is configured to acquire the optical intensity distribution of the laser beam incident on the MMD 50 from the beam characteristic measurer 84.

The laser processing control section 80 may be configured to select mirrors from the mirrors of the MMD 50 that are the mirrors that contribute to the plurality of spots produced by the Fourier transform optical system 61 and the MMD 50 based on the result of the measurement performed by the beam profiler and the coherence cells in such a way that the focused spots have the same optical intensity.

4.3.1 Main Routine

Figure 20:
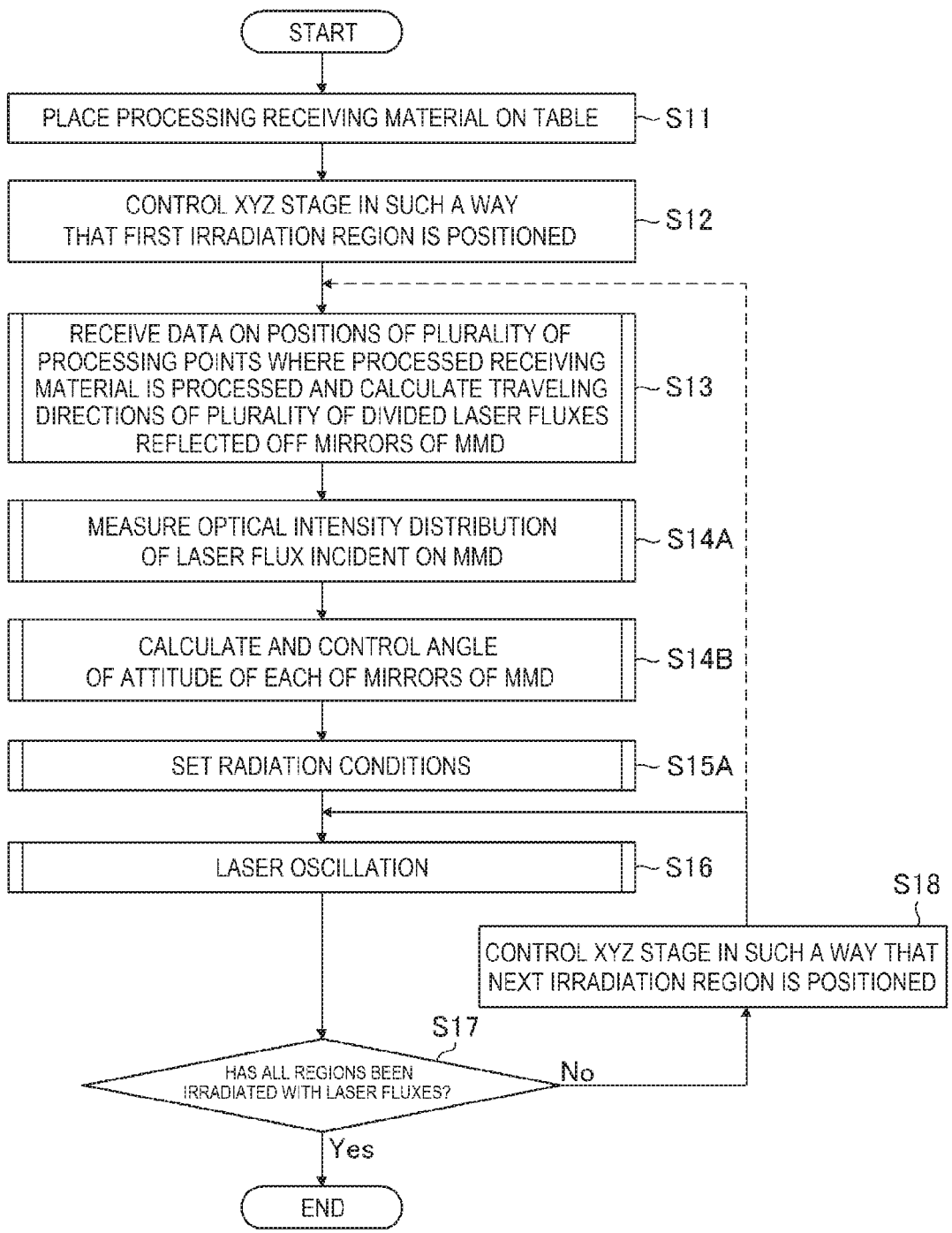
FIG. 20 is a flowchart showing a main routine in an example of the control in the case where the beam characteristic measurer is a beam profiler.

FIG. 20 is a flowchart showing a main routine in an example of the control in the case where the beam characteristic measurer is a beam profiler. In FIG. 20, the same steps as those in the flowchart shown in FIG. 14 have the same step numbers and will not be described. Differences from the flowchart shown in FIG. 14 will be described.

In place of steps S14 and S15 in FIG. 14, the flowchart shown in FIG. 20 includes steps S14A, S14B, and S15A.

In step S14A, the laser processing control section 80 measures the optical intensity distribution of the laser flux incident on the MMD 50. The laser processing control section 80 causes the beam profiler to measure the optical intensity distribution of the light flux incident on the MMD 50.

In step S14B in FIG. 20, the laser processing control section 80 calculates the angle of the attitude of each of the mirrors of the MMD 50 and controls the angle of the attitude of the mirror. That is, the processes in steps S13, S14A, and S14B allow calculation of the angle of the attitude of each of the mirrors of the MMD 50 based on the data on the positions of the plurality of processing points and control of the angle of the attitude of each of the mirrors of the MMD 50 based on the result of the calculation. A subroutine in step S14B will be described later with reference to FIG. 22.

In step S15A in FIG. 20, the laser processing control section 80 sets laser flux radiation conditions.

A subroutine in step S14A will be described with reference to FIG. 21. A subroutine in step S14B will be described with reference to FIG. 22. A subroutine in step S15A will be described with reference to FIG. 23.

4.3.2 Subroutine in Step S14A

Figure 21:
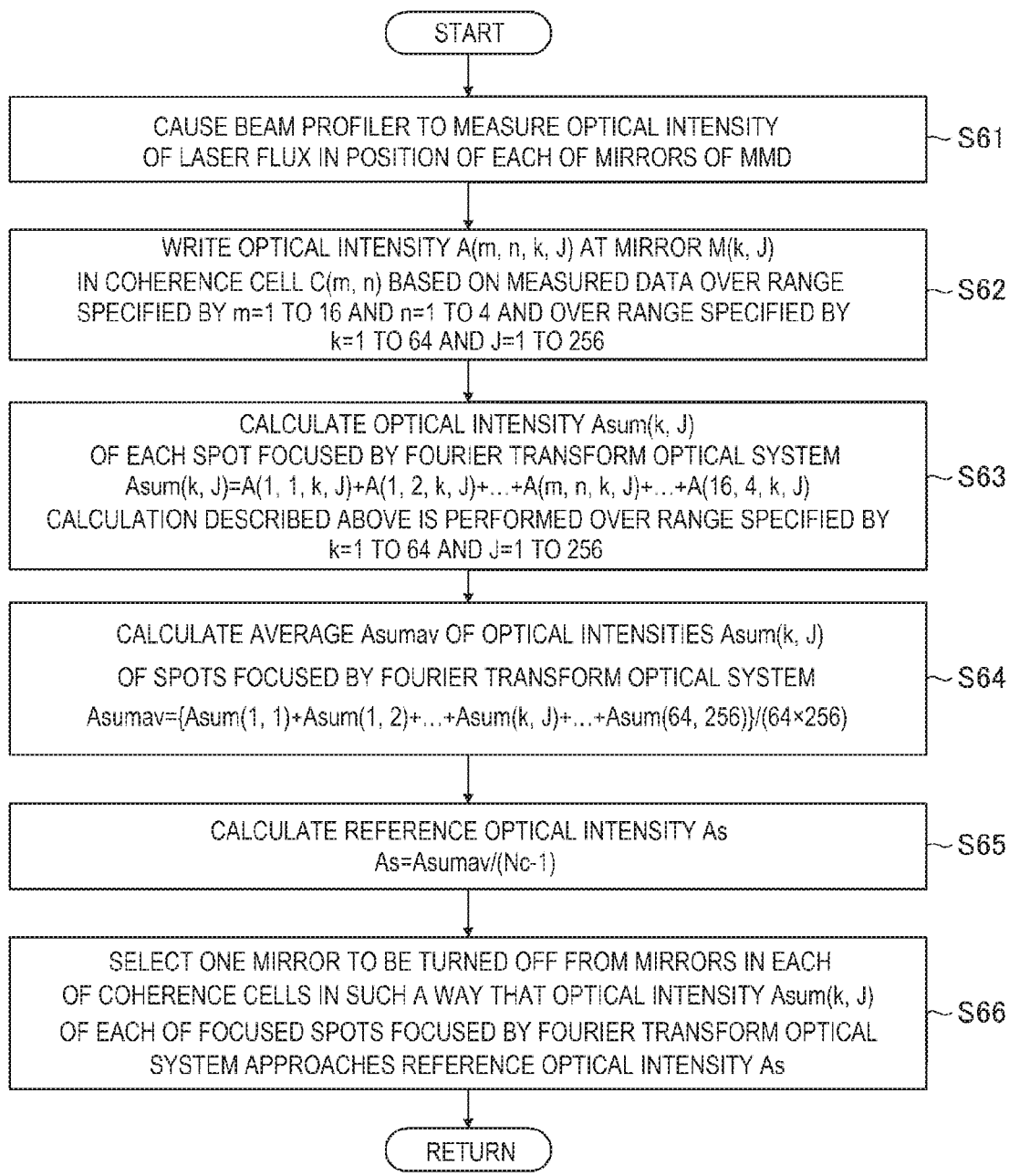
FIG. 21 is a flowchart showing the processing content in step S14A in FIG. 20.

FIG. 21 is a flowchart showing the processing content in step S14A in FIG. 20. In step S61 in FIG. 21, the laser processing control section 80 causes the beam profiler to measure the optical intensity of the laser flux in the position of each of the mirrors of the MMD 50.

In step S62, the laser processing control section 80 writes the optical intensity A(m, n, k, J) at the mirror M(k, J) in the coherence cell C(m, n) based on the measured data over the range specified by m=1 to 16 and n=1 to 4 and over the range specified by k=1 to 64 and J=1 to 256.

In step S63, the laser processing control section 80 calculates the optical intensity Asum(k, J) of each spot focused by the Fourier transform optical system 61. The calculation of Asum(k, J) is performed in accordance with the following Expression (9):

$$A\text{sum}(k,J)=A(1,1,k,J)+A(1,2,k,J)+ \quad . \quad . \quad . \quad + \\ A(m,n,k,J)+ \ldots +A(16,4,k,J) \qquad (9)$$

The laser processing control section 80 performs the calculation of Asum(k, J) over the range specified by k=1 to 64 and J=1 to 256.

In step S64, the laser processing control section 80 calculates the average Asumav of the optical intensities Asum(k, J) of the spots focused by the Fourier transform optical system 61. The calculation of Asumav is performed in accordance with the following Expression (10):

$$A\text{sum}av=\{A\text{sum}(1,1)+A\text{sum}(1,2)+ \quad . \quad . \quad . \quad + \\ A\text{sum}(k,J)+ \ldots +A\text{sum}(64,256)\}/(64\times256) \qquad (10)$$

After steps S62, S63, and S64, the laser processing control section 80 calculates the average of the optical intensities of the focused spots in a case where all the mirrors of the MMD 50 are used.

In step S65, the laser processing control section 80 calculates a reference optical intensity As in accordance with the following Expression (11).

$$As=A\text{sum}av/(Nc-1) \qquad (11)$$

Nc is the number of coherence cells. Let mmax be the maximum of m in the expression of the coherence cells C(m, n) and nmax be the maximum of n therein, and Nc=mmax·nmax is achieved. In the present example, mmax=16 and nmax=4, so that Nc=16×4=64. As calculated in step S65 in this example is therefore calculated as follows: As=Asumav/63.

In step S66, the laser processing control section 80 selects one mirror to be turned off from the mirrors in each of the coherence cells in such a way that the optical intensity Asum(k, J) of each of the focused spots focused by the Fourier transform optical system 61 approaches the reference optical intensity As. That is, the laser processing control section 80 selects an OFF mirror from the mirrors in any of the coherence cells in such a way that the optical intensity of each of the focused spots approaches the reference optical intensity As.

After step S66, the laser processing control section 80 returns to the main routine in FIG. 20.

The flowchart shown in FIG. 21 shows an example of the procedure for causing the fluence of each of the focused spots to approach the reference optical intensity As, but not necessarily, and the mirrors of the MMD 50 only need to be so controlled based on data on the beam profile that the optical intensity of each of the focused spots fall within a predetermined range.

4.3.3 Subroutine in Step S14B

Figure 22:
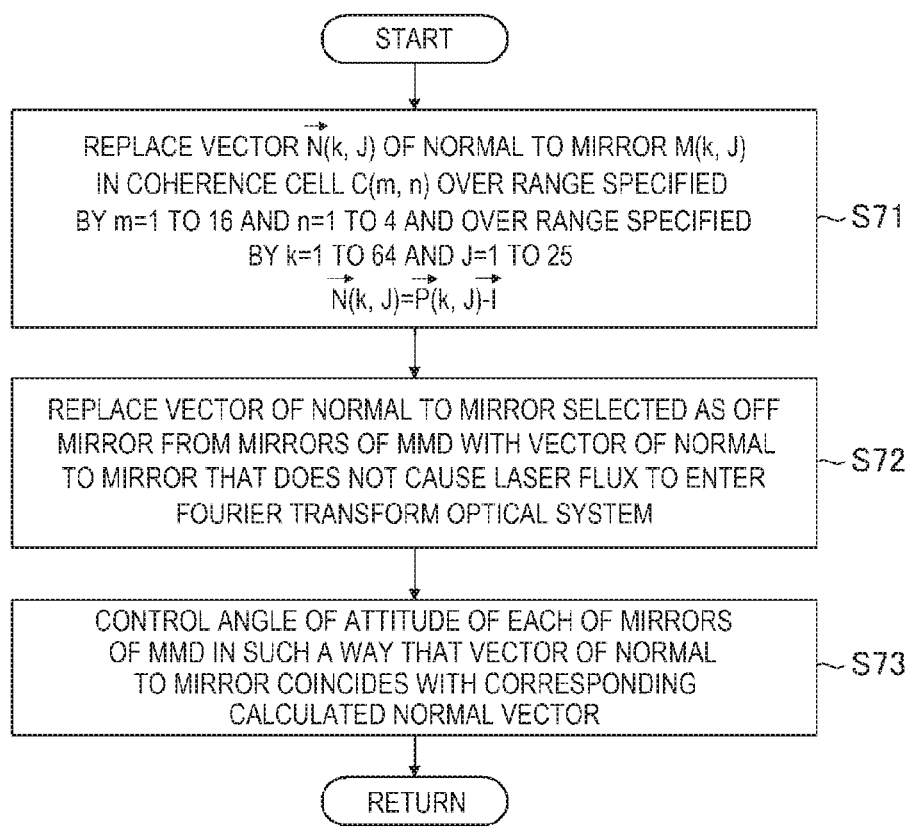
FIG. 22 is a flowchart showing the processing content in step S14B in FIG. 20.

FIG. 22 is a flowchart showing the processing content in step S14B in FIG. 20. In step S71 in FIG. 22, the laser processing control section 80 replaces the vector N(k, J) of a normal to the mirror M(k, J) in the coherence cell C(m, n) over the range specified by m=1 to 16 and n=1 to 4 and over the range specified by k=1 to 64 and J=1 to 256.

In step S72, the laser processing control section 80 replaces in accordance with Expression (3) the vector of a normal to each of the mirrors selected as an OFF mirror from the mirrors of the MMD 50 with a vector of a normal to a mirror that does not cause the laser flux to enter the Fourier transform optical system 61.

In step S73, the laser processing control section 80 controls the angle of the attitude of each of the mirrors of the MMD 50 in such a way that the vector of a normal to the mirror coincides with the corresponding calculated normal vector.

After step S73, the laser processing control section 80 returns to the main routine in FIG. 20.

4.3.4 Subroutine in Step S15A

Figure 23:
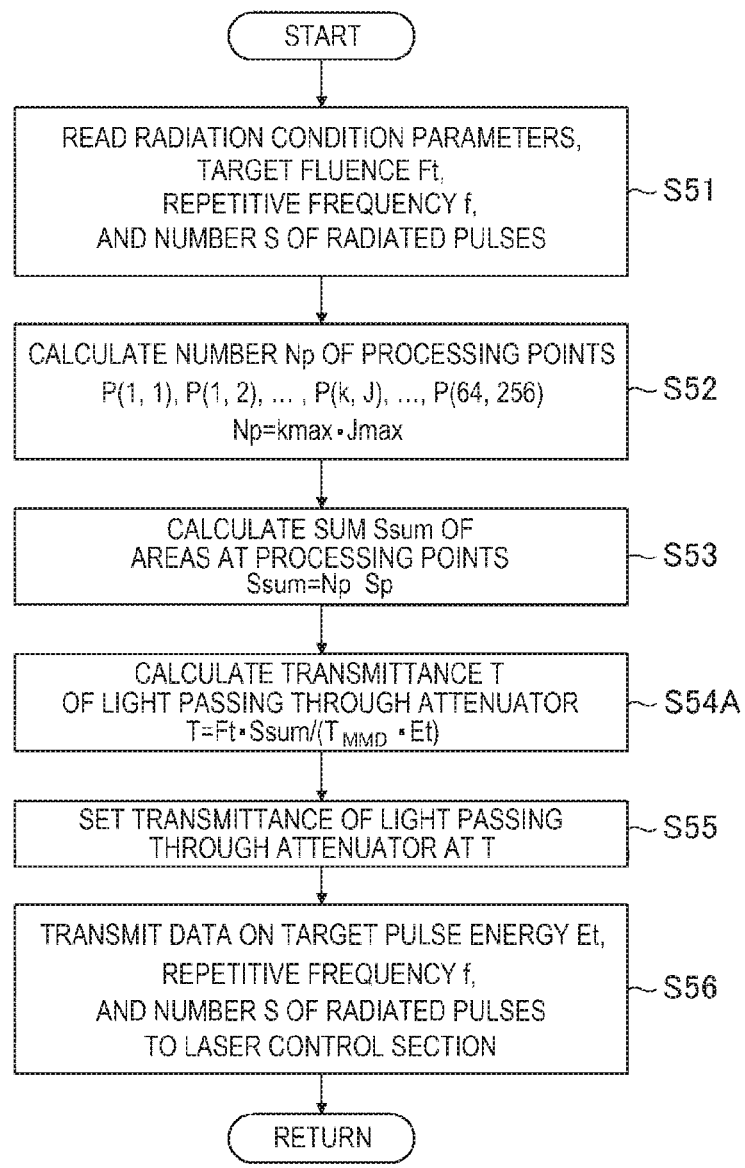
FIG. 23 is a flowchart showing the processing content in step S15A in FIG. 20.

FIG. 23 is a flowchart showing the processing content in step S15A in FIG. 20. In FIG. 23, the same steps as those in the flowchart shown in FIG. 17 have the same step numbers and will not be described. Differences from the flowchart shown in FIG. 17 will be described.

In place of step S54 in FIG. 17, the flowchart shown in FIG. 23 includes step S54A.

In step S54A, the laser processing control section 80 calculates the transmittance T of the light flux passing through the attenuator 40 in accordance with the following Expression (12):

$$T = Ft \cdot S\text{sum} / (T\text{MMD} \cdot Et) \quad (12)$$

TMMD in Expression (12) is the proportion of mirrors used as the ON mirrors in the MMD 50. In this example, since the mirrors in one coherence cell are turned off in step S65 in FIG. 21, $$T\text{MMD} = (Nc - 1)/Nc$$

is achieved. Specifically, since Nc=64 in the present embodiment, $$T\text{MMD} = (64 - 1)/64 = 0.984$$

is achieved.

In the example shown in FIG. 23, the calculation of the transmittance has been performed on the assumption that the transmittance of the laser flux along the optical path from the attenuator 40 of the laser processing apparatus 14 to the processing receiving material 16 is 100%, but not necessarily. For example, in a case where the transmittance Tp along the optical path from the attenuator 40 to the processing receiving material 16 has been measured in advance, the transmittance Tp may be taken into consideration in the calculation of the transmittance T of the light passing through the attenuator 40, as shown by the following expression (13):

$$T = Ft \cdot S\text{sum} / (T\text{MMD} \cdot Tp \cdot Et) \quad (13)$$

4.4 Effects and Advantages

According to the second embodiment, the optical intensity distribution of the laser beam incident on the MMD 50 is measured, and the angle of the attitude of each of the mirrors is controlled based on the result of the measurement, whereby the processing receiving material 16 is irradiated with spots having uniform optical intensity.

Figure 24:
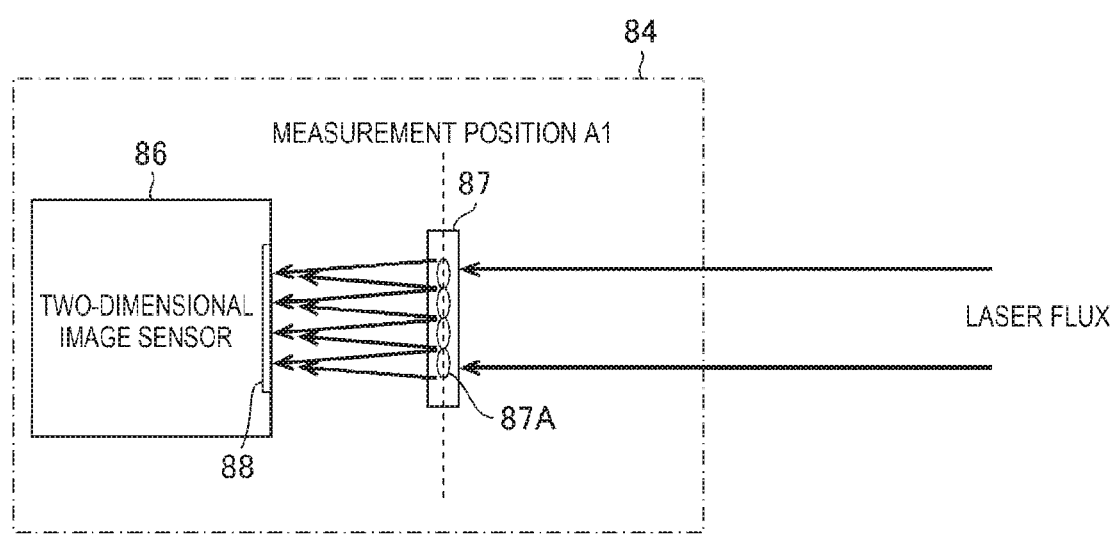
FIG. 24 schematically shows a wavefront sensor that is an example of the beam characteristic measurer.

4.5 Case where Beam Characteristic Measurer is Wavefront Sensor 4.5.1 Configuration FIG. 24 schematically shows a wavefront sensor that is an example of the beam characteristic measurer. The beam characteristic measurer 84 may be a wavefront sensor, what is called a Shack-Hartmann interferometer. The wavefront sensor includes a microlens array 87 and the two-dimensional image sensor 86. The two-dimensional image sensor 86 may be a CCD sensitive to the laser beam. The microlens array 87 is, for example, an array of microlenses 87A each having a diameter of about 1 mm. The microlens array 87 is disposed in the measurement position A1.

The measurement position A1 is so determined that the optical path length between the beam splitter 81 and the MMD 50 coincides with the optical path length from the beam splitter 81 to the measurement position A1 via the high-reflectance mirror 36 in FIG. 18.

The relationship between an effective region Sm of the MMD 50 and an effective region Aw of the wavefront sensor preferably satisfies Sm≤Sw.

4.5.2 Operation

Using the wavefront sensor allows the following measurement.

In general, the traveling direction of a laser beam outputted from an excimer laser apparatus varies in accordance with the position in a cross section of the laser beam. The wavefront sensor can measure not only the intensity distribution of the laser beam but the traveling direction in each position in a cross section of the laser beam.

The laser processing control section 80 is configured to cause the wavefront sensor to measure the traveling direction of the laser flux in each position in a cross section of the laser beam incident on the MMD 50.

The laser processing control section 80 is configured to control the angle of the attitude of each of the mirrors in accordance with the angle of incident of the laser flux incident on the mirror based on the traveling direction of the laser flux in each position in a cross section of the laser flux.

4.5.3 Main Routine

Figure 25:
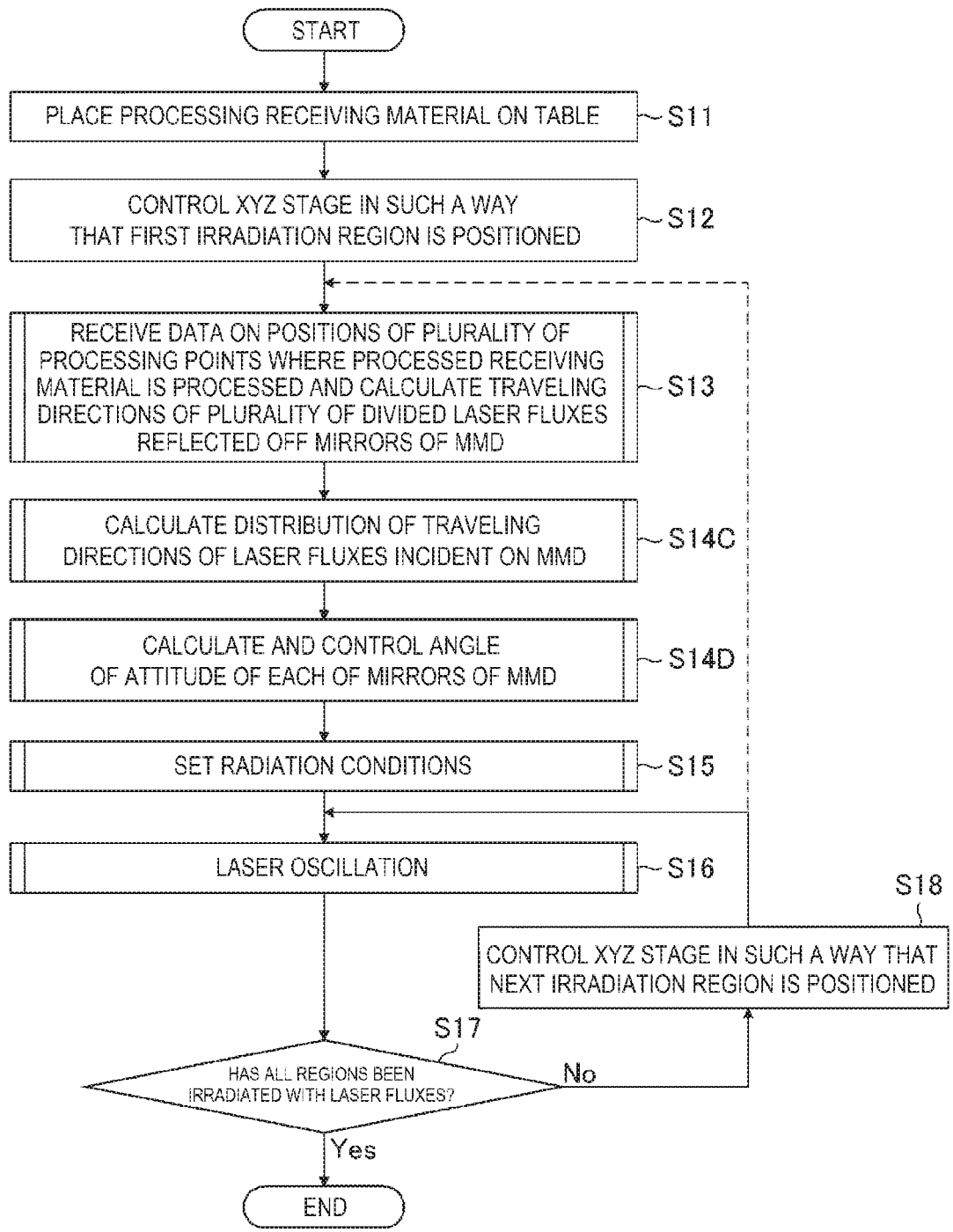
FIG. 25 is a flowchart showing a main routine in an example of the control in the case where the beam characteristic measurer is a wavefront sensor.

FIG. 25 is a flowchart showing a main routine in an example of the control in the case where the beam characteristic measurer is a wavefront sensor. In FIG. 25, the same steps as those in the flowchart shown in FIG. 14 have the same step numbers and will not be described. Differences from the flowchart shown in FIG. 14 will be described.

In place of step S14 in FIG. 14, the flowchart shown in FIG. 25 includes steps S14C and S14D.

In step S14C, the laser processing control section 80 measures the distribution of the traveling direction of the laser flux incident on the MMD 50. The laser processing control section 80 causes the wavefront sensor to measure the traveling direction of the laser flux in the position of each of the mirrors of the MMD 50.

In step S14D, the laser processing control section 80 calculates the angle of the attitude of each of the mirrors of the MMD 50 and controls the angle of the attitude of the mirror. That is, the processes in steps S13, S14C, and S14D allow calculation of the angle of the attitude of each of the mirrors of the MMD 50 based on the data on the positions of the plurality of processing points and control of the angle of the attitude of each of the mirrors of the MMD 50 based on the result of the calculation.

A subroutine in step S14C will be described later with reference to FIG. 26. A subroutine in step S14D will be described later with reference to FIG. 27.

In the flowchart shown in FIG. 25, in the present example, the wavefront sensor measures the traveling direction of the laser flux incident on the MMD 50, and the angle of the laser flux incident on each of the mirrors of the MMD 50 is corrected, but not necessarily. For example, the wavefront sensor may measure the optical intensity distribution of the laser flux incident on each of the mirrors of the MMD 50 based on the optical intensities of the plurality of focused spots, and mirrors of the MMD 50 may be selected and the angle of the attitude of each of the selected mirrors is controlled based on the result of the measurement in such a way that the optical intensities of the spots focused by the MMD 50 are more uniform, as shown in FIGS. 21 and 22.

4.5.4 Subroutine in Step S14C

Figure 26:
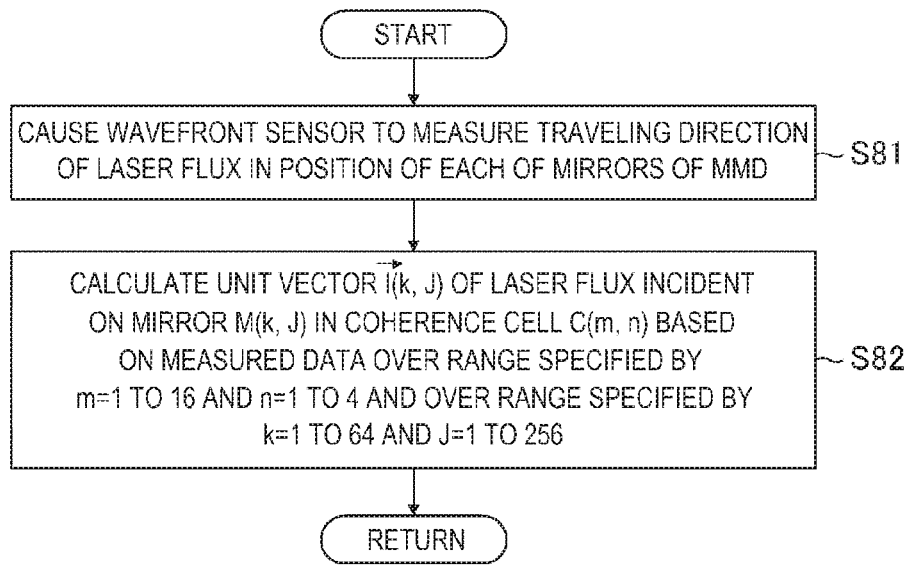
FIG. 26 is a flowchart showing the processing content in step S14C in FIG. 25.

FIG. 26 is a flowchart showing the processing content in step S14C in FIG. 25. In step S81 in FIG. 26, the laser processing control section 80 causes the wavefront sensor to measure the traveling direction of the laser flux in the position of each of the mirrors of the MMD 50. The traveling direction of the laser flux in the position of each of the mirrors of the MMD 50 can be measured by using the wavefront sensor. Since the wavefront sensor does not have resolution smaller than the interval between the microarray lenses, the traveling directions of the laser fluxes incident on one microlens may be so calculated that the laser fluxes have the same traveling direction or may be determined by interpolation of the traveling directions at points close to the microlens where the traveling direction is measured.

In step S82, the laser processing control section 80 calculates a unit vector I(k, J) of the laser flux incident on the mirror M(k, J) in the coherence cell C(m, n) based on the data measured by using the wavefront sensor over the range specified by m=1 to 16 and n=1 to 4. The laser processing control section 80 calculates the unit vector I(k, J) over the range specified by k=1 to 64 and J=1 to 256.

After step S82, the laser processing control section 80 returns to the main routine in FIG. 25.

4.5.5 Subroutine in Step S14D

Figure 27:
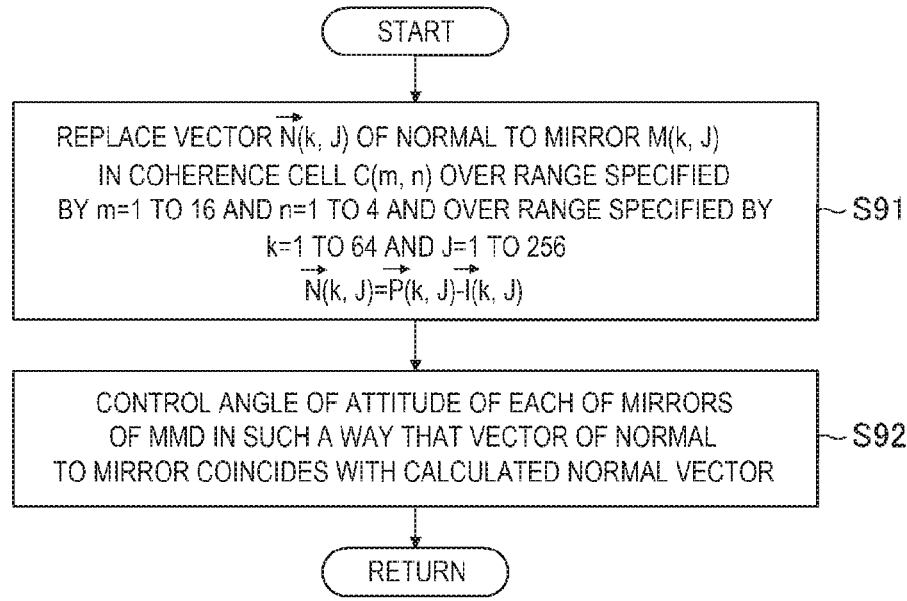
FIG. 27 is a flowchart showing the processing content in step S14D in FIG. 25.

FIG. 27 is a flowchart showing the processing content in step S14D in FIG. 25. In step S91 in FIG. 27, the laser processing control section 80 replaces the vector N(k, J) of a normal to the mirror M(k, J) in the coherence cell C(m, n) over the range specified by m=1 to 16 and n=1 to 4 in accordance with Expression (4). The laser processing control section 80 replaces the vector N(k, J) of a normal to the mirror M(k, J) with [P(k, J)]−[I(k, J)] over the range specified by k=1 to 64 and J=1 to 256.

In step S92, the laser processing control section 80 controls the angle of the attitude of each of the mirrors of the MMD 50 in such a way that the vector of the normal to the mirror coincides with the corresponding calculated normal vector.

After step S82, the laser processing control section 80 returns to the main routine in FIG. 25.

4.5.6 Effects and Advantages

The traveling direction of the laser flux in a position in a cross section of the laser beam incident on the MMD 50 is measured by using the wavefront sensor, and the angle of the attitude of each of the mirrors is controlled based on the result of the measurement, whereby the processing receiving material 16 is irradiated with spots having uniform optical intensity, and the laser beam superposition precision at each focused spot is improved.

Further, the characteristics of the laser beam incident on the MMD 50 can change in accordance with the conditions under which the laser apparatus 12 and the laser processing apparatus 14 are operated. Measuring the characteristics of the laser beam with the wavefront sensor and controlling the angle of the attitude of each of the mirrors of the MMD 50 in accordance with a change in the characteristics of the laser beam allow the position of each focused spot and the laser beam superposition can be precisely maintained.

5. Third Embodiment

5.1 Configuration

Figure 28:
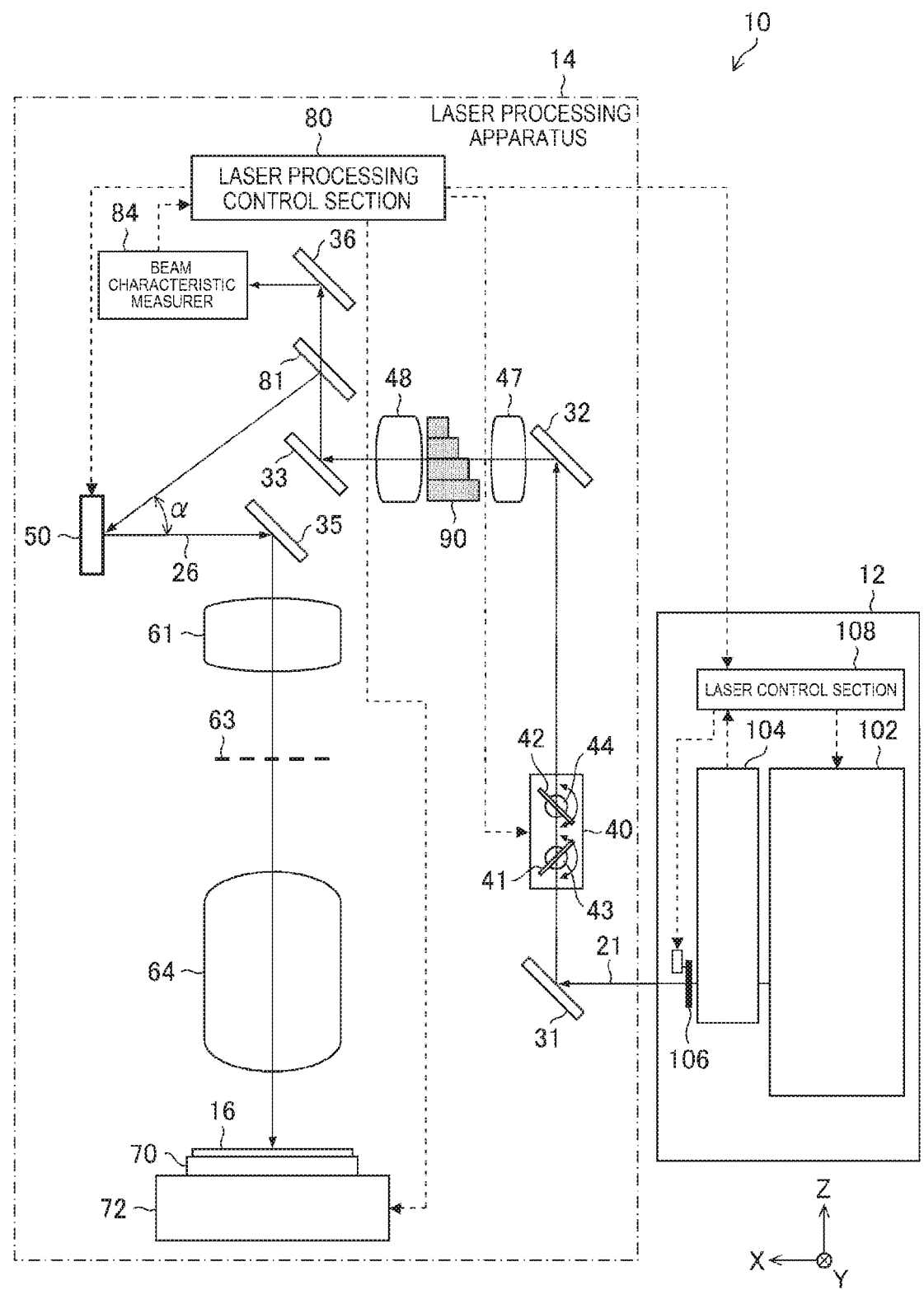
FIG. 28 schematically shows the configuration of a laser processing system according to a third embodiment.

FIG. 28 schematically shows the configuration of a laser processing system according to a third embodiment. Differences from the second embodiment shown in FIG. 18 will be described below. In the laser processing system 10 according to the third embodiment shown in FIG. 28, a low-coherence optical system 90 is disposed between the beam shaping optical system 47 and the beam collimator optical system 48. The low-coherence optical system 90 is an optical element configured to spatially produce an optical path difference greater than or equal to a temporal coherence length between laser fluxes in different positions in a laser beam. The low-coherence optical system 90 may be formed, for example, of a stepped prism (hereinafter referred to as "staircase prism").

A free-running excimer laser has a short temporal coherence length $\Delta Lt$. The term "free running" refers to broadband oscillation without linewidth narrowing using a linewidth narrowing module, such as a wavelength selecting element.

The temporal coherence length $\Delta Lt$ is expressed by the following Expression (14):

$$\Delta Lt = \lambda^2/\Delta\lambda \quad (14)$$

$\Delta\lambda$ in Expression (14) represents the spectral linewidth.

For example, in the case of a KrF excimer laser, assuming that the wavelength $\lambda$ is 248.4 nm and the spectral linewidth $\Delta\lambda$ is 0.30 nm, the temporal coherence length $\Delta Lt$ is derived from Expression (14) described above, $\Delta Lt=0.2$ mm.

Figure 29:
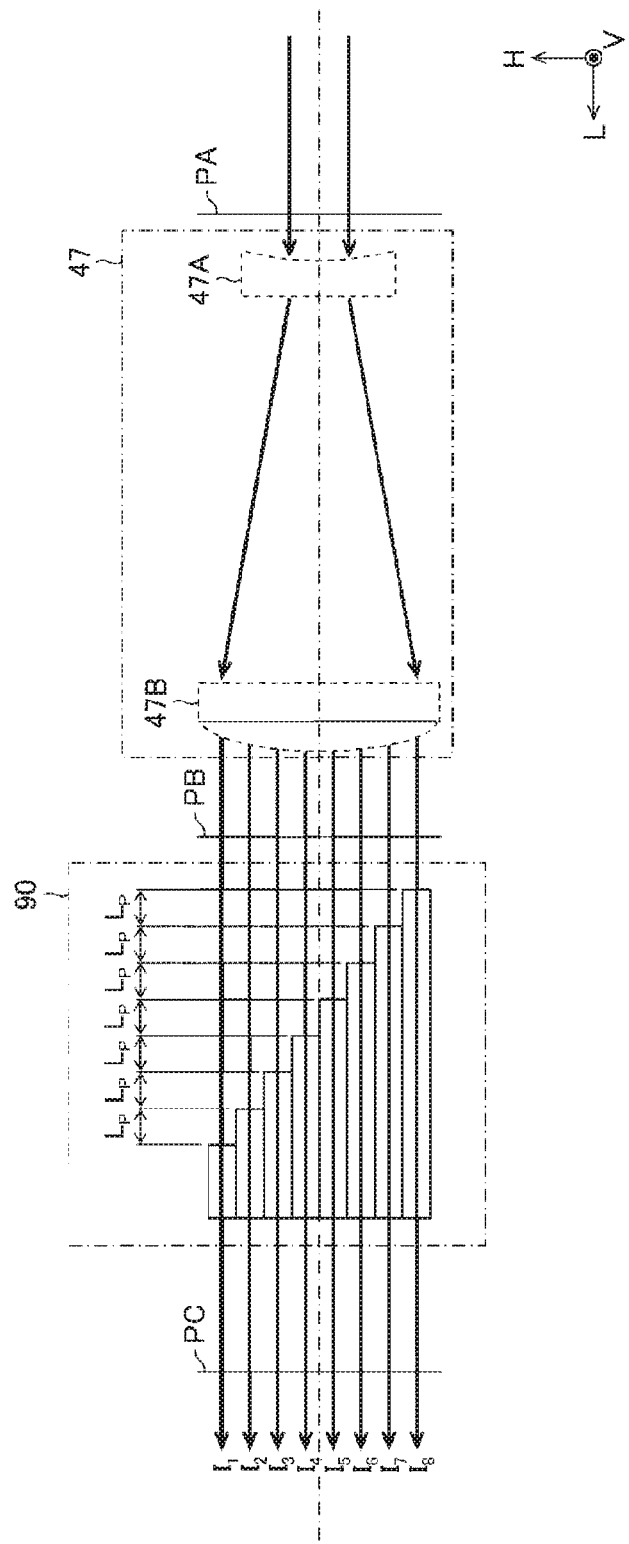
FIG. 29 shows an example in which a staircase prism is employed as a low-coherence optical system.

FIG. 29 shows an example in which a staircase prism is employed as the low-coherence optical system 90. The staircase prism that is an example of the low-coherence optical system 90 can be formed, for example, of the laminate of a plurality of plates made of $CaF_2$ crystal.

The staircase prism is formed with the lengths of the steps of the staircase prism different from each other by Lp, as shown in FIG. 29, so that the relationship between the optical path difference $\Delta L$ between adjacent beams out of the laser fluxes $I_1$ to $I_8$ and the temporal coherence length $\Delta Lt$ in each position in the laser beam is $\Delta Lt \leq \Delta L$.

Assuming that the refractive index n of $CaF_2$ crystal is 1.468 at the wavelength of 248.4 nm, the optical path difference $\Delta L$ between adjacent beams out of the laser fluxes $I_1$ to $I_8$ is as follows: $\Delta L=(1.468−1)Lp$. To achieve $\Delta Lt \leq \Delta L$, where $\Delta Lt$ is the temporal coherence length, it is necessary to satisfy the following Expression (15)

$$\Delta Lt = 0.2 \leq (1.468−1)Lp \quad (15)$$

That is, $Lp \geq 0.427$ mm.

Therefore, for example, forming a staircase prism with Lp=0.5 mm makes it difficult for the laser fluxes $I_1$ to $I_8$ from interfering with each other.

The beam shaping optical system 47 is formed, for example, of a cylindrical concave lens 47A and a cylindrical convex lens 47B.

5.2 Operation

Figure 30:
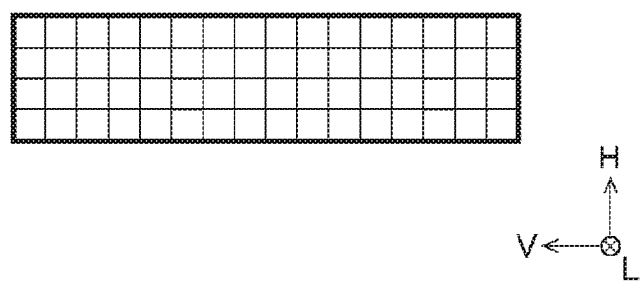
FIG. 30 shows the coherence cells before beam shaping shown in FIG. 29.
Figure 31:
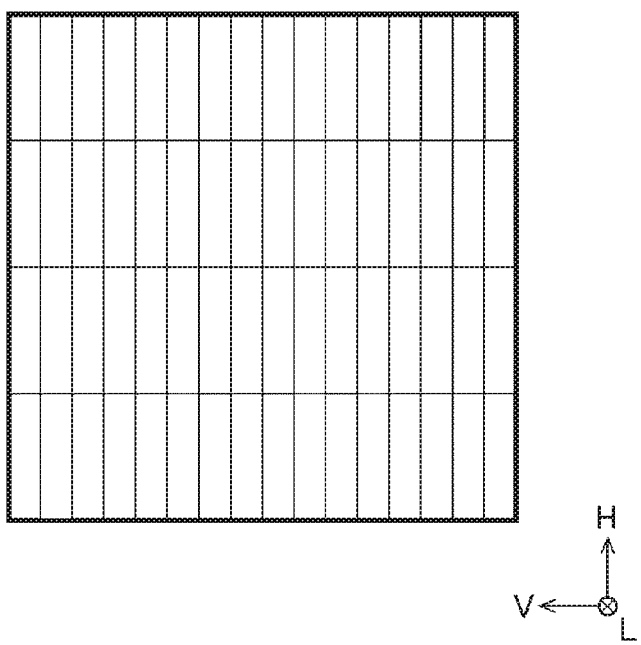
FIG. 31 shows the coherence cells after the beam shaping shown in FIG. 29.
Figure 32:
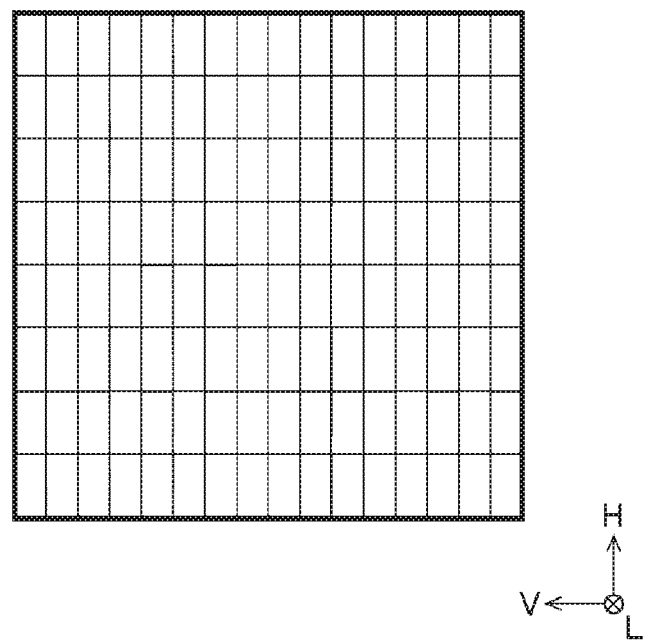
FIG. 32 shows the coherence cells after the coherence of the laser beam is lowered by using the low-coherence optical system shown in FIG. 29.

FIGS. 30, 31, and 32 show the coherence cells of the laser beam in positions PA, PB, and PC shown in FIG. 29. FIG. 30 shows the coherence cells before the beam shaping. FIG. 31 shows the coherence cells after the beam shaping. FIG. 32 shows the coherence cells after low coherence is achieved by using the low-coherence optical system.

The laser beam before the beam shaping has an oblong beam shape, as shown in FIG. 30. The oblong laser beam is so expanded by the beam shaping optical system 47 as to have a substantially square beam shape (see FIG. 31). In this process, the number of coherence cells of 4×16=64 is maintained, resulting in a beam elongated in the direction H.

The laser beam expanded by the beam shaping optical system 47 passes through the staircase prism, which lowers the coherence of the laser beam. That is, since the optical path difference ΔL between adjacent beams of the laser fluxes $I_1$ to $I_8$ is so set as to be greater than the temporal coherence length ΔLt, the number of coherence cells increases in the direction H. In this example, the number of coherence cells increases from 4×16=64 to 8×16=128. The number of coherence cells incident on the MMD 50 therefore also increases.

The beam shaping optical system 47, the low-coherence optical system 90, and the beam collimator optical system 48 are an example of the "first optical system."

5.3 Effects and Advantages

According to the third embodiment, the stair case prism can be used to increase the number of coherence cells by producing an optical path difference greater than the temporal coherence length in each position in the laser beam.

According to the third embodiment, using the low-coherence optical system 90 increases the number of coherence cells, whereby the number of beams to be focused into a single spot can be increased, and the uniformity of the optical intensities of the focused spots is therefore improved.

5.4 Example 3 of Other Forms

The staircase prism in the present example has an optical path difference only in the direction H to achieve low coherence in the direction H, but not necessarily. For example, optical path differences in temporal coherence length both in the directions V and H are combined with each other. Further, the number of coherence cells may be increased.

5.5 Example 4 of Other Forms

In the third embodiment, a transmissive staircase prism has been presented by way of example. Instead, an optical path difference may be spatially provided by coating the light-incident-side surface of each of the steps with a high-reflectance film and causing light incident on the steps to be reflected off the high-reflectance films. In this case, Lp≥ΔLt may be achieved.

5.6 Example 5 of Other Forms

In the third embodiment, the case where a plurality of plates made of $CaF_2$ crystal are superimposed on each other is presented by way of example, but not necessarily, and a $CaF_2$ crystal block may be directly processed to produce a staircase prism. The staircase prism may be made of synthetic quartz that transmits ultraviolet laser light.

6. Description of how to Achieve Low Coherence by Adjustment of Angle of Incidence of Laser Beam Incident on MMD The third embodiment has been described with reference to the case where the low-coherence optical system 90 is used. In place of or in addition to the employment of the low-coherence optical system 90, low coherence can be achieved by adjusting the angle of incidence of the laser beam incident on the MMD.

Figure 33:
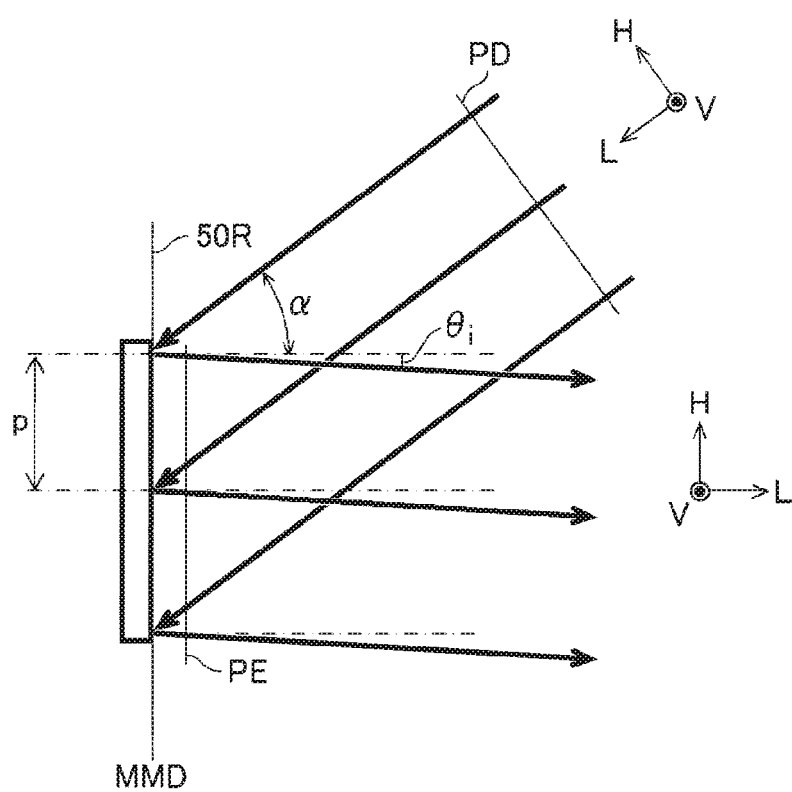
FIG. 33 is a diagrammatic view of the laser beam incident on the MMD and the laser beam reflected off the MMD.
Figure 34:
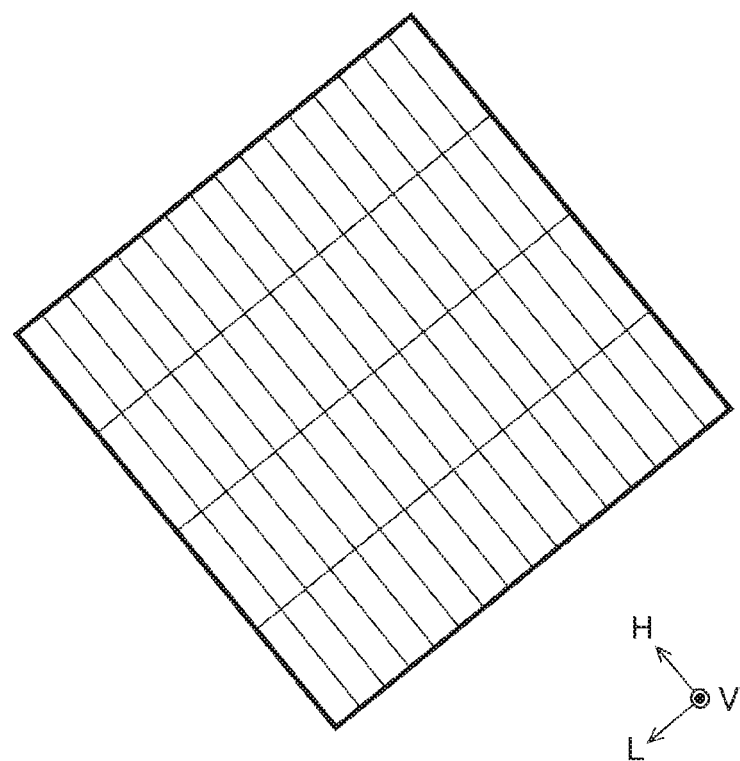
FIG. 34 shows the coherence cells of the laser beam incident on the MMD.

FIG. 33 is a diagrammatic view of the laser beam incident on the MMD and the laser beam reflected off the MMD. In FIG. 33, the reflection surface of each of the mirrors of the MMD coincides with the reference reflection surface 50R of the MMD for convenience of description, but, in practice, the mirrors are controlled to have attitude angles according to the data on the positions of the processing points. FIG. 34 shows the coherence cells of the laser beam incident on the MMD. FIG. 34 shows the coherence cells of the laser beam in a position PD shown in FIG. 33.

Figure 35:
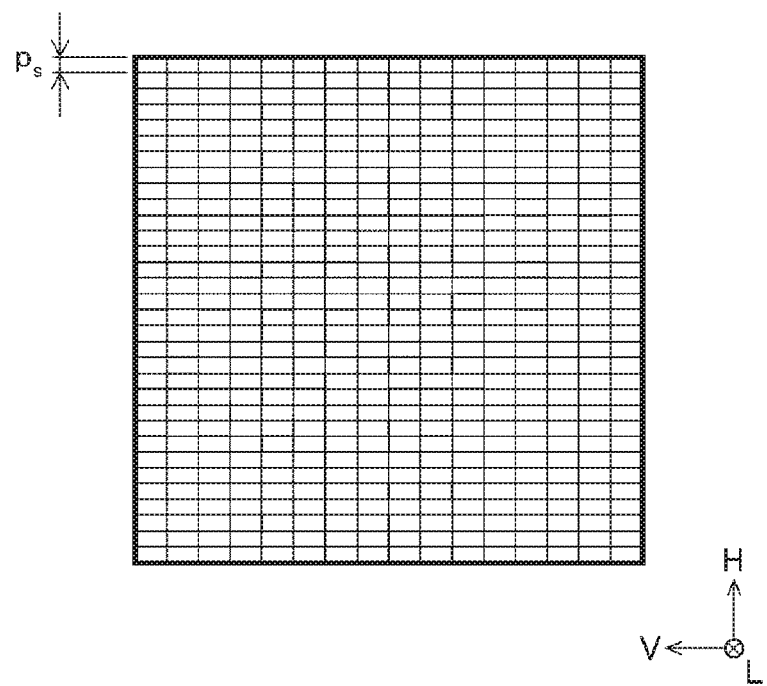
FIG. 35 shows the coherence cells of the laser beam reflected off the MMD.

FIG. 35 shows the coherence cells of the laser beam reflected off the MMD. FIG. 35 shows the coherence cells of the laser beam in a position PE shown in FIG. 33.

Let α be the angle of incidence of the laser beam incident on the MMD and θi be the angle of reflection of the laser beam reflected off the MMD, and an optical path difference occurs between light rays reflected off the reference reflection surface 50R of the MMD and traveling in a direction that is not the peculiar reflection direction, as shown in FIG. 33.

$$\Delta Lg = p_s(\sin \alpha - \sin \theta_i) \quad (16)$$

where $p_s$ represents an interval p that causes the optical path length to be equal to the temporal coherence length ΔLg.

When the temporal coherence length of the laser beam is ΔLt, and when ΔLt≤ΔLg, the reflected light has low coherency.

For example, since the temporal coherent length ΔLt of the laser beam from a free-running KrF excimer laser is 0.2 mm, setting α at 23.5° and the central angle of reflection $\theta_0$ at 0° allows the following relationship to be derived from the Expression (16):

$$0.2 \leq p_s(\sin 23.5° - \sin 0°)$$

$p_s$=0.5 (mm)

That is, the interval $p_s$ necessary for achievement of low coherency using the temporal coherency resulting from the optical path difference can be 0.5 mm.

As described above, adjusting the angle of the laser beam incident on the MMD allows low coherency of the laser beam reflected off the MMD.

In this process, an LH plane of the laser beam incident on the MMD preferably coincides with a plane containing the laser beam incident on the MMD and the central reflected laser beam, as shown in FIG. 33.

For example, when the size of the effective region of the MMD where the plurality of mirrors are arranged is 16×16 mm, the number of direction-H coherence cells of the laser beam reflected off the MMD is 16 mm/0.5 mm=32 (see FIG. 35).

Comparison between FIGS. 34 and 35 clearly shows that 4×16=64 coherence cells of the laser beam incident on the MMD increases to 32×16=512 coherence cells of the laser beam reflected off the MMD.

As described above, adjusting the angle α of the laser beam incident on the MMD allows an increase in the number of coherence cells.

The laser beam outputted from an excimer laser apparatus is a rectangular beam, and the spatial coherency in the direction of the minor axis (direction H) is higher than that in the other direction, as shown in FIG. 34. Adjusting the angle of incidence of the laser beam incident on the MMD allows an increase in the number of coherence cells in the direction H (see FIG. 35).

When the configuration in which an optical path difference greater than or equal to the temporal coherence length is spatially created is employed, as in the third embodiment, the laser apparatus 12 may not necessarily be an excimer laser having low spatial coherence. For example, a solid-state laser apparatus having high spatial coherency may be used. For example, a wide-spectral-linewidth laser apparatus including a fiber amplifier, a titanium sapphire crystal, and a nonlinear crystal may be used.

7. Fourth Embodiment

7.1 Configuration

Figure 36:
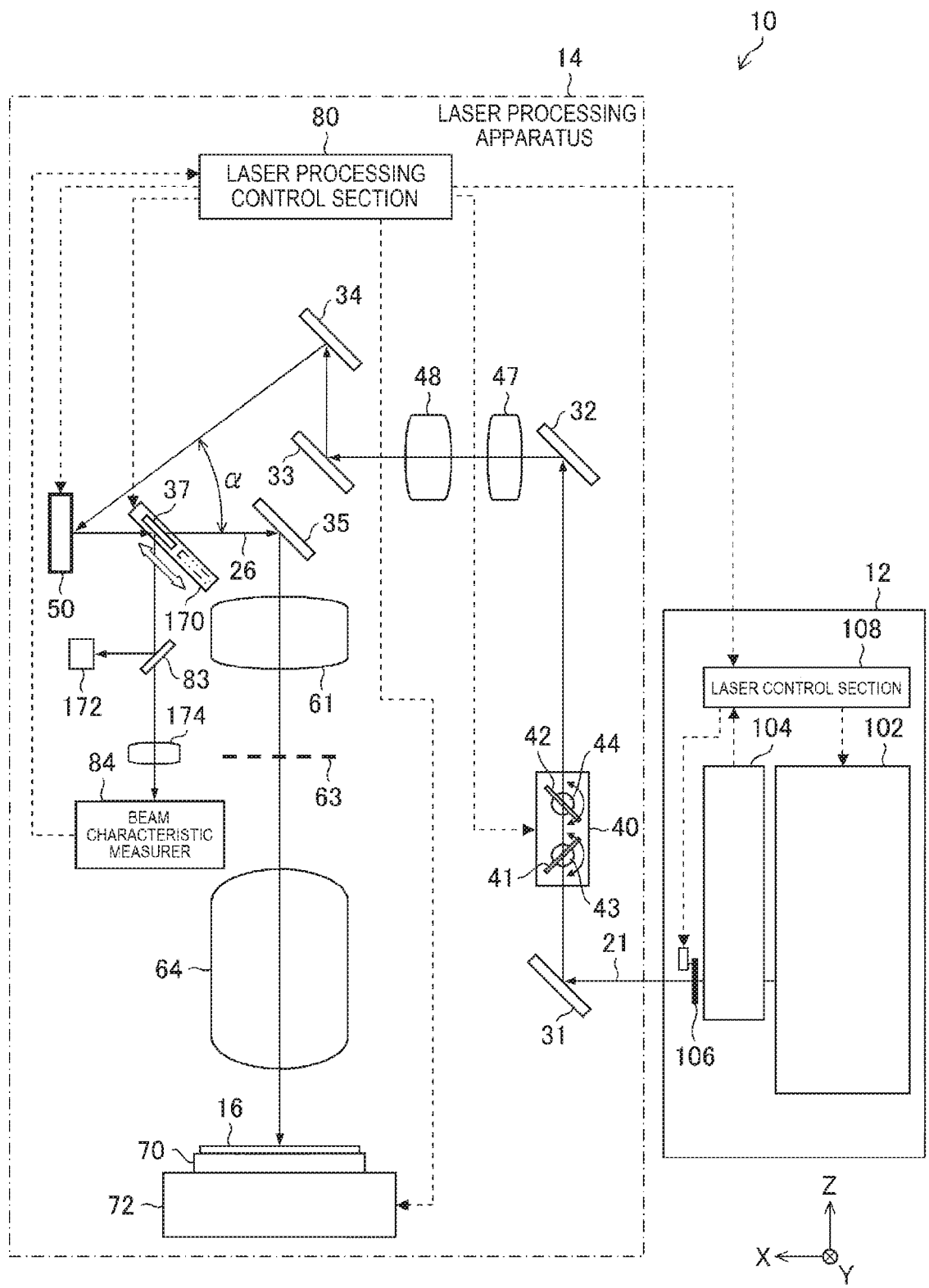
FIG. 36 schematically shows the configuration of a laser processing system according to a fourth embodiment.

FIG. 36 schematically shows the configuration of a laser processing system according to a fourth embodiment. In the fourth embodiment, the configuration described in the second embodiment is replaced with a form in which the beam characteristic measurer 84 is so disposed as to measure the light beam reflected off the MMD 50. Differences from the first embodiment will be described below.

The laser processing system 10 according to the fourth embodiment includes a high-reflectance mirror 37, a uniaxial stage 170, a beam splitter 83, a damper 172, a beam collimator optical system 174, and the beam characteristic measurer 84.

The high-reflectance mirror 37 is disposed in the optical path between the MMD 50 and the high-reflectance mirror 35. The high-reflectance mirror 37 is disposed in the uniaxial stage 170 via a holder that is not shown. The uniaxial stage 170 is a movable stage configured to be capable of moving the high-reflectance mirror 37 in one axial direction. The high-reflectance mirror 37 is configured to be movable as required to a position in the optical path between the MMD 50 and the high-reflectance mirror 35 and to a position shifted from the optical path.

The high-reflectance mirror 37 is so disposed as to cause the laser flux reflected off the high-reflectance mirror 37 to enter the beam characteristic measurer 84 via the beam splitter 83 and the beam collimator optical system 174.

The beam splitter 83 is so disposed as to cause the laser flux reflected off the beam splitter 83 to enter the damper 172.

The beam collimator optical system 174 is a conjugate optical system and is configured to transfer and focus an image of the MMD 50 onto the measurement surface of the beam characteristic measurer 84.

The beam characteristic measurer 84 may be a beam profiler, such as that described with reference to FIG. 19, or a wavefront sensor, such as that described with reference to FIG. 25.

7.2 Operation

The laser processing control section 80 is configured to measure the beam characteristics of the laser flux reflected off the MMD 50 for a period for which the processing receiving material 16 is not irradiated with the laser flux.

To measure the beam characteristics, the laser processing control section 80 is configured to control the angle of the attitude of each of the mirrors of the MMD 50 in such a way that the laser flux is reflected off the mirror at an angle of reflection θ=0°.

The laser processing control section 80 is configured to control the uniaxial stage 170 in such a way that the high-reflectance mirror 37 is disposed in the optical path between the MMD 50 and the high-reflectance mirror 35.

The laser processing control section 80 is configured to transmit the oscillation instruction to the laser apparatus 12. The laser apparatus 12 is configured to output the pulsed laser flux 21 in accordance with the oscillation instruction.

The laser flux reflected off the MMD 50 travels via the high-reflectance mirror 37, the beam splitter 83, and the beam collimator optical system 174 and enters the beam characteristic measurer 84.

The laser processing control section 80 is configured to perform calculative processing on data measured with the beam characteristic measurer 84 and store the processed data.

The laser processing control section 80 is configured to control the uniaxial stage 170 in such a way that the high-reflectance mirror 37 moves out of the optical path between the MMD 50 and the high-reflectance mirror 35.

The laser processing control section 80 is configured to control the angle of the attitude of each of the mirrors of the MMD 50 based on the stored processed data in such a way that the laser fluxes are focused onto desired processing points and produce laser oscillation to process the processing receiving material 16.

7.3 Effects and Advantages

According to the fourth embodiment, the beam characteristics of the laser beam reflected off the MMD 50 can be measured, whereby the optical intensity of the laser beam including, for example, variation in reflectance of each of the mirrors of the MMD 50 can be corrected.

Further, since the wavefront of the laser beam in the case where the angle of each of the mirrors of the MMD 50 is so controlled that the mirror reflects the laser beam in the reference direction can be measured, whereby the angle of each of the mirrors of the MMD 50 can also be corrected.

7.4 Timing at which Beam Characteristics are Measured

An example of the period for which the processing receiving material 16 is not irradiated with the laser flux is a period for which the processing receiving material 16 is exchanged. Further, the laser processing may be regularly terminated, and the beam characteristics may be measured in accordance with the present embodiment.

8. Variations of Beam Shaping Optical System

8.1 Configuration Example 1 of Beam Shaping Optical System

Figure 37:
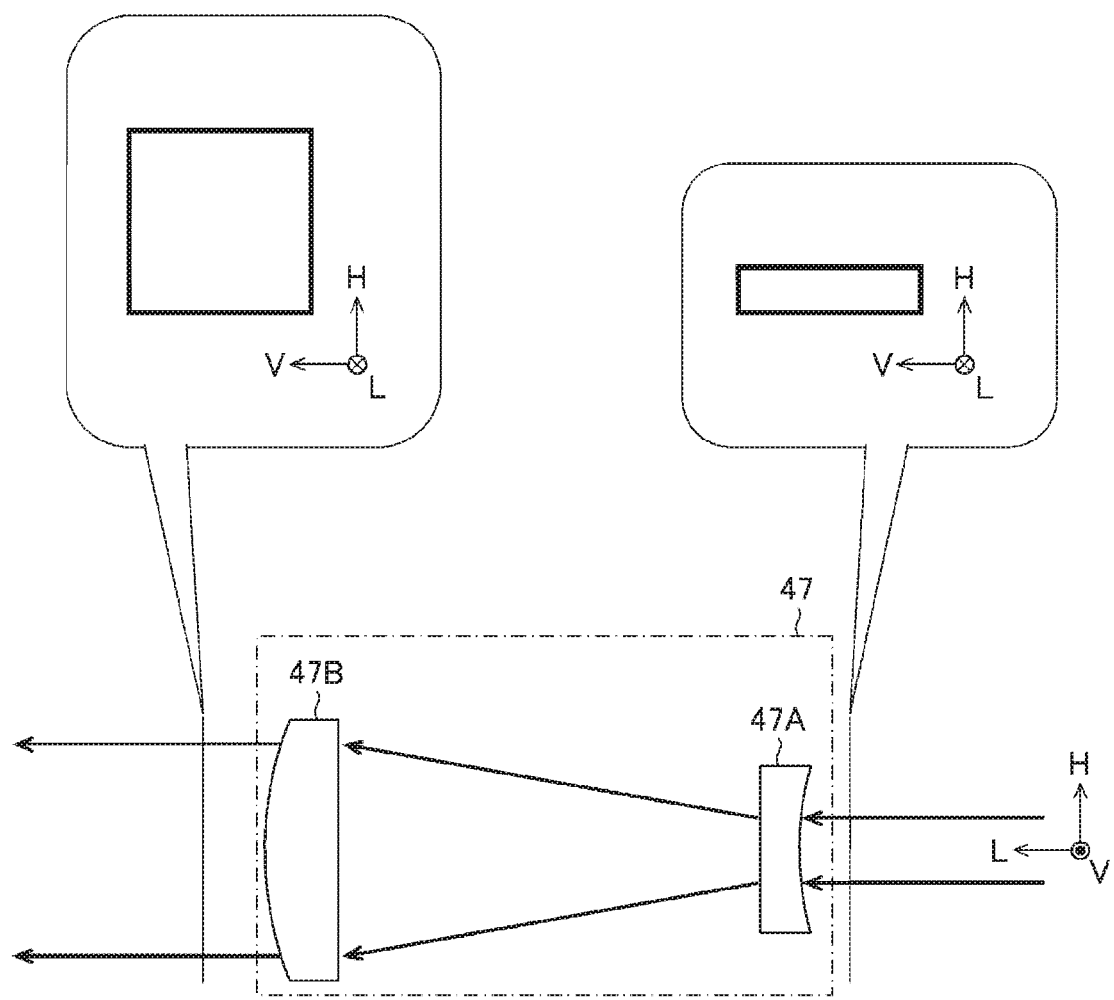
FIG. 37 is a diagrammatic view showing Example 1 of the configuration of a beam shaping optical system.

FIG. 37 is a diagrammatic view showing Configuration Example 1 of the beam shaping optical system. The beam shaping optical system 47 shown in FIG. 37 includes the cylindrical concave lens 47A and the cylindrical convex lens 47B. The two cylindrical lenses, the cylindrical concave lens 47A and the cylindrical convex lens 47B, are so disposed in the optical path of the laser flux that the laser beam having the oblong beam shape is converted into a laser beam having a substantially square beam shape, as shown in FIG. 37.

8.2 Configuration Example 2 of Beam Shaping Optical System

Figure 38:
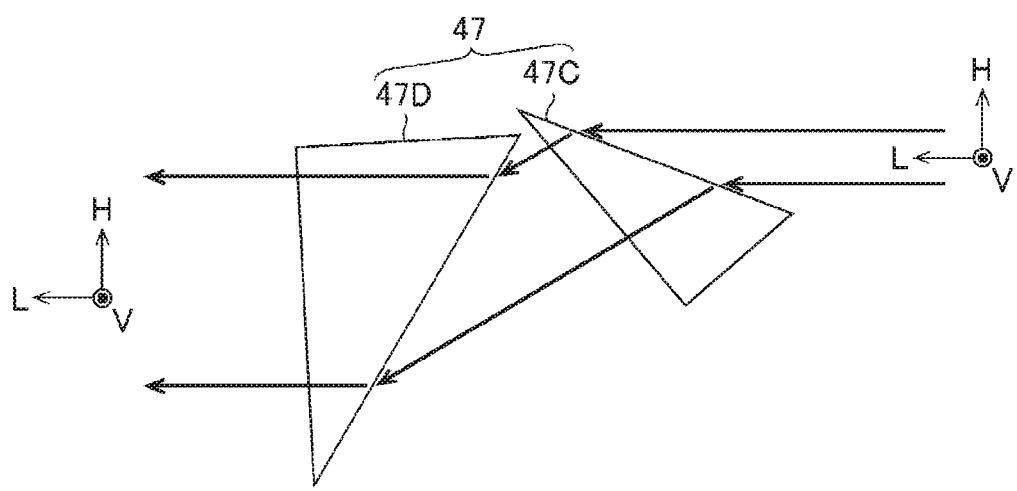
FIG. 38 is a diagrammatic view showing Example 2 of the configuration of the beam shaping optical system.

FIG. 38 is a diagrammatic view showing Configuration Example 2 of the beam shaping optical system. The beam shaping optical system 47 shown in FIG. 38 includes two prisms 47C and 47D. The two prisms 47C and 47D are so disposed in the optical path of the laser flux that the laser beam having the oblong beam shape is converted into a laser beam having a substantially square beam shape.

9. Example of Beam Collimator Optical System

9.1 Configuration

Figure 39:
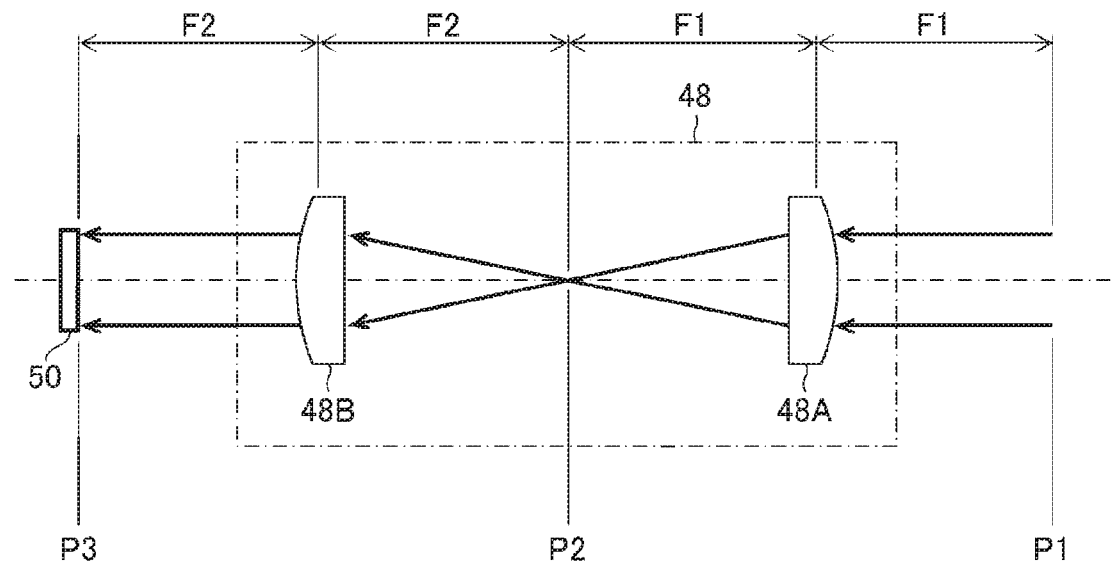
FIG. 39 is a diagrammatic view showing an example of the configuration of a beam collimator optical system.

FIG. 39 is a diagrammatic view showing an example of the configuration of the beam collimator optical system. The beam collimator optical system 48 is a conjugate optical system and includes, for example, a first convex lens 48A and a second convex lens 48B. The first convex lens 48A and the second convex lens 48B are made of a material that transmits an ultraviolet laser flux. Examples of the material that transmits an ultraviolet laser flux may include synthetic quartz and $CaF_2$ crystal. The focal length F1 of the first convex lens 48A and the focal length F2 of the second convex lens 48B may have the same value. In FIG. 39, the first convex lens 48A and the second convex lens 48B are lenses having the same focal length F. The distance between the first convex lens 48A and the second convex lens 48B is so set as to be twice the focal length F.

The MMD 50 is disposed in the back focal position of the second convex lens 48B.

9.2 Operation

The beam of the laser flux shaped by the beam shaping optical system 47 passes through a position P1 of the front focal point of the first convex lens 48A, which focuses the beam of the laser flux in a position P2 of the back focal point of the first convex lens 48A. The beam of the laser flux focused in the position P2 then spreads and is collimated by the second convex lens 48B.

In the beam collimator optical system 48 in the present example, the laser beam in the position P1, which is the position of the front focal point of the first convex lens 48A, is transferred to and focused in a position P3 of the back focal point of the second convex lens 48B at a magnification of 1:1. The beam of the laser flux transferred and focused at the magnification of 1:1 therefore has the same size, beam divergence, and other beam characteristics as those of the laser beam in the position P1 before and after the transfer, although the image formed in the position P3 is inverted.

The beam collimator optical system 174 described with reference to FIG. 36 can also employ the configuration shown in FIG. 39.

9.3 Examples of Other Configurations

<1> The example shown in FIG. 39 has been described with reference to the combination of two convex lenses, but not necessarily. For example, the combination of concave mirrors having the same focal length may be used.

<2> Two beam transfer elements each formed of the beam collimator optical system 48 shown in FIG. 39 may be disposed in series along the optical path to erect the transferred image.

<3> In the case where the low-coherence optical system 90 is disposed between the beam shaping optical system 47 and the beam collimator optical system 48, the beam collimator optical system 48 may be so disposed as to cause the beam having passed through the low-coherence optical system 90 to pass through the position P1 in FIG. 39.

<4> In Configuration Examples 1 and 2 of the beam shaping optical system, the laser beam having the oblong beam shape is converted into a laser beam having a substantially square beam shape, but not necessarily. In a case where the aspect ratio of the shape of the effective region of the MMD 50 is not one, the beam enlargement magnification may be so changed that the aspect ratio of the laser beam coincide with that of the effective region of the MMD 50.

<5> FIG. 39 shows an example of the "1:1" transfer. When the shaped beam differs in size from the effective region of the MMD 50, the magnification provided by each of the beam shaping optical system 47 and the beam collimator optical system 48 may be so changed that the entire elements of the MMD 50 are illuminated with the shaped beam.

10. Variation of Projection Optical System 10.1 Configuration

Figure 40:
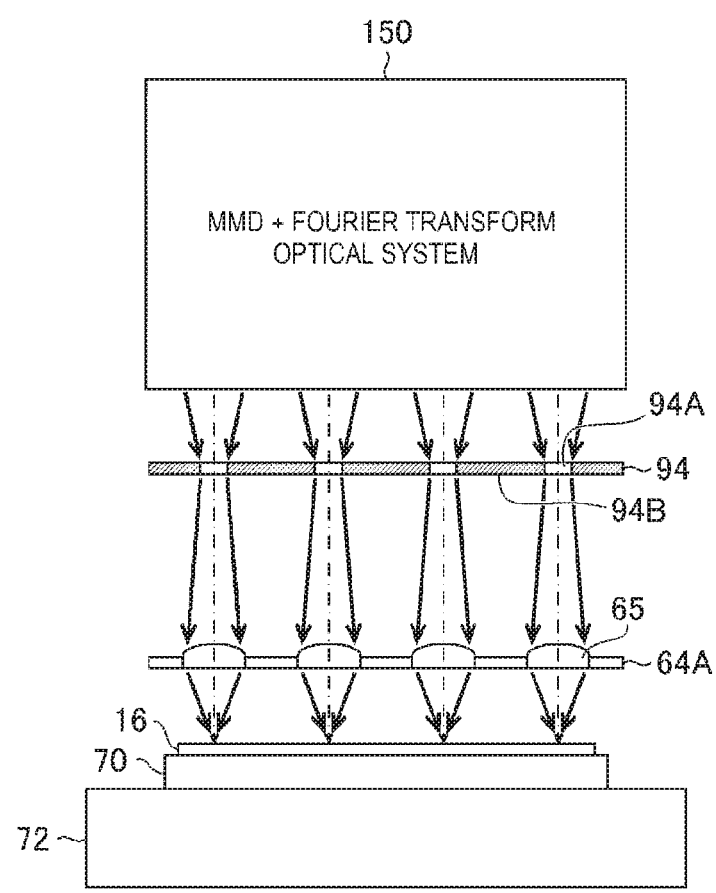
FIG. 40 shows an example of the configuration of a projection optical system.

FIG. 40 shows an example of the configuration of the projection optical system. FIG. 40 shows a case where a microlens array is employed as the projection optical system. To simplify the illustration in FIG. 40, the optical system including the MMD 50 and the Fourier transform optical system 61 is labeled with a reference character 150.

A mask 94 is so disposed that the pattern image plane formed by the MMD 50 coincides with the surface of the mask 94. The mask 94 includes a plurality of openings 94A, which form a transmissive region that transmits the laser flux, and a blocker 94B, which forms a non-transmissive region. The openings 94A are so formed in the mask 94 as to correspond to microlens 65 of the microlens array 64A in the one-to-one relationship. The openings 94A may each be a circular hole.

The microlens array 64A is so disposed that the openings of the mask 94 are reduced and focused on the surface of the processing receiving material 16. The magnification provided by the microlens array 64A ranges, for example, from ⅓ to 1/10 and is typically ⅕.

10.2 Operation

The laser processing control section 80 is configured to control the angle of the attitude of each of the mirrors of the MMD 50 in such a way that the MMD 50 and the Fourier transform optical system 61 irradiate each of the openings 94A of the mask 94 with a laser flux larger than the size of the openings 94A but close thereto.

The laser fluxes having passed through the openings 94A of the mask 94 are focused on the surface of the processing receiving material 16 by the microlens array 64A. That is, the microlens array 64A is configured to transfer reduced images of the openings 94A of the mask 94 onto the surface of the processing receiving material 16.

As a result, the processing receiving material 16 is irradiated with the pulsed laser fluxes 26 and processed in the pattern shape of the mask 94.

Figure 41:
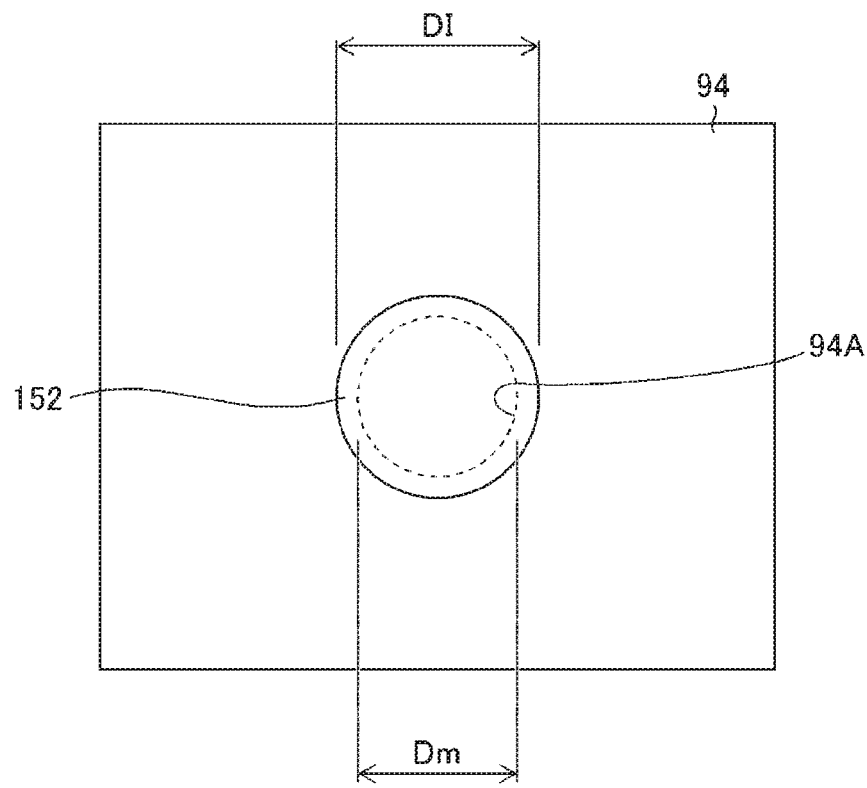
FIG. 41 shows an example of the relationship between an opening formed in a mask and a laser flux with which the mask is irradiated.

10.3 Relationship Between Shape of Openings of Mask and Beam Diameter at Focused Spots Formed by Fourier Transform Optical System 10.3.1 Case where Openings of Mask have Circular Shape FIG. 41 shows an example of the relationship between the openings 94A formed in the mask 94 and the laser flux with which the mask 94 is irradiated. FIG. 41 shows only one opening 94A. The mask 94 is illuminated with a laser beam 152 focused by the Fourier transform optical system 61, as shown in FIG. 41. The opening 94A formed in the mask 94 is so illuminated with the laser beam 152 focused by the Fourier transform optical system 61 that the laser beam 152 covers the entire opening 94A.

That is, a size of the laser beam 152 focused by the Fourier transform optical system 61 that is the size on the mask surface is slightly greater than the area of the opening 94A (area of transmissive region).

Consider the case where the opening 94A of the mask 94 has a circular shape, and let Dm be the diameter of the opening 94A and Dl be the diameter of the laser beam 152, and the ratio of Dm to Di preferably falls within, for example, the following range.

$$0.3 < Dm/DI < 0.99$$

DI: the diameter of the beam which is focused by the Fourier transform optical system 61 and with which the mask 94 is illuminated, and Dm: the diameter of the region which is formed in the mask 94 through which the laser flux passes.

The ratio more preferably satisfies the following expression:

$$0.8 \leq Dm/DI < 0.90$$

The laser beam 152 shown in FIG. 41 is an example of a "focused beam that forms a first image."

10.3.2 Case where Openings of Mask have Quadrangular Shape

FIG. 41 shows the case where a mask 94 having circular openings is used to bore circular holes in the processing receiving material 16, but not necessarily, and the openings of the mask 94 may have a quadrangular or any other polygonal shape. For example, the openings of the mask 94 may have a square shape. Square holes may be bored in the processing receiving material 16 or square portions of the processing receiving material 16 may be annealed by using the mask 94 having square openings.

Figure 42:
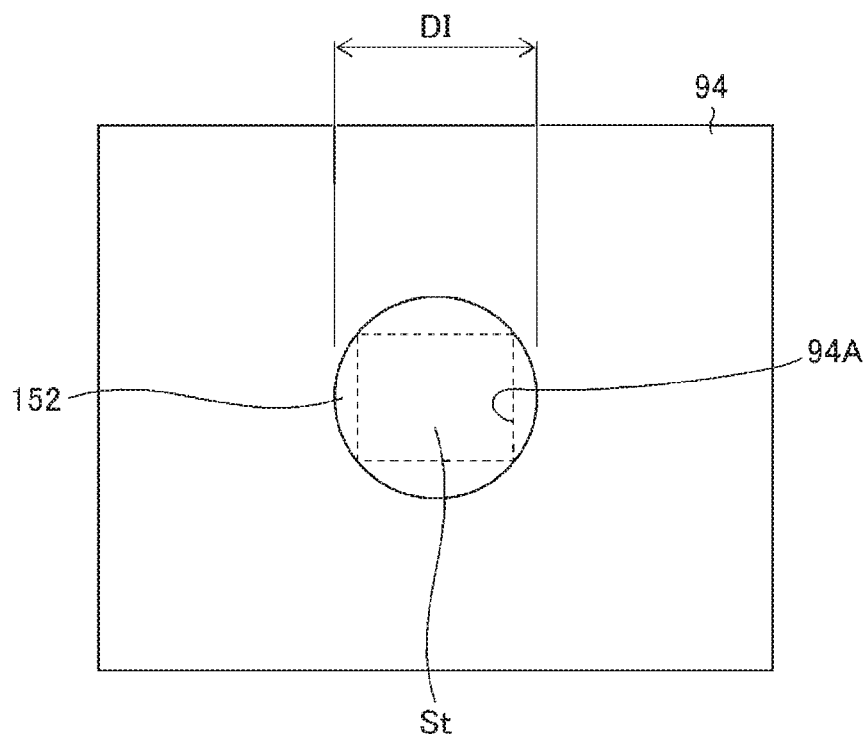
FIG. 42 shows an example of the relationship between a quadrangular opening formed in the mask and the laser flux with which the mask is irradiated.

FIG. 42 shows the case where the openings of the mask 94 have a quadrangular shape. In this case, let St be the area of each of the openings of the mask 94, and the ratio of St to the area of the beam preferably falls within the range expressed by the following expression:

$$0.49 \leq St/\{\pi \cdot (DI/2)^2\} \leq 0.63$$

St: the area of the opening of the mask.

10.3.3 Advantages Provided by Disposing Mask in Focal Plane of Fourier Transform Optical System When the mask 94 is disposed in the focal plane of the Fourier transform optical system 61, as described above, an image of the mask 94 is formed by the projection optical system 64, whereby the optical intensity distribution of the laser flux with which the processing receiving material 16 is irradiated has a shape close to a top-hat shape. The shape of a portion processed in the processing receiving material 16 in the depth direction is thus improved. That is, the portion tapered in the depth direction has a steep angle.

10.3.4 Other Forms

FIGS. 41 and 42 show the case where the transmissive regions of the mask 94 each have a circular shape and a quadrangular shape, respectively, but not necessarily, and the focused laser beam only needs to cover the entire transmissive region of the mask 94.

10.4 Effects and Advantages

The form described with reference to FIGS. 40 to 42 provides the following effects and advantages.

<1> Controlling the MMD 50 in accordance with the opening 94A, which are formed in the mask 94, allows the openings 94A of the mask 94 to be substantially uniformly illuminated with the laser flux, whereby the amount of loss of the laser flux at the mask 94 is suppressed.

<2> As a result, the laser flux use efficiency is improved as compared with a case where the entire mask 94 is illuminated in Koehler illumination.

<3> Since an image of the mask 94 is formed on the surface of the processing receiving material 16, the processed shape in the depth direction is improved as compared with maskless transfer. For example, in a boring process, the hole tapered in the depth direction has a steep angle.

<4> Since an image of the mask 94 is projected in reduction projection, small-shape processing can be achieved. For example, when the openings 94A of the mask 94 each have a diameter of 25 μm, and the projection magnification is ⅕, holes having a diameter of 5 μm can be processed.

<5> The fourth embodiment is effective in an application in which the processing receiving material 16 is processed at equal intervals. For example, the fourth embodiment is applicable to processing of a via hole in a printed board and partial annealing of amorphous silicon for thin-film transistor (TFT).

10.5 Example 6 of Other Forms

FIG. 40 shows an example of the form using the mask 94, but not necessarily, and the mask 94 may be omitted. That is, a configuration in which the mask 94 shown in FIG. 40 is omitted may be employed, and a pattern of an image formed by the MMD 50 and the Fourier transform optical system 61 may be formed on the surface of the processing receiving material 16 via the microlens array 64A without a mask. The form described above is applicable to a case where a pattern to be processed has a relatively large diameter and a case where the processed shape in the depth direction does not greatly matter. In the form described above, the light use efficiency is further improved because there is no light truncated by a mask.

Figure 43:
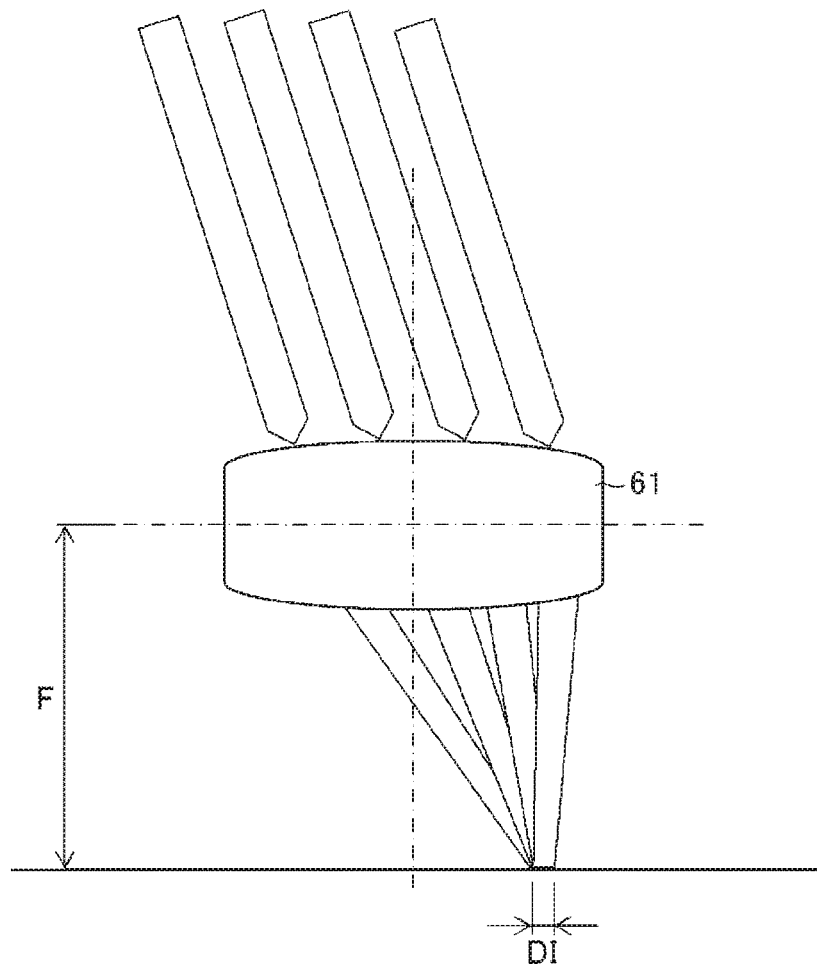
FIG. 43 diagrammatically shows an example in which the Fourier transform optical system focuses the laser fluxes reflected off the MMD.
Figure 44:
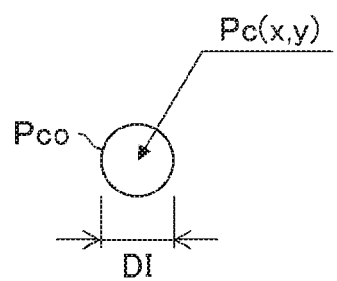
FIG. 44 is an enlarged view of a focused spot image in the focal plane of the Fourier transform optical system in the example shown in FIG. 43.

11. Case where Portions of Laser Beam are Superimposed on Each Other in Focal Plane of Fourier Transform Optical System FIG. 43 diagrammatically shows an example in which the Fourier transform optical system 61 focuses the laser fluxes reflected off the MMD 50. FIG. 44 is an enlarged view of a focused spot image in the focal plane of the Fourier transform optical system 61 in the example shown in FIG. 43.

When the Fourier transform optical system 61 focuses the laser flux reflected off one mirror of the MMD 50, the laser flux is focused into a spot having, for example, the diameter DI, as shown in FIGS. 43 and 44. In this case, reflecting a plurality of beams each having low coherency in the same direction off the MMD 50 allows the plurality of beams to be exactly superimposed at the same diameter DI on one another in a position Pc(x, y) into a single circular image Pco.

Figure 45:
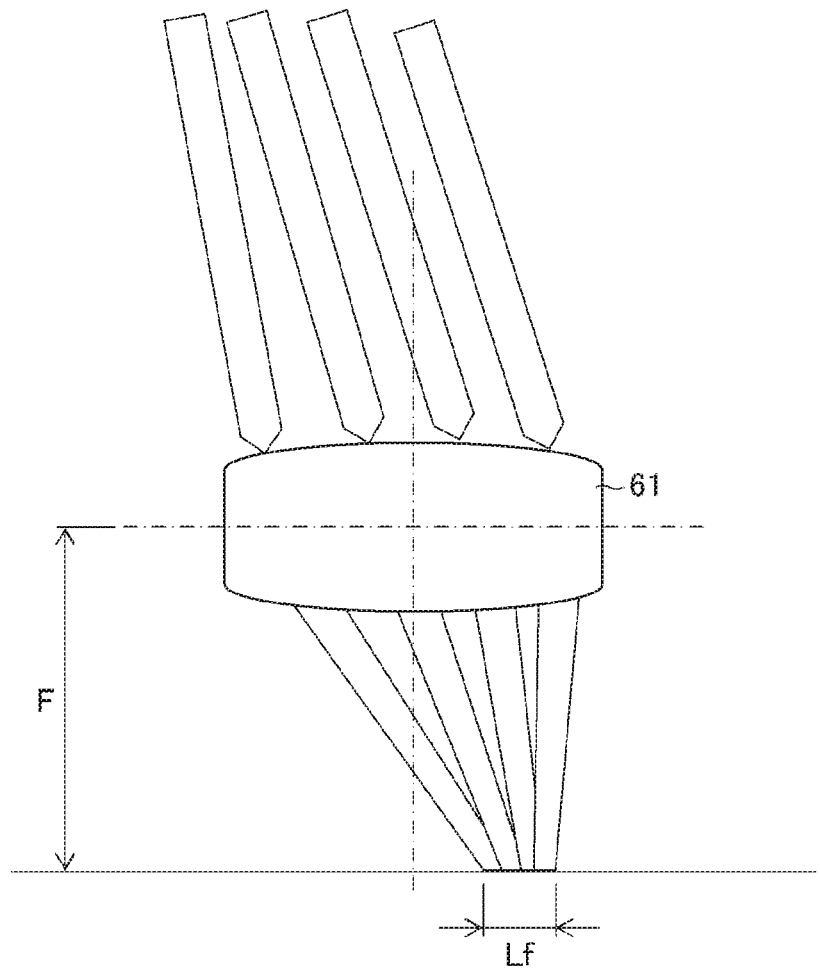
FIG. 45 diagrammatically shows another example in which the Fourier transform optical system focuses the laser fluxes reflected off the MMD.
Figure 46:
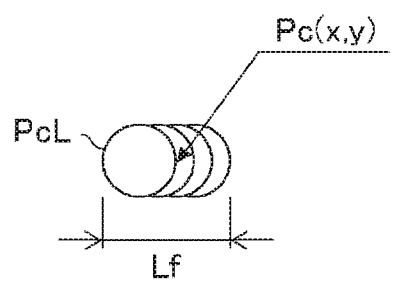
FIG. 46 is an enlarged view of an image of focused spots in the focal plane of the Fourier transform optical system in the example shown in FIG. 45.

FIG. 45 diagrammatically shows another example in which the Fourier transform optical system 61 focuses the laser fluxes reflected off the MMD 50. FIG. 46 is an enlarged view of an image of focused spots in the focal plane of the Fourier transform optical system 61 in the example shown in FIG. 45.

To focus a plurality of beams each having low coherency into images of focused spots having an overall length Lf, the beams are reflected off the MMD 50 in slightly different directions, as shown in FIGS. 45 and 46. The images of the focused spots having the same spot diameter DI can thus be slightly shifted from each other in the direction of the length Lf. As a result, a focused spot image PcL having the length Lf, which is formed of the plurality of partially superimposed beams, can be formed in the position Pc(x, y), as shown in FIG. 46.

The length Lf preferably falls within DI<Lf≤(DI/2)·Nc, where Nc represents the number of coherence cells.

In a case where the processed shape required at the processing point Pc(x, y) is greater than the diameter DI, as shown in FIGS. 45 and 46, the laser processing control section 80 may be configured to receive data on the size of the processing point and control the angle of the attitude of each of the mirrors of the MMD 50 in such a way that a target processed shape is achieved. For example, the laser processing control section 80 may be configured to receive data on the length Lf, calculate the direction in which the plurality of beams each having low coherency are reflected, and control the angle of the attitude of each of the mirrors of the MMD 50 in such a way that the reflection directions are achieved.

Figure 47:
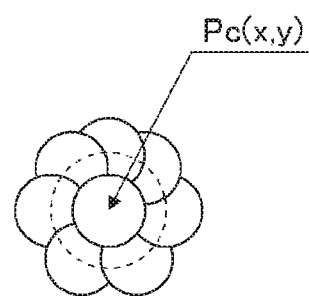
FIG. 47 is an enlarged view of a focused spot image in the focal plane of the Fourier transform optical system in a case where a plurality of beams each having low coherency are so focused along a circumference as to overlap with each other.

In the example shown in FIGS. 45 and 46, the case where the focused spot Pc(x, y) is focused in the form of the focused spot image PcL having the length Lf is presented by way of example, but not necessarily. For example, to set the diameter of the focused spot at a value greater than the diameter DI because the target processed shape is a substantially circular shape having a diameter greater than the diameter DI, the plurality of beams each having low coherency may be, for example, so focused along a circumference as to overlap with each other, as shown in FIG. 47.

12. Example of Preferable Range Number of Processing Points in Multi-Point Processing Let Mn be the number of mirrors of the MMD 50, and the range of the number Nc of processing points is preferably expressed as follows:

$$Mn/600 \leq Nc \leq Mn/8$$

For example, assuming that the present disclosure is applied to manufacture of a variety of electronic devices, the range of the number of processing points is preferably expressed as follows:

$$100 \leq Nc \leq 13000$$

13. Examples of Processing Using Laser Processing System

The laser processing system according to any of the embodiments described above is applicable, for example, to processing of parts of a variety of electronic devices described below.

(1) The laser processing system according to any of the embodiments described above is applicable to partial laser annealing that modifies an amorphous silicon film into a polysilicon film in the process of forming a TFT (thin-film transistor) used in a liquid crystal display.

(2) The laser processing system according to any of the embodiments described above is applicable to processing of via holes in an interposer disposed between a semiconductor and a printed board.

(3) The laser processing system according to any of the embodiments described above is applicable to processing of a glass substrate used in a mobile phone, a tablet terminal, and other apparatuses.

A method for processing a processing receiving material using the laser processing system according to any of the embodiments described above is applicable as a method for manufacturing an electronic device.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser radiation system comprising:
   a laser apparatus configured to output a first pulse laser flux;
   a first optical system configured to shape a beam cross-sectional shape of the first pulse laser flux to convert the first pulse laser flux into a second pulse laser flux and transfer the second pulse laser flux onto a transfer position;
   a multimirror device arranged at the transfer position of the first optical system and including a plurality of mirrors, configured to be capable of controlling an angle of an attitude of each of the plurality of mirrors, and configured to divide the second pulse laser flux into a plurality of pulse laser fluxes and reflect the plurality of pulse laser fluxes in a plurality of directions to produce the plurality of divided pulse laser fluxes;
   a Fourier transform optical system configured to focus the plurality of divided pulse laser fluxes; and
   a control section configured to control the angle of the attitude of each of the plurality of mirrors in such a way that the Fourier transform optical system superimposes the plurality of pulse laser fluxes, which are divided by the mirrors separate from each other by at least a spatial coherence length of the second pulse laser flux, on one another,
   wherein the control section is configured to
   set a plurality of coherence cells based on the spatial coherence length of the second pulse laser flux,
   segment an arrangement of the plurality of mirrors of the multimirror device into a plurality of mirror arrangement regions in correspondence with the coherence cells to specify the mirror arrangement regions including the plurality of mirrors for each of the coherence cells, and
   select one mirror from each of the plurality of coherence cells and control the angle of the attitude of each of the plurality of mirrors in such a way that the selected mirrors reflect the pulse laser fluxes in the same direction, and
   wherein the coherence cells are each a region larger than or equal to a quadrangle having a first side having a spatial coherence length in a first axial direction out of two axial directions perpendicular to each other and a second side having a spatial coherence length in a second axial direction out of the two axial directions.

2. The laser radiation system according to claim 1, wherein the laser apparatus is a discharge-excitation-type laser apparatus.

3. The laser radiation system according to claim 1, further comprising
   a beam characteristic measurer configured to measure beam characteristics of the second pulse laser flux,
   wherein the control section is configured to control the angle of the attitude of each of the plurality of mirrors based on a result of the measurement performed by the beam characteristic measurer.

4. The laser radiation system according to claim 3, wherein the beam characteristic measurer is a beam profiler configured to measure an optical intensity distribution of a beam cross section of the second pulse laser flux.

5. The laser radiation system according to claim 4, wherein the control section is configured to control the angle of the attitude of each of the plurality of mirrors based on an optical intensity in each position in the beam cross section measured by the beam profiler.

6. The laser radiation system according to claim 3,
wherein the beam characteristic measurer is a wavefront sensor configured to measure a traveling direction and an optical intensity of a pulse laser flux in each position in a beam cross section of the second pulse laser flux.

7. The laser radiation system according to claim 6,
wherein the control section is configured to control the angle of the attitude of each of the plurality of mirrors based on the traveling direction and the optical intensity of the pulse laser flux in each position in the beam cross section measured by the wavefront sensor.

8. The laser radiation system according to claim 1,
wherein the first optical system includes a beam shaping optical system.

9. The laser radiation system according to claim 1,
wherein the first optical system includes a beam collimator optical system.

10. The laser radiation system according to claim 1,
wherein the first optical system includes a low-coherence optical system.

11. The laser radiation system according to claim 10,
wherein the low-coherence optical system is an optical element configured to spatially produce an optical path difference greater than or equal to a temporal coherence length between pulse laser fluxes in different positions in a laser beam.

12. The laser radiation system according to claim 1,
wherein an angle at which the second pulse laser flux is incident on the multimirror device is so set that an optical path difference ΔLg of pulse laser fluxes into which the second pulse laser flux reflected off the multimirror device is divided is greater than or equal to a temporal coherence length ΔLt of the second pulse laser flux.

13. The laser radiation system according to claim 1,
further comprising a projection optical system configured to cause a first image formed in a focal position of the Fourier transform optical system to be formed as a second image on a surface of a processing receiving material.

14. The laser radiation system according to claim 13,
further comprising a mask in which an opening smaller than a focused beam that forms the first image is disposed in a position of the first image.

15. The laser radiation system according to claim 14,
wherein 0.3<Dm/Dl<0.99 is satisfied, where Dm represents a diameter of the opening provided in the mask, and Dl represents a diameter of the focused beam that forms the first image.

16. A method for manufacturing an electronic device, the method comprising:
producing a pulse laser flux by using a laser radiation system; and
processing a processing receiving material by irradiating the processing receiving material with the pulse laser flux produced by the laser radiation system,
the laser radiation system including
a laser apparatus configured to output a first pulse laser flux,
a first optical system configured to shape a beam cross-sectional shape of the first pulse laser flux to convert the first pulse laser flux into a second pulse laser flux and transfer the second pulse laser flux onto a transfer position,
a multimirror device arranged at the transfer position of the first optical system and including a plurality of mirrors, configured to be capable of controlling an angle of an attitude of each of the plurality of mirrors, and configured to divide the second pulse laser flux into a plurality of pulse laser fluxes and reflect the plurality of pulse laser fluxes in a plurality of directions to produce the plurality of divided pulse laser fluxes,
a Fourier transform optical system configured to focus the plurality of divided pulse laser fluxes, and
a control section configured to control the angle of the attitude of each of the plurality of mirrors in such a way that the Fourier transform optical system superimposes the plurality of pulse laser fluxes, which are divided by the mirrors separate from each other by at least a spatial coherence length of the second pulse laser flux, on one another,
wherein the control section is configured to
set a plurality of coherence cells based on the spatial coherence length of the second pulse laser flux,
segment an arrangement of the plurality of mirrors of the multimirror device into a plurality of mirror arrangement regions in correspondence with the coherence cells to specify the mirror arrangement regions including the plurality of mirrors for each of the coherence cells, and
select one mirror from each of the plurality of coherence cells and control the angle of the attitude of each of the plurality of mirrors in such a way that the selected mirrors reflect the pulse laser fluxes in the same direction, and
wherein the coherence cells are each a region larger than or equal to a quadrangle having a first side having a spatial coherence length in a first axial direction out of two axial directions perpendicular to each other and a second side having a spatial coherence length in a second axial direction out of the two axial directions.

17. A laser radiation system comprising:
a laser apparatus configured to output a first pulse laser flux;
a first optical system configured to shape a beam cross-sectional shape of the first pulse laser flux to convert the first pulse laser flux into a second pulse laser flux and transfer the second pulse laser flux onto a transfer position;
a multimirror device arranged at the transfer position of the first optical system and including a plurality of mirrors, configured to be capable of controlling an angle of an attitude of each of the plurality of mirrors, and configured to divide the second pulse laser flux into a plurality of pulse laser fluxes and reflect the plurality of pulse laser fluxes in a plurality of directions to produce the plurality of divided pulse laser fluxes;
a Fourier transform optical system configured to focus the plurality of divided pulse laser fluxes;
a wavefront sensor configured to measure a traveling direction and an optical intensity of a pulse laser flux in each position in a beam cross section of the second pulse laser flux; and
a control section configured to control the angle of the attitude of each of the plurality of mirrors based on the traveling direction and the optical intensity of the pulse laser flux in each position in the beam cross section measured by the wavefront sensor,
wherein the control section is configured to
set a plurality of coherence cells based on a spatial coherence length of the second pulse laser flux,
segment an arrangement of the plurality of mirrors of the multimirror device into a plurality of mirror arrangement regions in correspondence with the coherence cells to specify the mirror arrangement regions including the plurality of mirrors for each of the coherence cells, and select one mirror from each of the plurality of coherence cells and control the angle of the attitude of each of the plurality of mirrors in such a way that the selected mirrors reflect the pulse laser fluxes in the same direction, and wherein the coherence cells are each a region larger than or equal to a quadrangle having a first side having a spatial coherence length in a first axial direction out of two axial directions perpendicular to each other and a second side having a spatial coherence length in a second axial direction out of the two axial directions.

* * * * *